(12) United States Patent
Kim et al.

(10) Patent No.: US 12,274,160 B2
(45) Date of Patent: Apr. 8, 2025

(54) COMPOSITION FOR ORGANIC OPTOELECTRONIC DEVICE AND ORGANIC OPTOELECTRONIC DEVICE AND DISPLAY DEVICE

(71) Applicant: SAMSUNG SDI CO., LTD., Yongin-si (KR)

(72) Inventors: Jonghoon Kim, Suwon-si (KR); Youngmook Lim, Suwon-si (KR); Changwoo Kim, Suwon-si (KR); Hansol Seo, Suwon-si (KR); Hyung Sun Kim, Suwon-si (KR); Mijin Lee, Suwon-si (KR); Sung-Hyun Jung, Suwon-si (KR); Ho Kuk Jung, Suwon-si (KR); Youngkyoung Jo, Suwon-si (KR); Dalho Huh, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 923 days.

(21) Appl. No.: 17/336,558

(22) Filed: Jun. 2, 2021

(65) Prior Publication Data
US 2021/0376245 A1    Dec. 2, 2021

(30) Foreign Application Priority Data

Jun. 2, 2020 (KR) .................. 10-2020-0066669

(51) Int. Cl.
*H01L 51/00*     (2006.01)
*C07F 5/02*      (2006.01)
(Continued)

(52) U.S. Cl.
CPC ......... *H10K 85/622* (2023.02); *H10K 85/615* (2023.02); *H10K 85/626* (2023.02);
(Continued)

(58) Field of Classification Search
None
See application file for complete search history.

(56) References Cited

U.S. PATENT DOCUMENTS

| 5,061,569 A | 10/1991 | VanSlyke et al. |
| 2009/0309488 A1 | 12/2009 | Kato |

(Continued)

FOREIGN PATENT DOCUMENTS

| CN | 101511834 A | 8/2009 |
| CN | 102473859 A | 5/2012 |

(Continued)

OTHER PUBLICATIONS

U.S. Office action received in co-pending U.S. Appl. No. 17/015,314, dated Nov. 21, 2023.

(Continued)

*Primary Examiner* — Tae H Yoon
(74) *Attorney, Agent, or Firm* — Lee IP Law, P.C.

(57) ABSTRACT

A composition for an organic optoelectronic device, an organic optoelectronic device, and a display device, the composition including a first compound represented by Chemical Formula I, a second compound represented by Chemical Formula II, and a third compound represented by Chemical Formula III, (Continued)

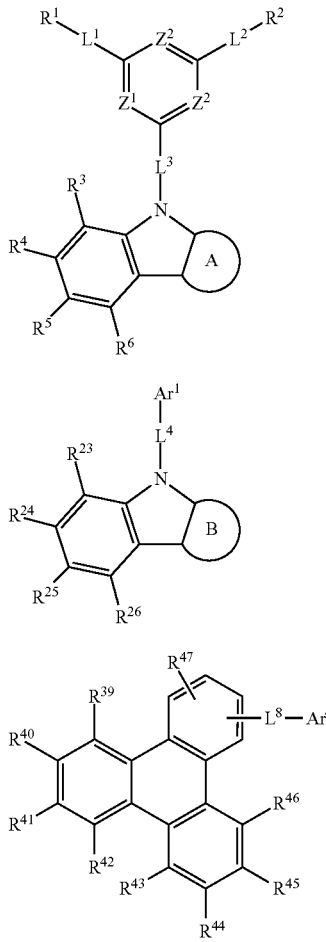

[Chemical Formula I]

[Chemical Formula II]

[Chemical Formula III]

18 Claims, 1 Drawing Sheet

(51) Int. Cl.
  *C09K 11/06* (2006.01)
  *H01L 51/50* (2006.01)
  *H01L 51/52* (2006.01)
  *H10K 85/60* (2023.01)
  *H10K 50/11* (2023.01)
  *H10K 101/10* (2023.01)

(52) U.S. Cl.
  CPC ......... *H10K 85/654* (2023.02); *H10K 85/657* (2023.02); *H10K 85/6572* (2023.02); *H10K 85/6574* (2023.02); *H10K 50/11* (2023.02); *H10K 2101/10* (2023.02)

(56) References Cited

U.S. PATENT DOCUMENTS

| | | |
|---|---|---|
| 2010/0187977 A1 | 7/2010 | Kai |
| 2011/0049481 A1 | 3/2011 | Xavier |
| 2012/0138915 A1 | 6/2012 | Nishimura et al. |
| 2014/0374711 A1 | 12/2014 | Cho |
| 2015/0115240 A1 | 4/2015 | Fukumatsu |
| 2015/0236262 A1 | 8/2015 | Cho |
| 2017/0054091 A1 | 2/2017 | Cho |
| 2017/0062718 A1 | 3/2017 | Numata |
| 2017/0346022 A1 | 11/2017 | Ma |
| 2018/0198081 A1 | 7/2018 | Zeng et al. |
| 2018/0240981 A1 | 8/2018 | Cho et al. |
| 2018/0337342 A1 | 11/2018 | Su et al. |
| 2019/0214573 A1 | 7/2019 | Ryu et al. |

FOREIGN PATENT DOCUMENTS

| | | |
|---|---|---|
| CN | 105679946 A | 6/2016 |
| CN | 107383106 A | 11/2017 |
| CN | 108948090 A | 12/2018 |
| CN | 109791981 A | 5/2019 |
| CN | 111584721 A | 8/2020 |
| JP | 1993-009471 A | 1/1993 |
| JP | 1995-126615 A | 5/1995 |
| JP | 1998-095972 A | 4/1998 |
| JP | 1998-095973 A | 4/1998 |
| JP | 4388590 B2 | 12/2009 |
| JP | 5124785 B2 | 1/2013 |
| JP | 5209701 B2 | 6/2013 |
| KR | 10-2012-0057611 A | 6/2012 |
| KR | 10-2014-0145888 A | 12/2014 |
| KR | 10-2015-0024735 A | 3/2015 |
| KR | 10-2015-0030511 A | 3/2015 |
| KR | 2015055725 A | 5/2015 |
| KR | 10-2016-0050614 A | 5/2016 |
| KR | 10-2016-0107406 A | 9/2016 |
| KR | 10-2017-0023270 A | 3/2017 |
| KR | 10-2017-0037277 A | 4/2017 |
| KR | 10-2017-0051762 A | 5/2017 |
| KR | 10-2017-0068927 A | 6/2017 |
| KR | 10-2017-0075877 A | 7/2017 |
| KR | 10-2017-0078976 A | 7/2017 |
| KR | 10-2017-0115642 A | 10/2017 |
| KR | 10-1818579 B1 | 1/2018 |
| KR | 10-2018-0051354 A | 6/2018 |
| KR | 10-2018-0127236 A | 11/2018 |
| KR | 10-1948709 B1 | 2/2019 |
| WO | WO 1995/009147 A1 | 4/1995 |
| WO | WO 2007/069569 A1 | 6/2007 |
| WO | WO 2008/056746 A1 | 5/2008 |
| WO | WO 2009/148015 A1 | 12/2009 |
| WO | WO 2009/148016 A1 | 12/2009 |
| WO | WO 2012/166101 A1 | 12/2012 |
| WO | WO 2013/088973 A1 | 6/2013 |
| WO | WO 2016/068458 A1 | 5/2016 |
| WO | WO 2018/180465 A1 | 10/2018 |
| WO | WO 2019/229001 A1 * | 12/2019 |

OTHER PUBLICATIONS

Chinese Office action dated Jun. 19, 2023.
U.S. Office action received in co pending U.S. Appl. No. 17/015,314 dated Jul. 10, 2023.
Third Party Submission received in co pending U.S. Appl. No. 17/015,314 dated Aug. 10, 2021.
Chinese Office action dated Jan. 9, 2023, in co pending U.S. Appl. No. 17/015,314.
Korean Office action dated Oct. 25, 2023.
Provisional double patenting rejection over claims of the above-identified application; USPTO Office action mailed Feb. 14, 2023, in U.S. Appl. No. 17/015,314.
Korean Notice of Allowance dated Feb. 6, 2024.
Chinese Office Action dated Feb. 20, 2024.
U.S. Office action received in Co pending related U.S. Appl. No. 17/015,314, mailed Apr. 30, 2024.
U.S. Office action received in co-pending related U.S. Appl. No. 17/015,314 dated Sep. 13, 2024.
U.S. Office action received in co-pending U.S. Appl. No. 17/340,412, dated Nov. 21, 2024.

* cited by examiner

COMPOSITION FOR ORGANIC OPTOELECTRONIC DEVICE AND ORGANIC OPTOELECTRONIC DEVICE AND DISPLAY DEVICE

CROSS-REFERENCE TO RELATED APPLICATION

Korean Patent Application No. 10-2020-0066669, filed on Jun. 2, 2020, in the Korean Intellectual Property Office, and entitled: "Composition for Organic Optoelectronic Device and Organic Optoelectronic Device and Display Device," is incorporated by reference herein in its entirety.

BACKGROUND

1. Field

Embodiments relate to a composition for an organic optoelectronic device, an organic optoelectronic device, and a display device.

2. Description of the Related Art

An organic optoelectronic device (e.g., organic optoelectronic diode) is a device capable of converting electrical energy and optical energy to each other.

Organic optoelectronic devices may be divided into two types according to a principle of operation. One is a photoelectric device that generates electrical energy by separating excitons formed by light energy into electrons and holes, and transferring the electrons and holes to different electrodes, respectively and another is light emitting device that generates light energy from electrical energy by supplying voltage or current to the electrodes.

Examples of the organic optoelectronic device may include an organic photoelectric device, an organic light emitting diode, an organic solar cell, and an organic photoconductor drum.

SUMMARY

The embodiments may be realized by providing a composition for an organic optoelectronic device, the composition including a first compound; a second compound; and a third compound, wherein the first compound is represented by Chemical Formula I, the second compound is represented by Chemical Formula II, and the third compound is represented by Chemical Formula III:

[Chemical Formula I]

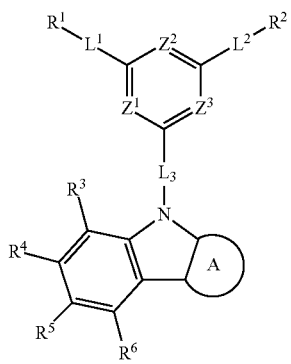

wherein, in Chemical Formula I, $Z^1$ to $Z^3$ is N or $C$-$L^a$-$R^a$, at least two of $Z^1$ to $Z^3$ being N, $L^a$ and $L^1$ to $L^3$ are each independently a single bond, a substituted or unsubstituted C6 to C20 arylene group, a substituted or unsubstituted C2 to C20 heterocyclic group, or a combination thereof, $R^1$ and $R^2$ are each independently a substituted or unsubstituted C6 to C30 aryl group, a substituted or unsubstituted C2 to C30 heterocyclic group, or a combination thereof, $R^a$ and $R^3$ to $R^6$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and A is a group represented by one of Substituent A-1 to Substituent A-7:

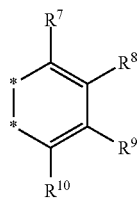

[Substituent A-1]

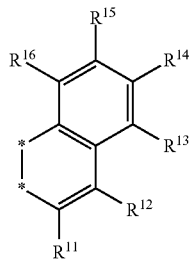

[Substituent A-2]

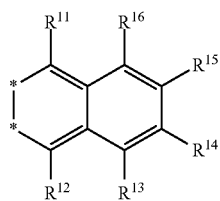

[Substituent A-3]

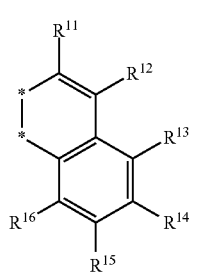

[Substituent A-4]

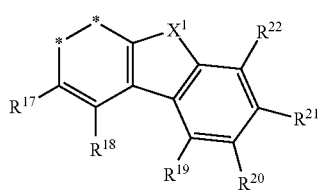

[Substituent A-5]

[Substituent A-6]

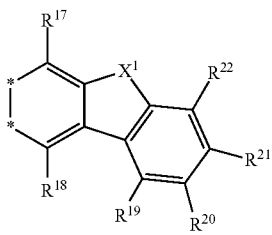

[Substituent A-7]

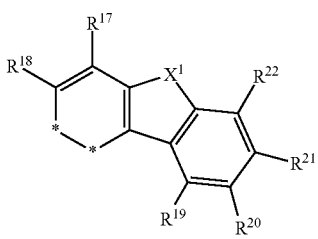

wherein, in Substituent A-1 to Substituent A-7, $X^1$ is O, S, or $NR^b$, $R^b$ and $R^7$ to $R^{22}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and * is a linking carbon;

[Chemical Formula II]

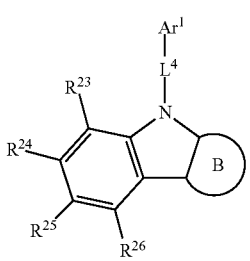

wherein, in Chemical Formula II, $L^4$ is a single bond, a substituted or unsubstituted C6 to C20 arylene group, a substituted or unsubstituted C2 to C20 heterocyclic group, or a combination thereof, $Ar^1$ is a substituted or unsubstituted C6 to C30 aryl group, a substituted or unsubstituted dibenzofuranyl group, a substituted or unsubstituted dibenzothiophenyl group, or a combination thereof, $R^{23}$ to $R^{26}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and B is a group represented by one of Substituent B-1 to Substituent B-4:

[Substituent B-1]

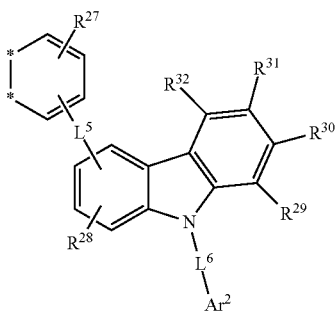

[Substituent B-2]

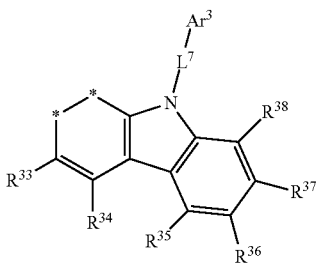

[Substituent B-3]

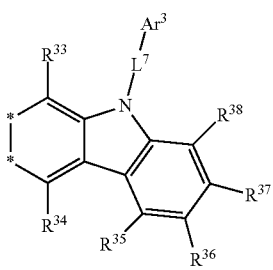

[Substituent B-4]

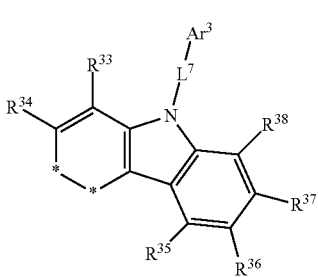

wherein, in Substituent B-1 to Substituent B-4, $L^5$ to $L^7$ are each independently a single bond, a substituted or unsubstituted C6 to C20 arylene group, a substituted or unsubstituted C2 to C20 heterocyclic group, or a combination thereof, $Ar^2$ and $Ar^3$ are each independently a substituted or unsubstituted C6 to C30 aryl group, a substituted or unsubstituted dibenzofuranyl group, a substituted or unsubstituted dibenzothiophenyl group, or a combination thereof, $R^{27}$ to $R^{38}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and * is a linking carbon;

[Chemical Formula III]

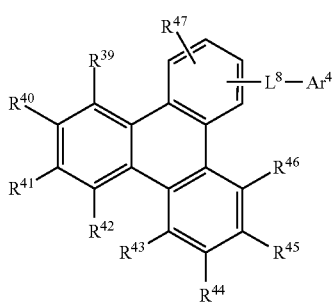

wherein, in Chemical Formula III, $R^{39}$ to $R^{47}$ are each independently hydrogen, deuterium, a substituted or unsubstituted C1 to C30 alkyl group, or a substituted or unsubstituted C6 to C30 aryl group, $L^8$ is a substituted or unsubstituted C6 to C20 arylene group, and $Ar^4$ is a substituted or unsubstituted C10 to C20 fused aryl group.

The embodiments may be realized by providing an organic optoelectronic device including an anode and a cathode facing each other, at least one organic layer between the anode and the cathode, wherein the at least one organic layer includes the composition for an organic optoelectronic device according to an embodiment.

The embodiments may be realized by providing a display device including the organic optoelectronic device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
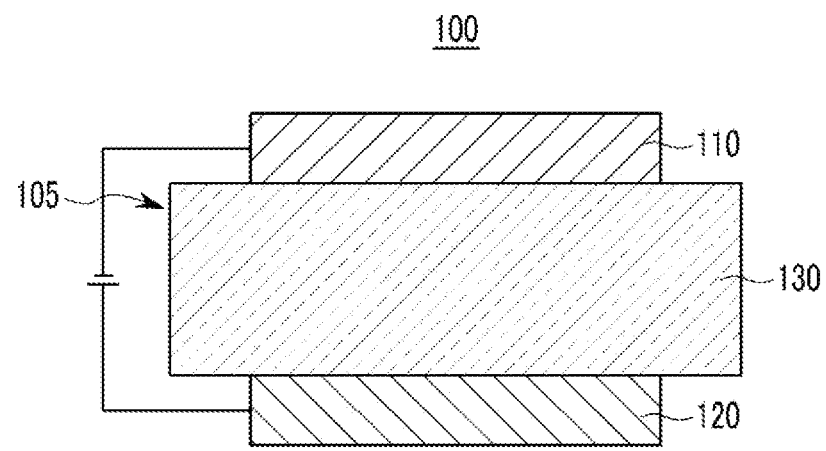
FIGS. 1 and 2 are cross-sectional views of an organic light emitting diode according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

In one example of the present disclosure, the "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof. As used herein, the term "or" is not an exclusive term, e.g., "A or B" would include A, B, or A and B.

In specific example of the present disclosure, the "substituted" refers to replacement of at least one hydrogen of a substituent or a compound by deuterium, a cyano group, a C1 to C30 alkyl group, a C1 to C10 alkylsilyl group, a C6 to C30 arylamine group, a C6 to C30 arylsilyl group, a C3 to C30 cycloalkyl group, a C3 to C30 heterocycloalkyl group, a C6 to C30 aryl group, or a C2 to C30 heteroaryl group. In specific example of the present disclosure, the "substituted" refers to replacement of at least one hydrogen of a substituent or a compound by deuterium, a cyano group, a C1 to C20 alkyl group, a C6 to C30 arylamine group, a C6 to C30 aryl group, or a C2 to C30 heteroaryl group. In specific example of the present disclosure, the "substituted" refers to replacement of at least one hydrogen of a substituent or a compound by deuterium, a cyano group, a C1 to C5 alkyl group, a C6 to C20 arylamine group, a C6 to C18 aryl group, a dibenzofuranyl group, a dibenzothiophenyl group, a carbazolyl group, or a pyridinyl group. In specific example of the present disclosure, the "substituted" refers to replacement of at least one hydrogen of a substituent or a compound by deuterium, a cyano group, a methyl group, an ethyl group, a propyl group, a butyl group, a C6 to C20 arylamine group, a phenyl group, a biphenyl group, terphenyl group, a naphthyl group, a triphenyl group, a fluorenyl group, a dibenzofuranyl group, a dibenzothiophenyl group, a carbazolyl group, or a pyridinyl group.

As used herein, when a definition is not otherwise provided, "hetero" refers to one including one to three heteroatoms selected from N, O, S, P, and Si, and remaining carbons in one functional group.

As used herein, "an aryl group" refers to a group including at least one hydrocarbon aromatic moiety, and all elements of the hydrocarbon aromatic moiety have p-orbitals which form conjugation, for example a phenyl group, a naphthyl group, and the like, two or more hydrocarbon aromatic moieties may be linked by a sigma bond and may be, for example a biphenyl group, a terphenyl group, a quarterphenyl group, and the like, and two or more hydrocarbon aromatic moieties are fused directly or indirectly to provide a non-aromatic fused ring, for example a fluorenyl group.

The aryl group may include a monocyclic, polycyclic, or fused ring polycyclic (i.e., rings sharing adjacent pairs of carbon atoms) functional group.

As used herein, "a heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "a heteroaryl group" may refer to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, or a combination thereof.

More specifically, the substituted or unsubstituted C2 to C30 heterocyclic group may be a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiophenyl group, or a combination thereof.

In the present specification, hole characteristics refer to an ability to donate an electron to form a hole when an electric field is applied and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to a lowest unoccupied molecular orbital (LUMO) level.

Hereinafter, a composition for an organic optoelectronic device according to an embodiment is described.

A composition for an organic optoelectronic device according to an embodiment may include a mixture of three types of compounds. In an implementation, the composition may include, e.g., a first compound having electron characteristics, a second compound having hole characteristics, and a third compound having buffer characteristics.

The third compound may be a compound having a wide HOMO-LUMO band gap including both the HOMO-LUMO band gaps of the first compound and the second compound and may have a hole mobility that is lower than that of the second compound having the hole characteristics, thereby slowing hole injection characteristics, and reducing hole traps to decrease a driving voltage and to increase the efficiency.

In an implementation, as the light emitting layer region may be relatively moved toward the hole transport auxiliary layer while having an electron mobility lower than the electron mobility of the first compound, exciton quenching at the interface toward the electron transport auxiliary layer and degradation caused by the same may be reduced, thereby increasing the life-span.

The first compound having electron characteristics may include a structure in which a nitrogen-containing hexagonal ring is substituted with a carbazole or a carbazole derivative. In an implementation, the first compound may be represented by Chemical Formula I.

[Chemical Formula I]

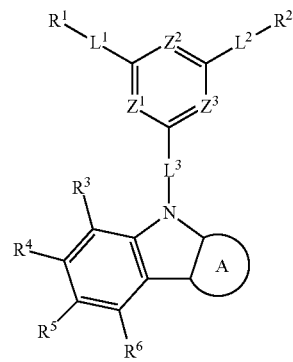

In Chemical Formula I, $Z^1$ to $Z^3$ may each independently be, e.g., N or C-$L^a$-$R^a$. In an implementation, at least two of $Z^1$ to $Z^3$ are N.

$L^a$ and $L^1$ to $L^3$ may each independently be or include, e.g., a single bond, a substituted or unsubstituted C6 to C20 arylene group, a substituted or unsubstituted C2 to C20 heterocyclic group, or a combination thereof.

$R^1$ and $R^2$ may each independently be or include, e.g., a substituted or unsubstituted C6 to C30 aryl group, a substituted or unsubstituted C2 to C30 heterocyclic group, or a combination thereof.

$R^a$ and $R^3$ to $R^6$ may each independently be or include, e.g., hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof.

Ring A may be a group represented by one of Substituent A-1 to Substituent A-7.

[Substituent A-1]

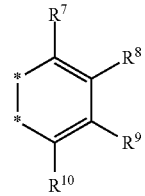

-continued

[Substituent A-2]
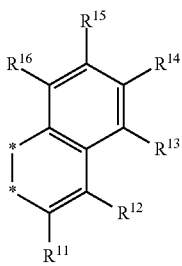

[Substituent A-3]
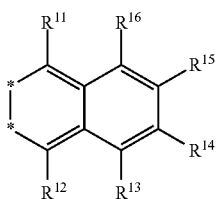

[Substituent A-4]
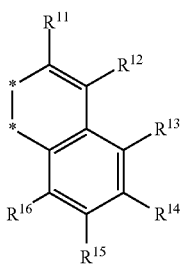

[Substituent A-5]
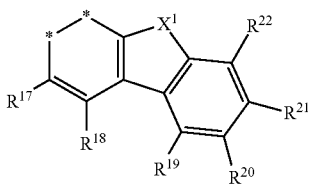

[Substituent A-6]
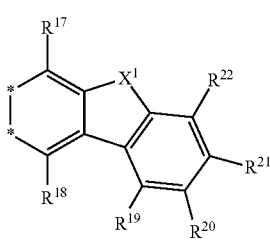

[Substituent A-7]
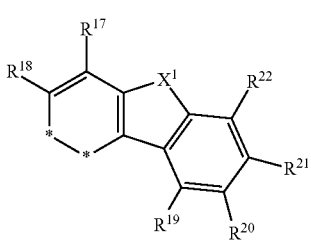

In Substituent A-1 to Substituent A-7, $X^1$ may be, e.g., O, S, or $NR^b$.

$R^b$ and $R^7$ to $R^{22}$ may each independently be or include, e.g., hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof.

Each * is a linking carbon. As used herein, the linking carbons are carbons of ring A that are shared with the N-containing ring of Chemical Formula I, e.g., shared carbons at which fused rings are linked.

In an implementation, $Z^1$ to $Z^3$ in Chemical Formula I may each independently be N or CH, and at least two of $Z^1$ to $Z^3$ may be N.

In an implementation, $Z^1$ to $Z^3$ may each N.

In an implementation, $Z^1$ and $Z^3$ may be N, and $Z^2$ may be CH.

$L^1$ to $L^3$ of Chemical Formula I may each independently be, e.g., a single bond, a substituted or unsubstituted phenylene group, a substituted or unsubstituted biphenylene group, a substituted or unsubstituted naphthylene group, a substituted or unsubstituted carbazolylene group, a substituted or unsubstituted dibenzofuranylene group, a substituted or unsubstituted dibenzothiophenylene group, or a substituted or unsubstituted pyridinylene group.

In an implementation, when $L^1$ to $L^3$ are substituted, the substituent may be a phenyl group or a carbazolyl group.

$R^1$ and $R^2$ of Chemical Formula I may each independently be, e.g., a substituted or unsubstituted phenyl group, a substituted or unsubstituted biphenyl group, a substituted or unsubstituted terphenyl group, a substituted or unsubstituted naphthyl group, a substituted or unsubstituted fluorenyl group, a substituted or unsubstituted carbazolyl group, a substituted or unsubstituted dibenzofuranyl group, or a substituted or unsubstituted dibenzothiophenyl group.

In an implementation, $L^1$ to $L^3$ in Chemical Formula I may each independently be, e.g., a single bond, an unsubstituted m-phenylene group, a m-phenylene group substituted with a phenyl group or a carbazolyl group, an unsubstituted p-phenylene group, a p-phenylene group substituted with a phenyl group or a carbazolyl group, an unsubstituted biphenylene group, or a biphenylene group substituted with a phenyl group or a carbazolyl group.

In an implementation, $R^1$ and $R^2$ in Chemical Formula I may each independently be, e.g., a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group.

Chemical Formula I may be represented by one of Chemical Formula I-A to Chemical Formula I-J, e.g., depending on the specific structures of carbazole and carbazole derivatives.

[Chemical Formula I-A]
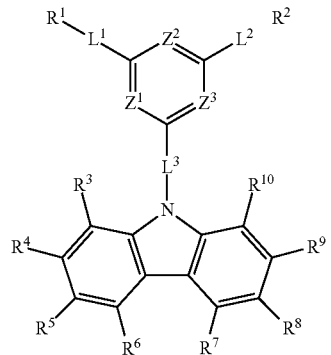

[Chemical Formula I-B]
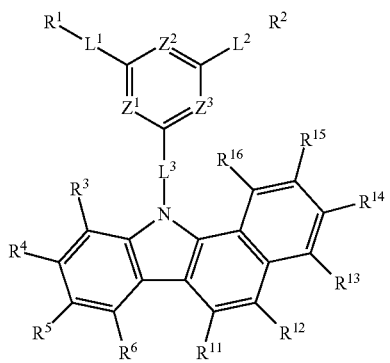
[Chemical Formula I-C]
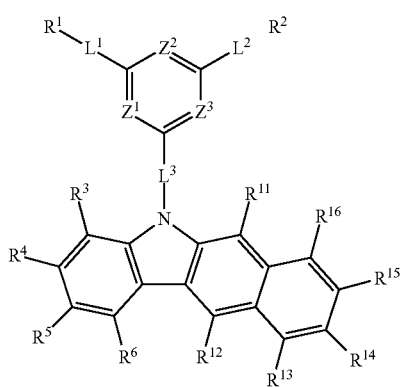
[Chemical Formula I-D]
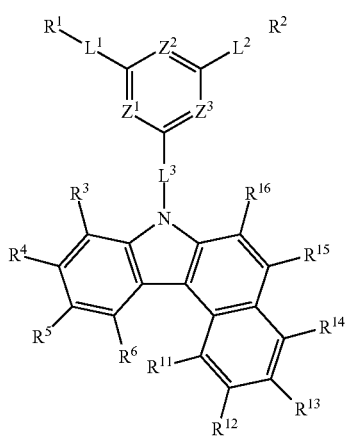
[Chemical Formula I-E]
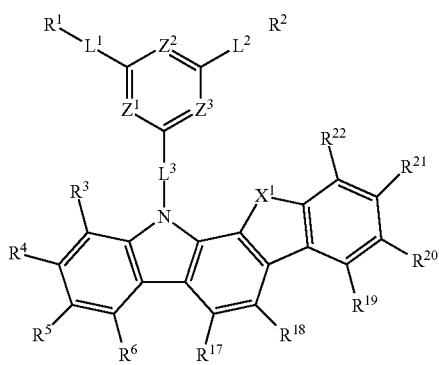
[Chemical Formula I-F]
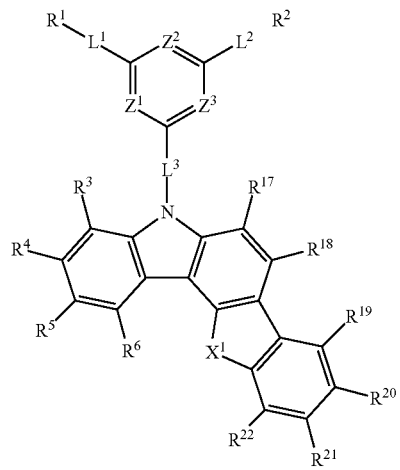
[Chemical Formula I-G]
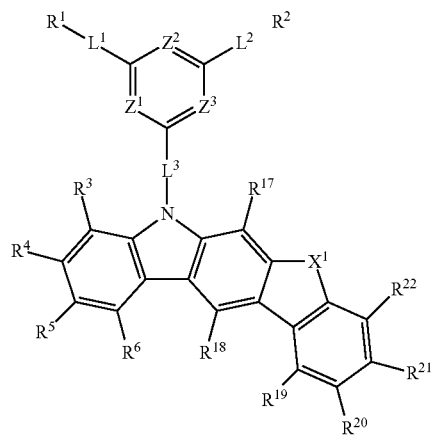
[Chemical Formula I-H]
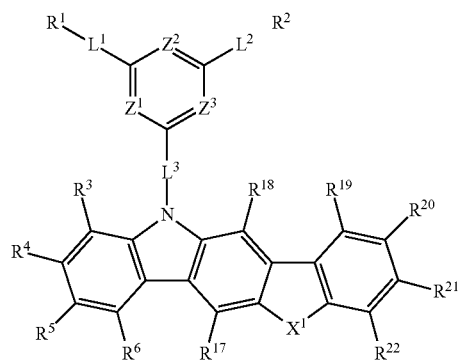

[Chemical Formula I-I]

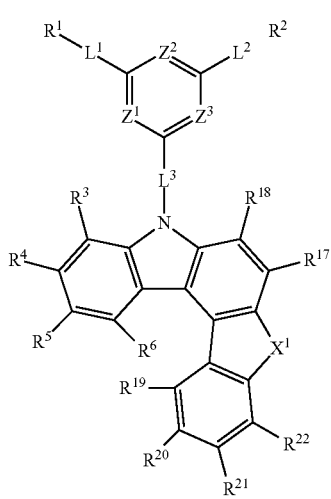

[Chemical Formula I-H]

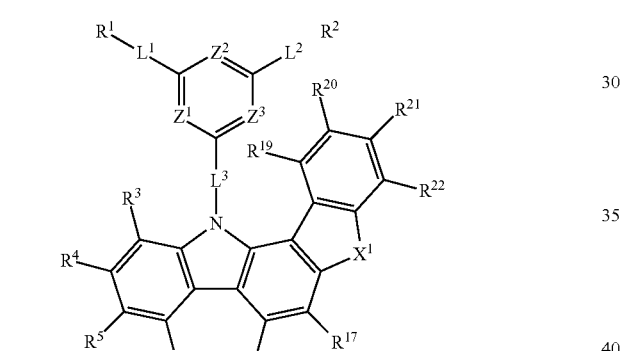

In Chemical Formulae I-A to I-J, $Z^1$ to $Z^3$, $L^1$ to $L^3$, $R^1$ to $R^{22}$, and $X^1$ may be defined the same as those described above.

In an implementation, the first compound may be represented by Chemical Formula I-A, Chemical Formula I-D, Chemical Formula I-E, Chemical Formula I-F, Chemical Formula I-G, Chemical Formula I-H, Chemical Formula I-I, or Chemical Formula I-J.

In an implementation, $R^3$ to $R^{10}$ in Chemical Formula I-A may each independently be, e.g., hydrogen, a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group.

In an implementation, Chemical Formula I-A may be represented by one of Chemical Formula I-A-1 to Chemical Formula I-A-7.

[Chemical Formula I-A-1]

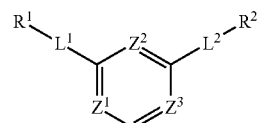

[Chemical Formula I-A-2]

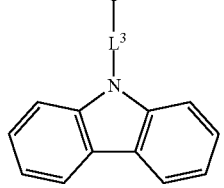

[Chemical Formula I-A-3]

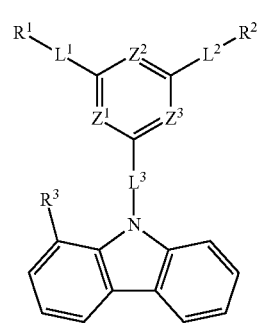

[Chemical Formula I-A-4]

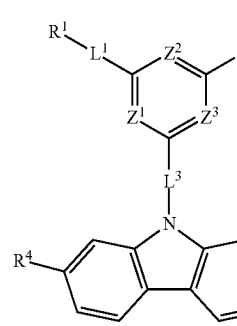

[Chemical Formula I-A-5]

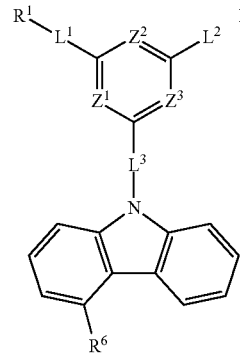

[Chemical Formula I-A-6]

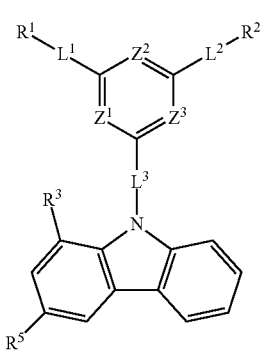

[Chemical Formula I-D-1]

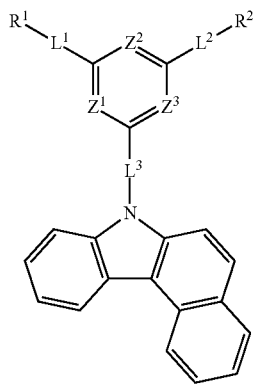

In Chemical Formula I-D-1, $Z^1$ to $Z^3$, $R^1$, $R^2$, and $L^1$ to $L^3$ may be defined the same as those described above.

In an implementation, $R^3$ to $R^6$ and $R^{17}$ to $R^{22}$ of Chemical Formula I-E to Chemical Formula I-J may each independently be, e.g., hydrogen, a substituted or unsubstituted phenyl group, or a substituted or unsubstituted biphenyl group.

In an implementation, the first compound may be represented by one of Chemical Formula I-E to Chemical Formula I-J, and may be, e.g., represented by one of Chemical Formula I-E-1 to Chemical Formula I-E-4, Chemical Formula I-F-1, Chemical Formula I-G-1, Chemical Formula I-G-2, Chemical Formula I-H-1, Chemical Formula I-I-1, and Chemical Formula I-J-1.

[Chemical Formula I-A-7]

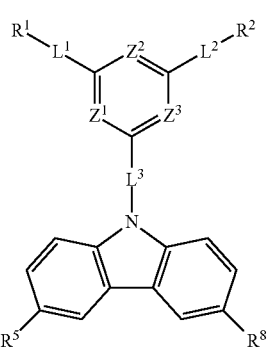

[Chemical Formula I-E-1]

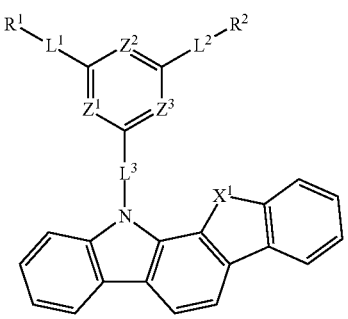

In Chemical Formula I-A-1 to Chemical Formula I-A-7, $Z^1$ to $Z^3$, $L^1$ to $L^3$, $R^1$, and $R^2$ may be defined the same as those described above.

$R^3$ to $R^5$ and $R^8$ may each independently be, e.g., a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group.

In an implementation, $R^3$ to $R^5$ and $R^8$ in Chemical Formula I-A-2 to Chemical Formula I-A-7 may each be, e.g., an unsubstituted phenyl group.

In an implementation, $R^3$ to $R^6$ and $R^{11}$ to $R^{16}$ in Chemical Formula I-B to Chemical Formula I-D may each independently be, e.g., hydrogen, a substituted or unsubstituted phenyl group, or a substituted or unsubstituted biphenyl group.

In an implementation, the first compound may be represented by Chemical Formula I-D, and may be, e.g., represented by Formula I-D-1.

[Chemical Formula I-E-2]

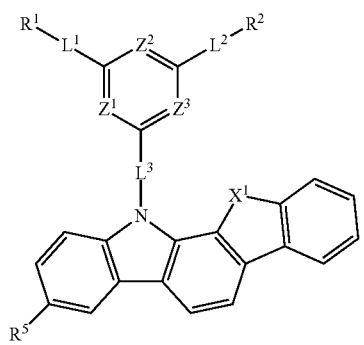

-continued
[Chemical Formula I-E-3]
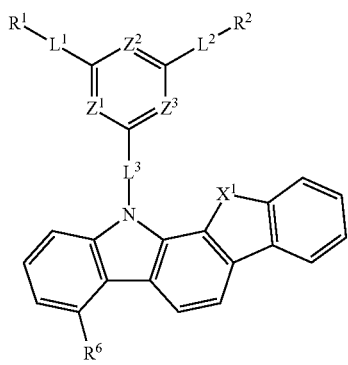
[Chemical Formula I-E-4]
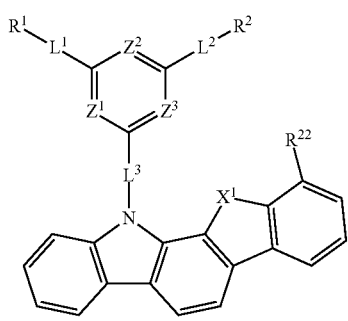
[Chemical Formula I-F-1]
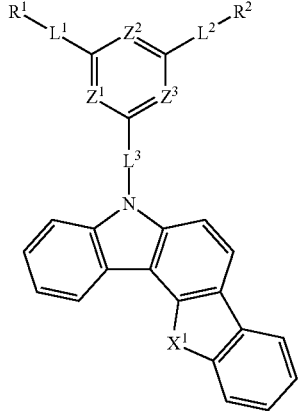
[Chemical Formula I-G-1]
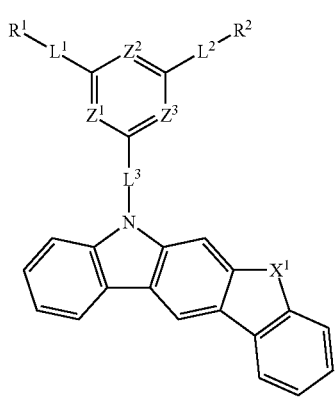
[Chemical Formula I-G-2]
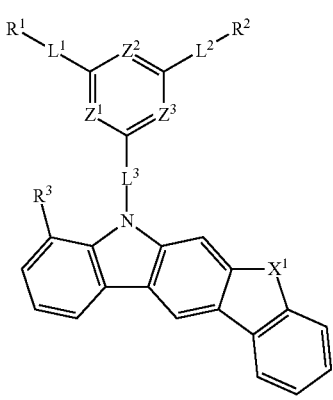
[Chemical Formula I-H-1]
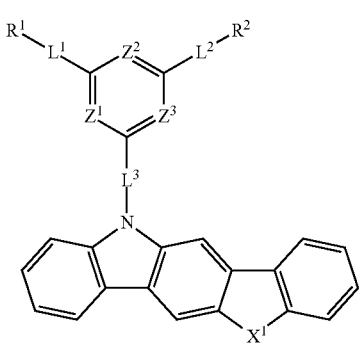
[Chemical Formula I-I-1]
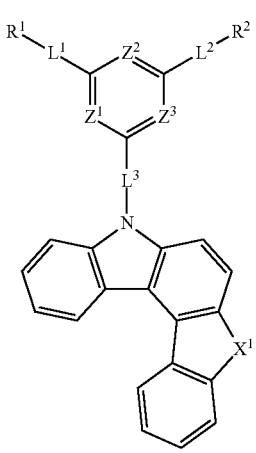
[Chemical Formula I-J-1]
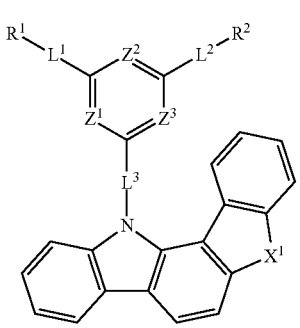
In Chemical Formula I-E-1 to Chemical Formula I-E-4, Chemical Formula I-F-1, Chemical Formula I-G-1, Chemical Formula I-G-2, Chemical Formula I-H-1, Chemi- Formula I-I-1, and Chemical Formula I-J-1, $X^1$, $Z^1$ to $Z^3$, $R^1$, $R^2$, and $L^1$ to $L^3$ may be defined the same as those described above, In an implementation, $R^3$, $R^5$, $R^6$, and $R^{22}$ in Chemical Formula I-E-2, Chemical Formula I-E-3, Chemical Formula I-E-4, and Chemical Formula I-G-2 may each be, e.g., an unsubstituted phenyl group.

In an implementation, the first compound may be represented by Chemical Formula I-A-1, Chemical Formula I-A-4, or Chemical Formula I-E-1.

In an implementation, in Chemical Formula I-A-1 and Chemical Formula I-A-4, $Z^1$ to $Z^3$ may each be N, $L^1$ to $L^3$ may each independently be, e.g., a single bond or a substituted or unsubstituted phenylene group, $R^1$ and $R^2$ may each independently be, e.g., a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group, and $R^5$ may be, e.g., a substituted or unsubstituted phenyl group.

In Chemical Formula I-E-1, $Z^1$ to $Z^3$ may each be N, $X^1$ may be, e.g., $NR^b$ or O, in which $R^b$ may be, e.g., a substituted or unsubstituted phenyl group, a substituted or unsubstituted biphenyl group, or a substituted or unsubstituted terphenyl group, $L^1$ to $L^3$ may each independently be, e.g., a single bond or a substituted or unsubstituted phenylene group, and $R^1$ and $R^2$ may each independently be, e.g., a substituted or unsubstituted phenyl group or a substituted or unsubstituted biphenyl group.

In an implementation, the first compound may be, e.g., a compound of Group 1.

[Group 1]

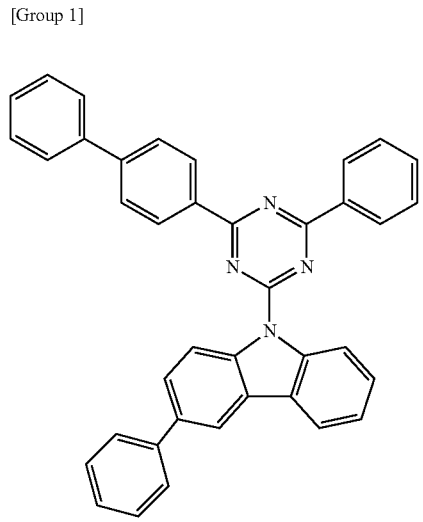

[1-1]

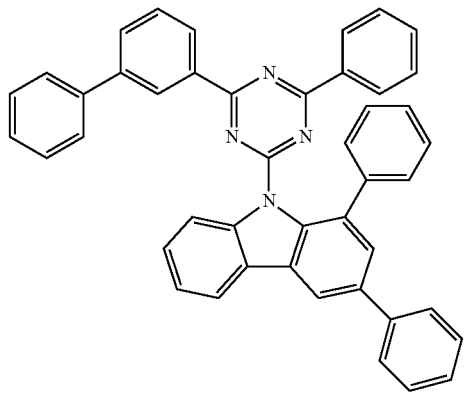

[1-2]

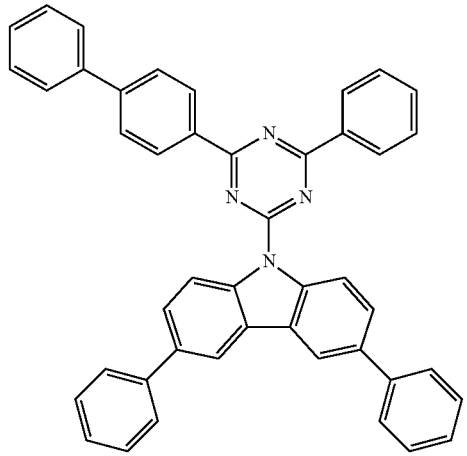

[1-3]

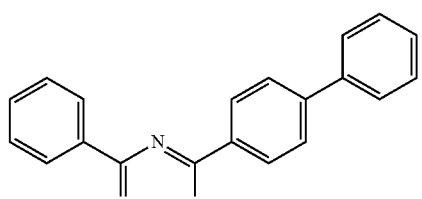

[1-4]

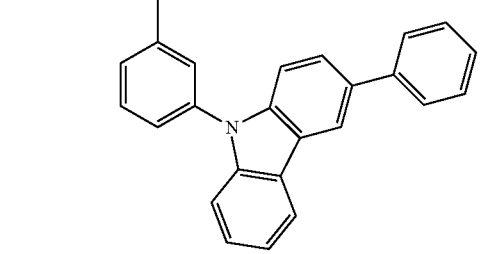

[1-5]
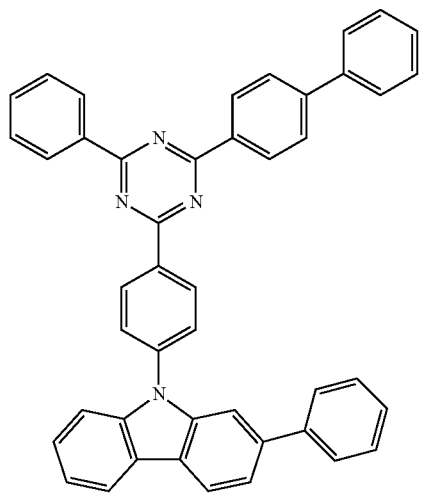
[1-6]
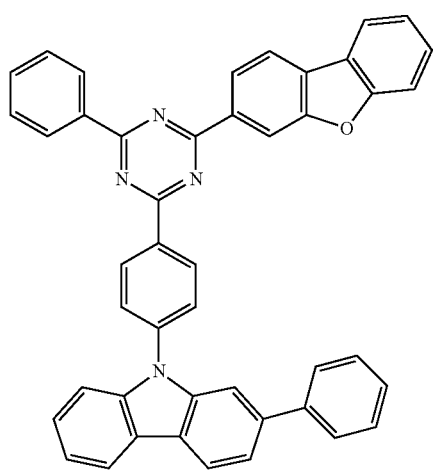
[1-7]
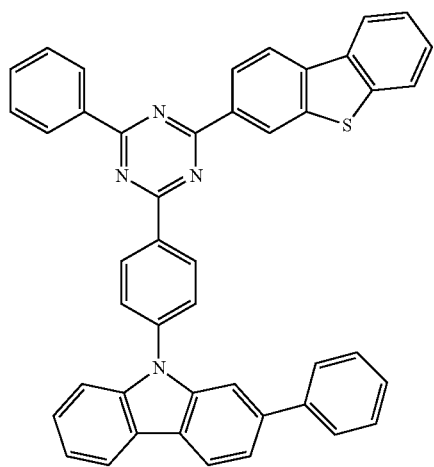
[1-8]
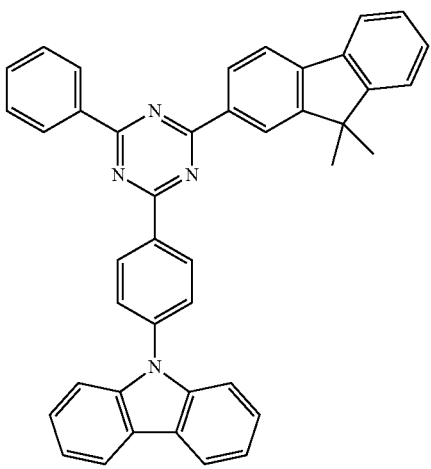
[1-9]
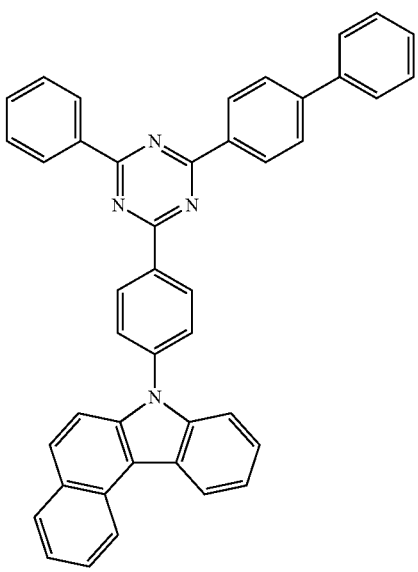
[1-10]
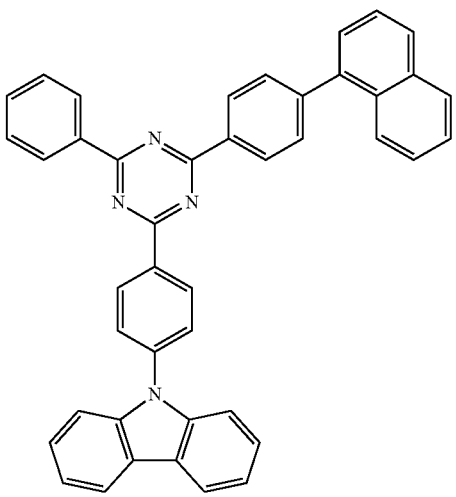

[1-11]
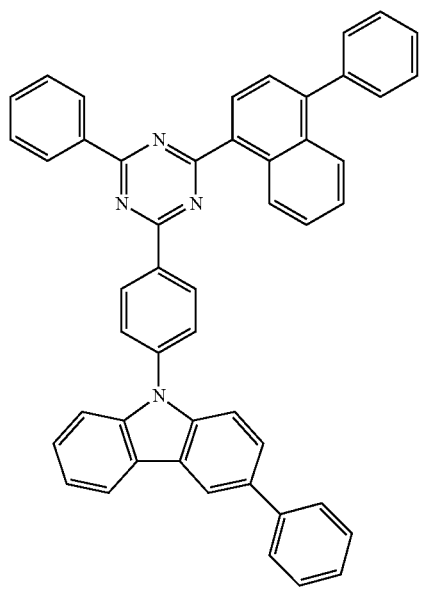
[1-12]
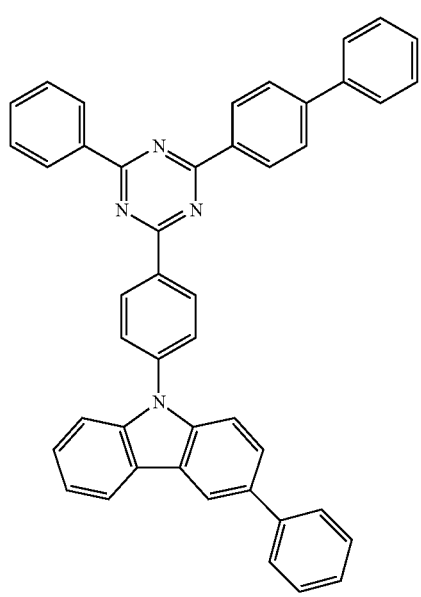
[1-13]
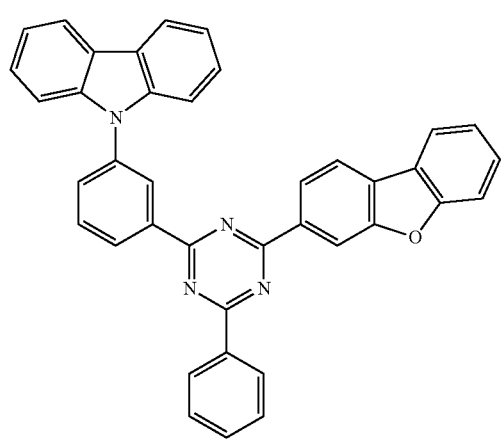
[1-14]
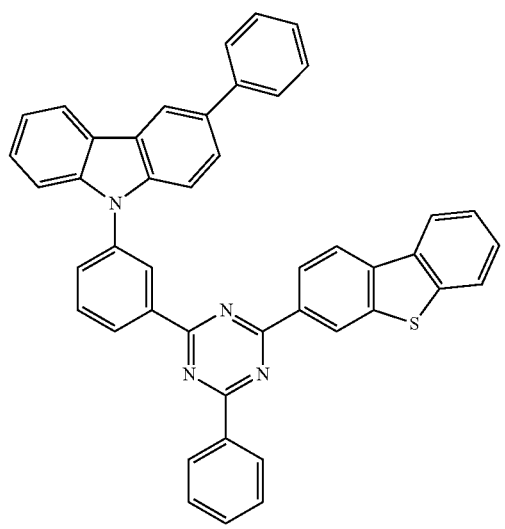
[1-15]
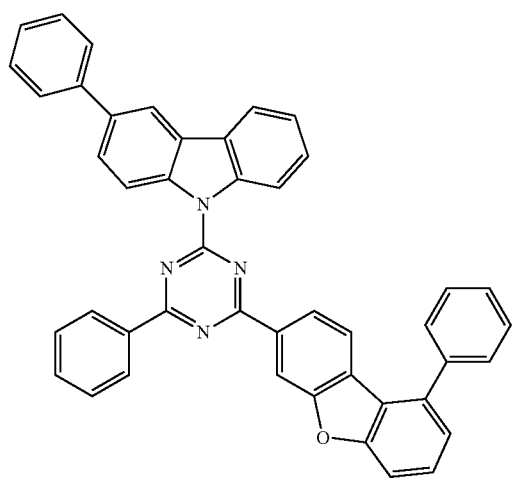
[1-16]
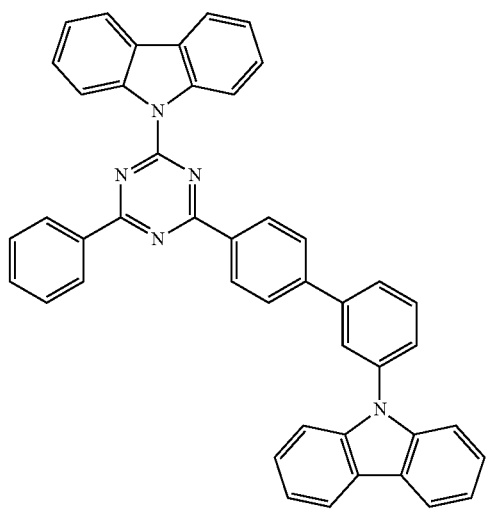

[1-17]
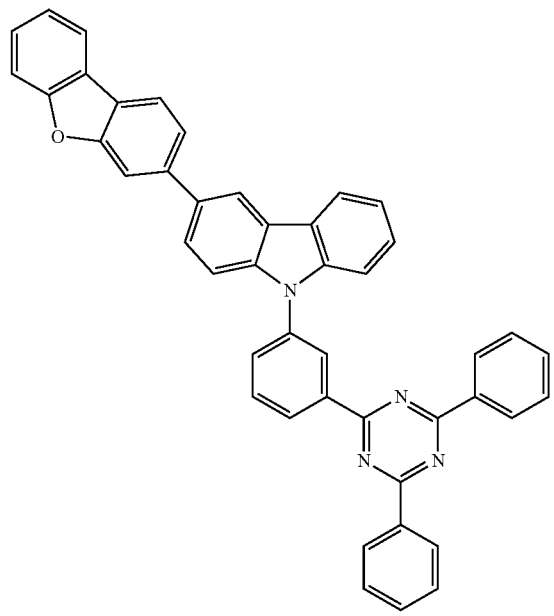
[1-18]
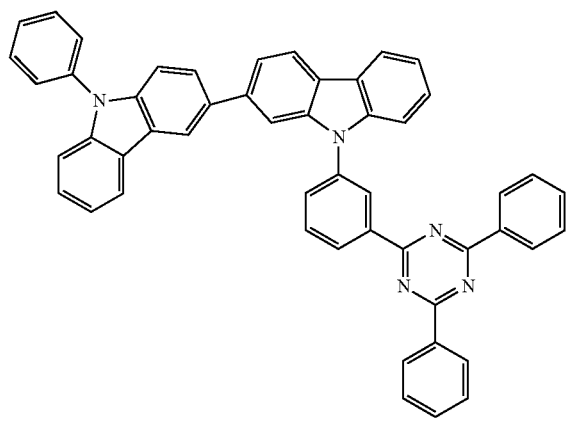
[1-19]
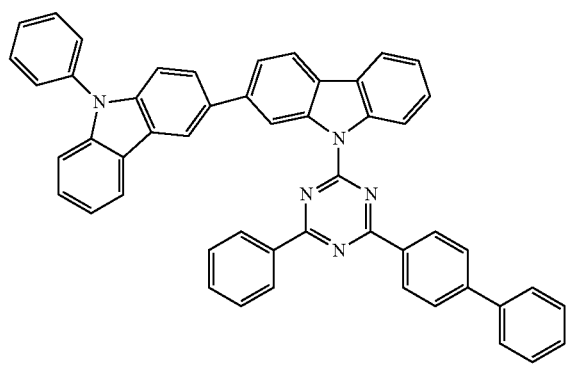
[1-20]
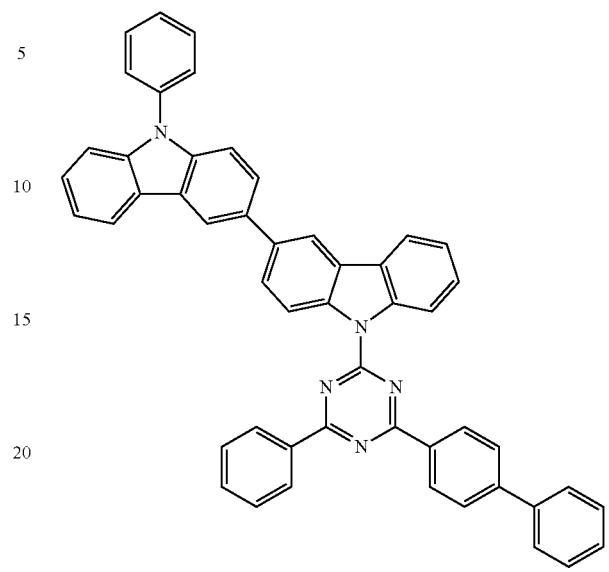
[1-21]
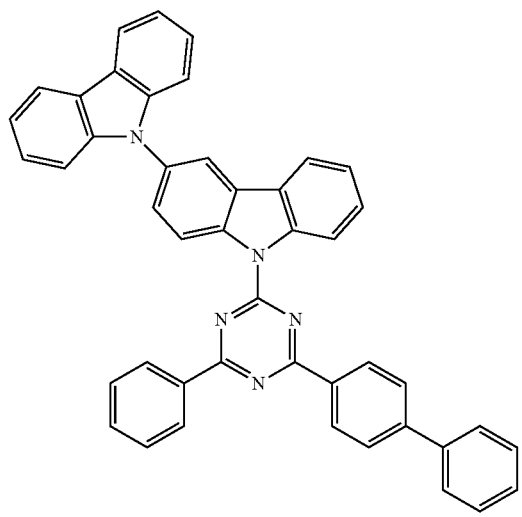
[1-22]
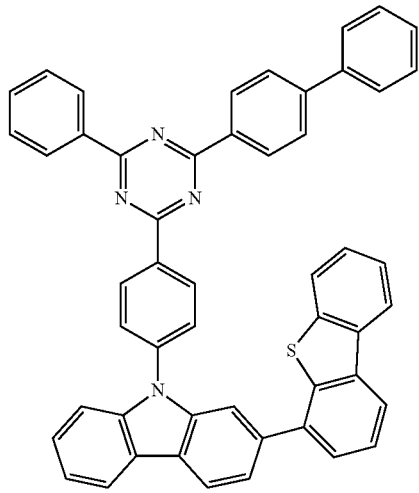

[1-23]
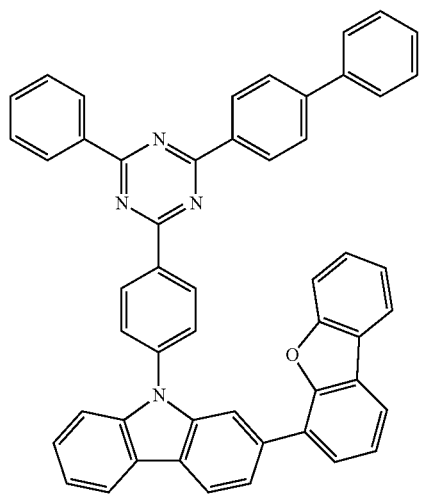
[1-24]
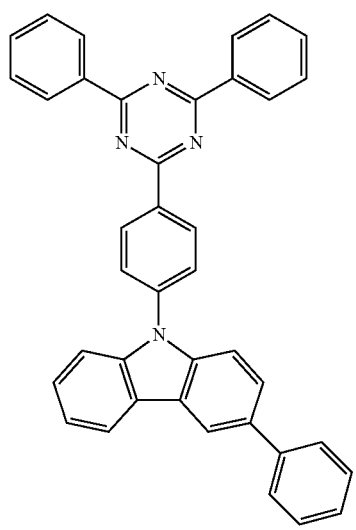
[1-25]
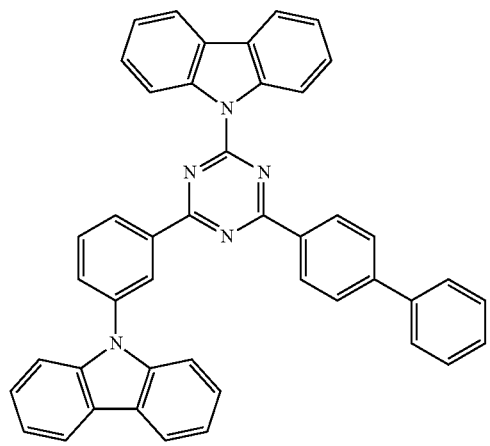
[1-26]
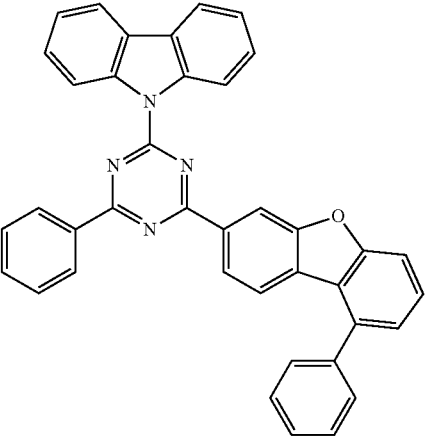
[1-27]
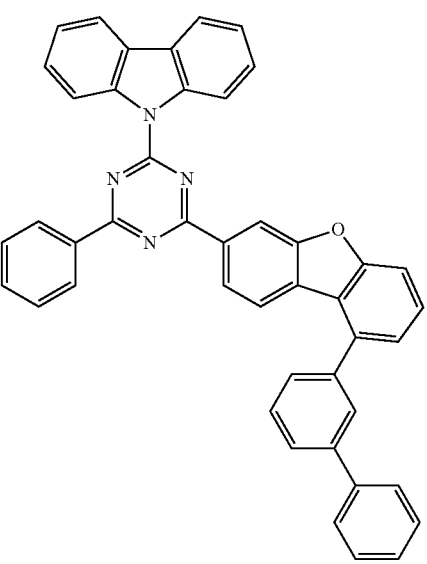
[1-28]
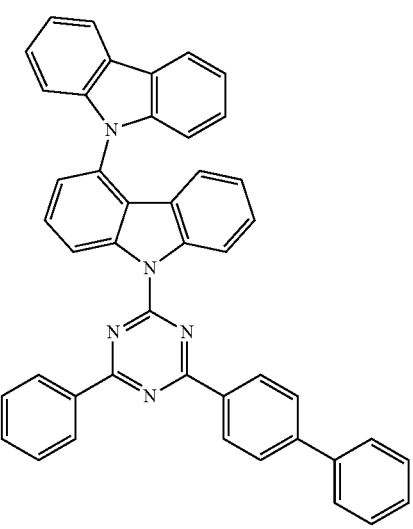

[1-29]
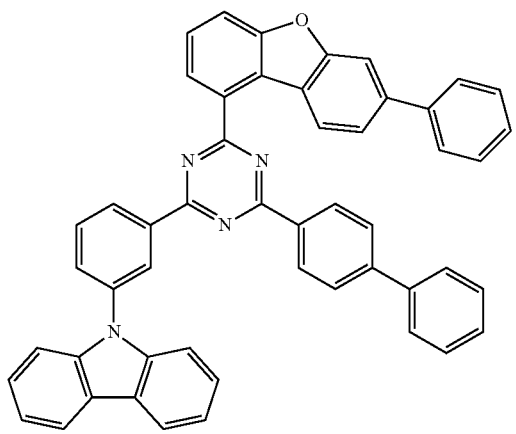
[1-30]
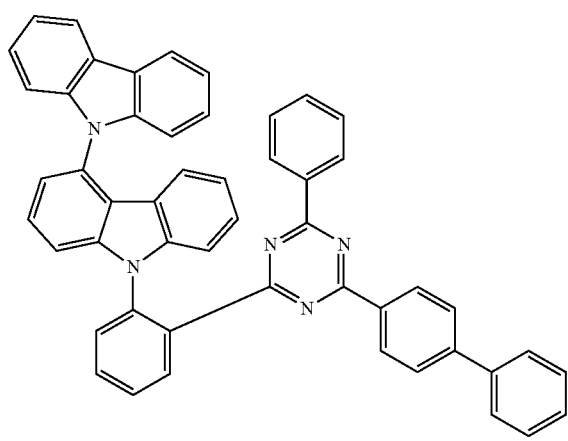
[1-31]
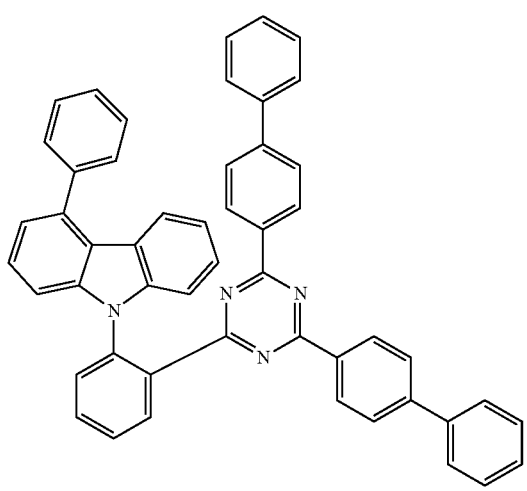
[1-32]
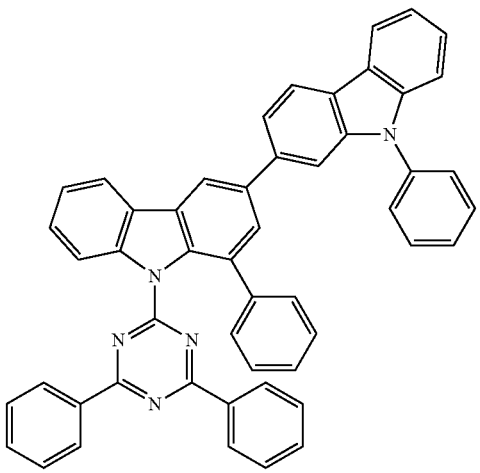
[1-33]
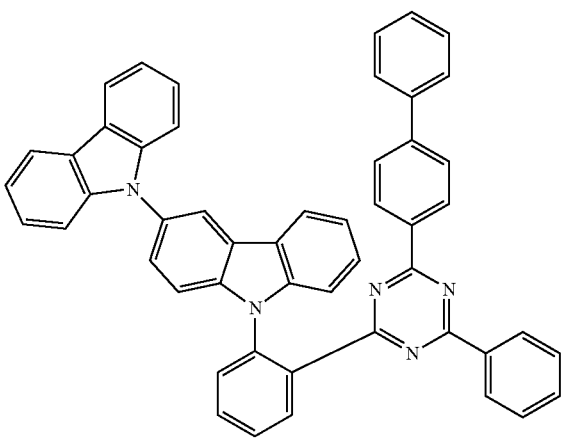
[1-34]
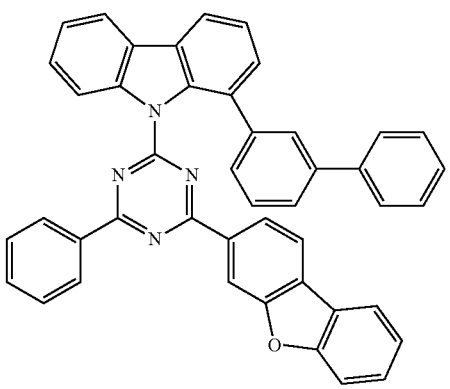

[1-35]
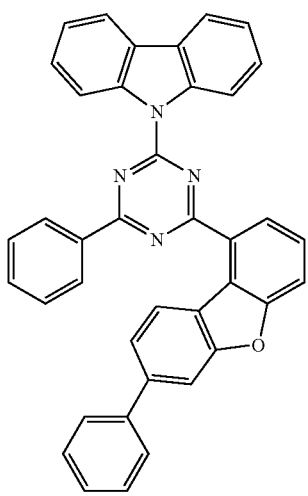
[1-36]
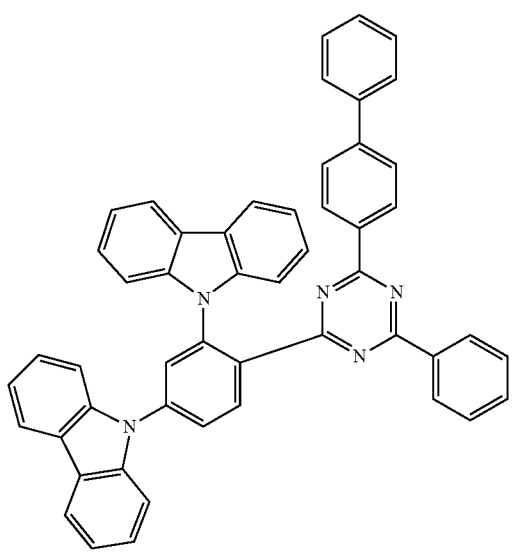
[1-37]
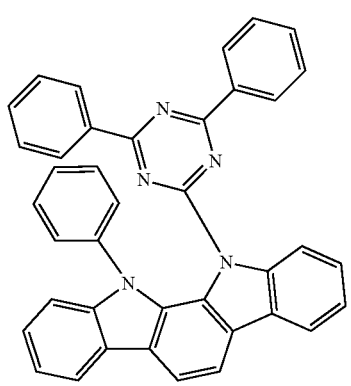
[1-38]
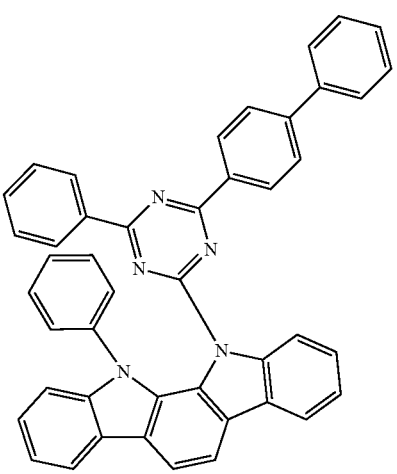
[1-39]
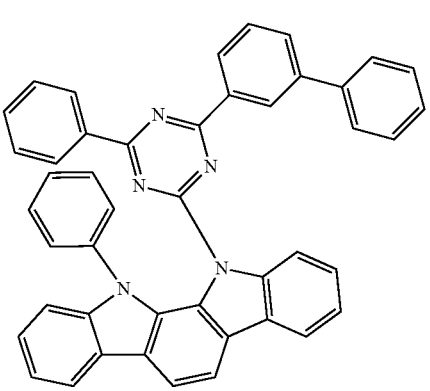
[1-40]
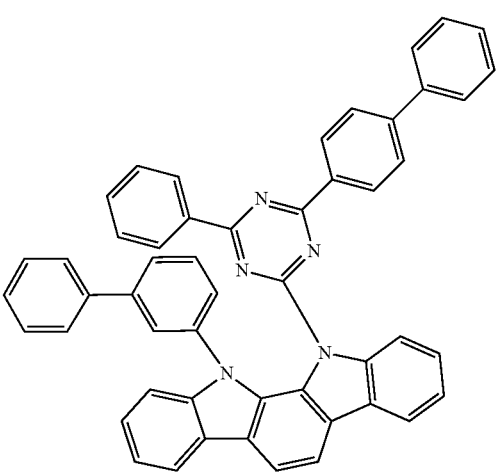

-continued
[1-41]
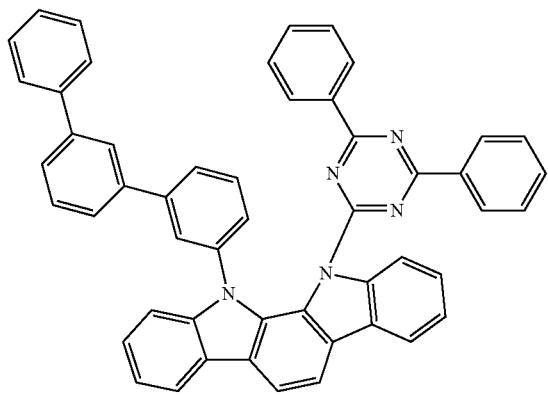
[1-42]
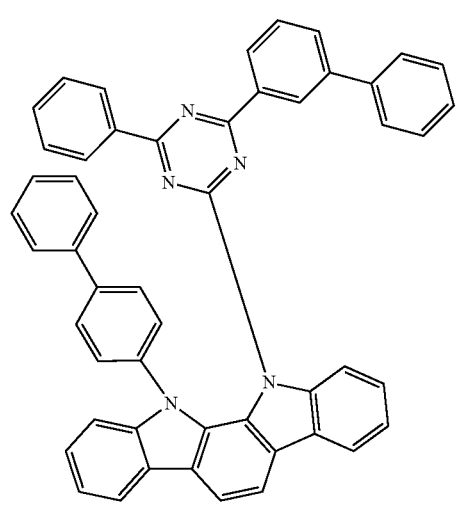
[1-43]
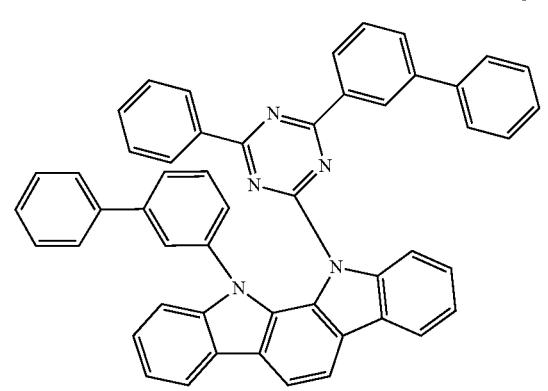
[1-44]
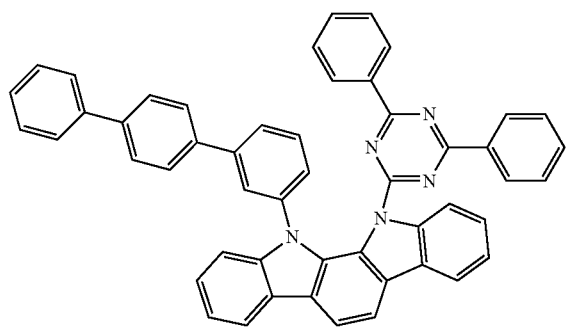
-continued
[1-45]
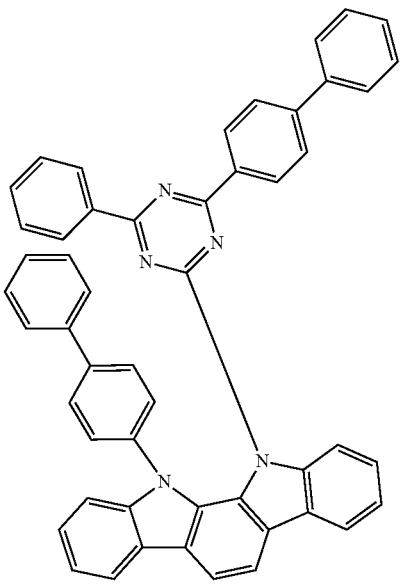
[1-46]
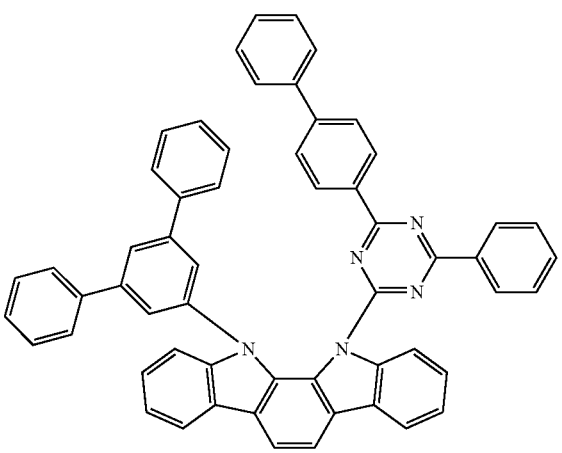
[1-47]
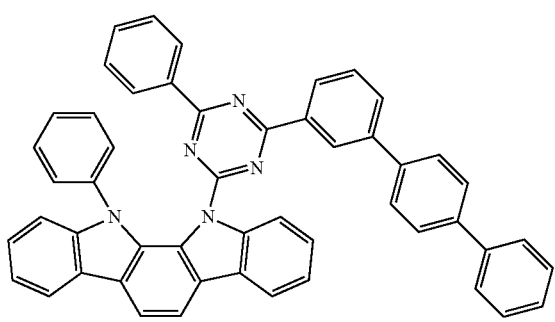

[1-48]
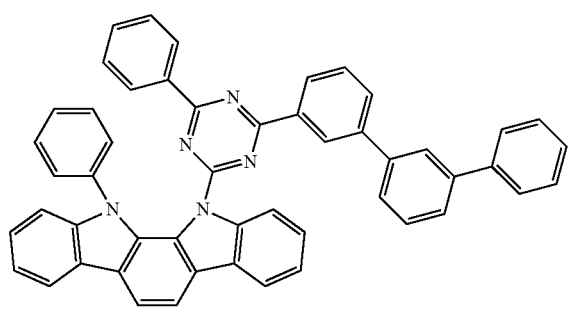
[1-49]
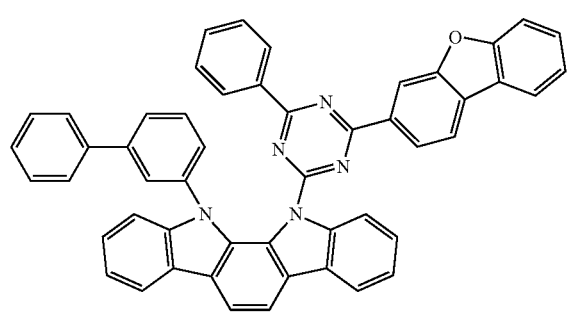
[1-50]
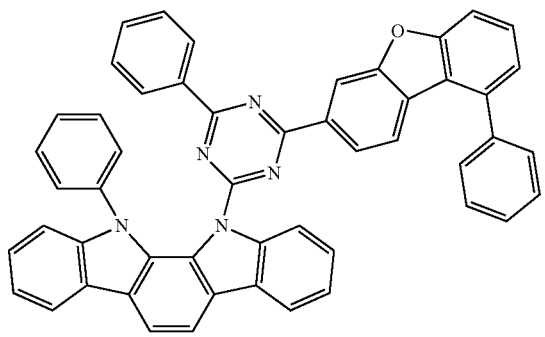
[1-51]
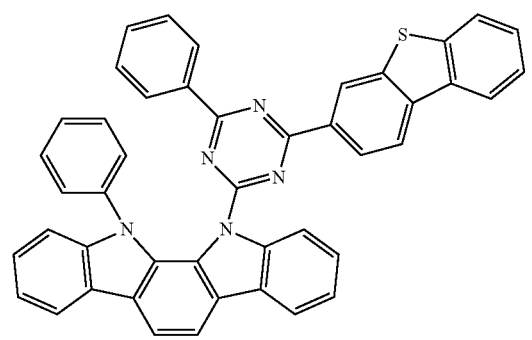
[1-52]
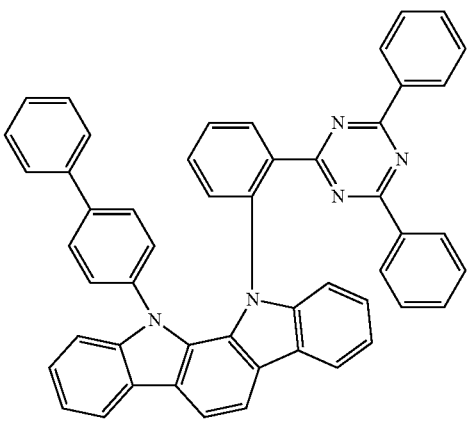
[1-53]
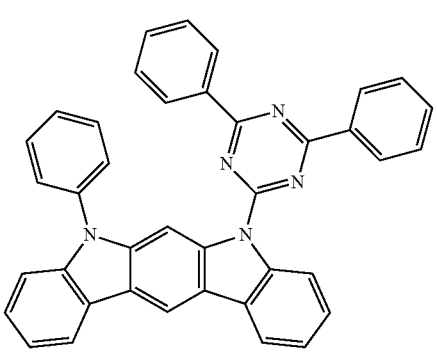
[1-54]
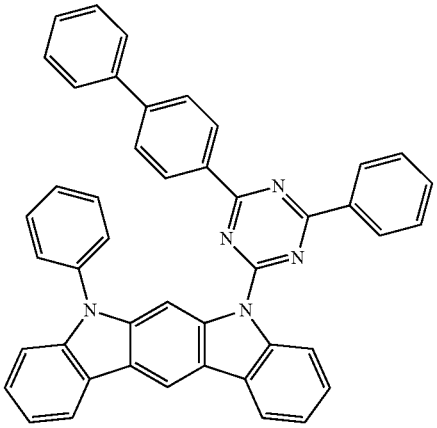
[1-55]
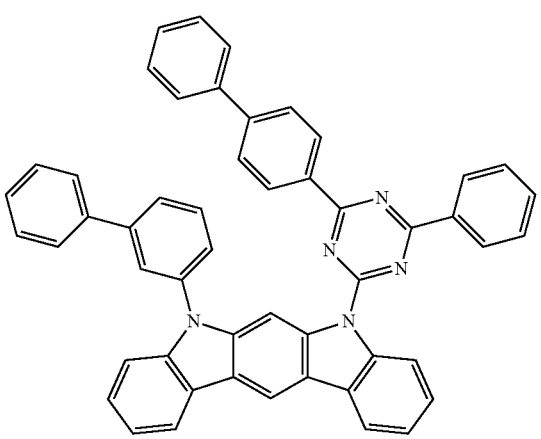

[1-56]
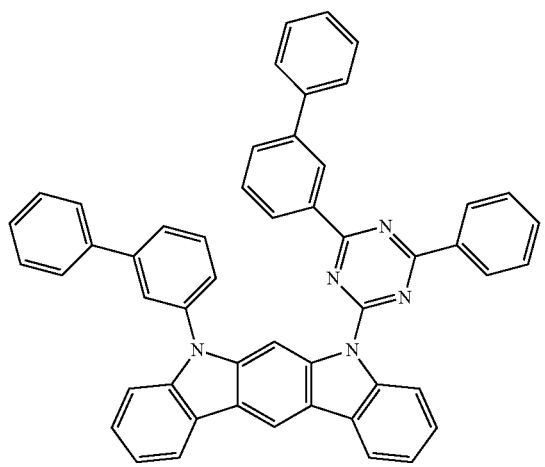
[1-59]
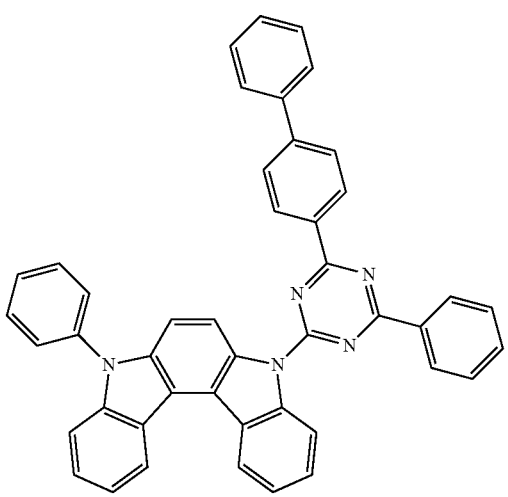
[1-57]
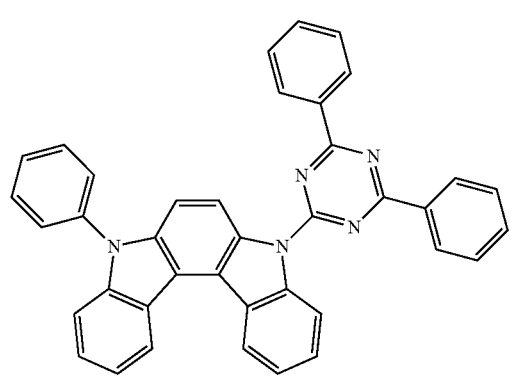
[1-60]
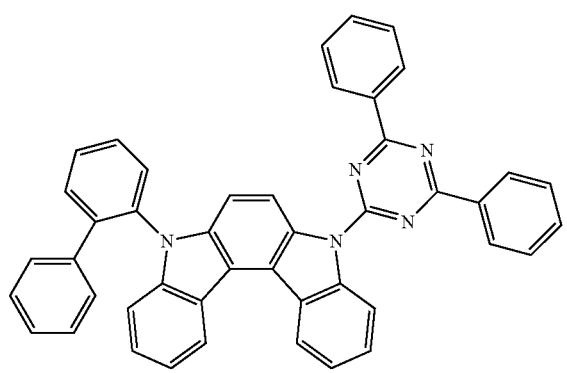
[1-58]
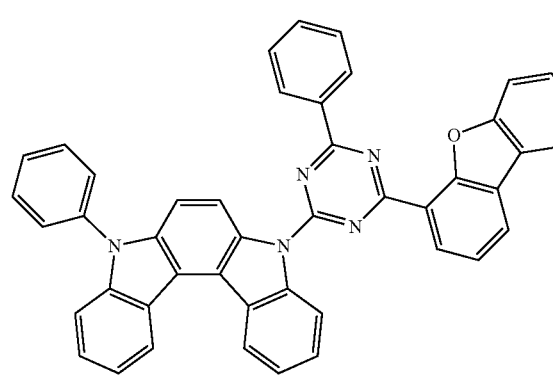
[1-61]
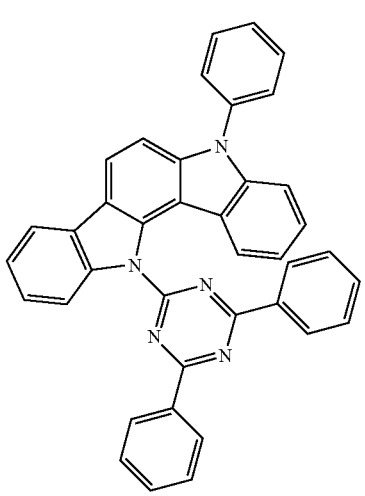

[1-62]
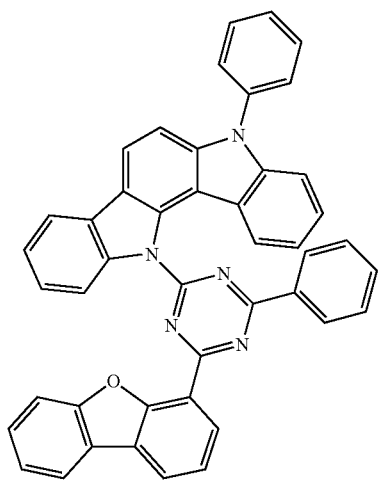
[1-63]
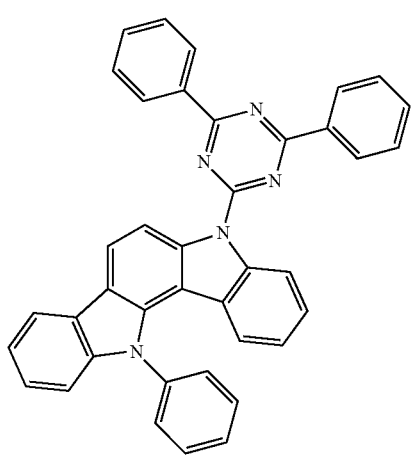
[1-64]
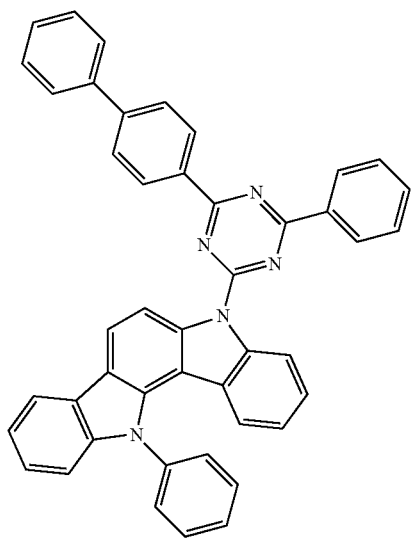
[1-65]
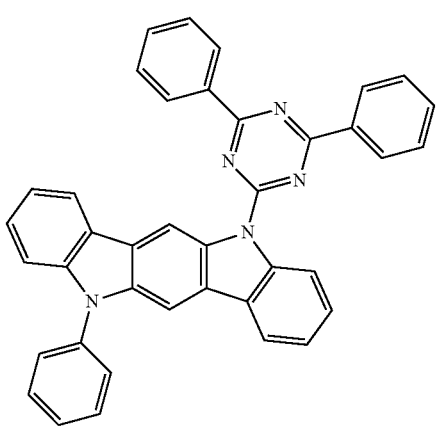
[1-66]
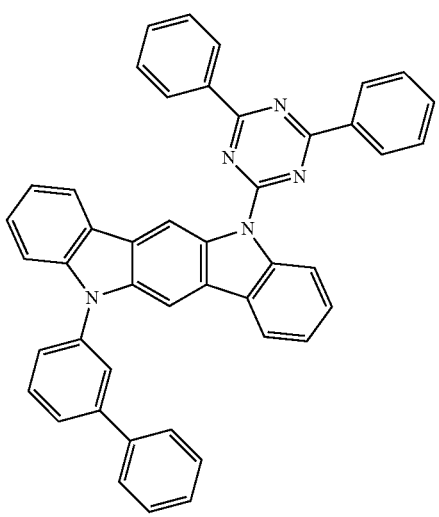
[1-67]
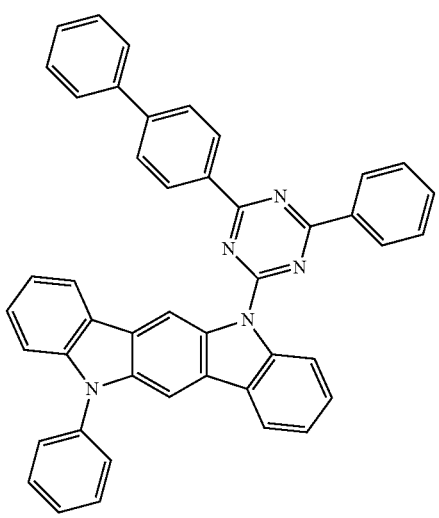

[1-68]
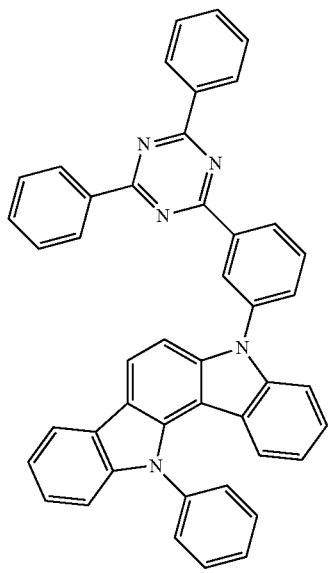
[1-71]
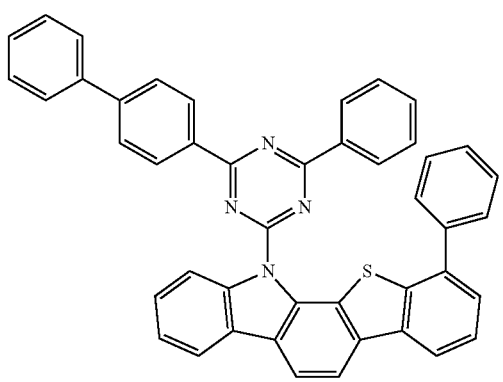
[1-69]
[1-72]
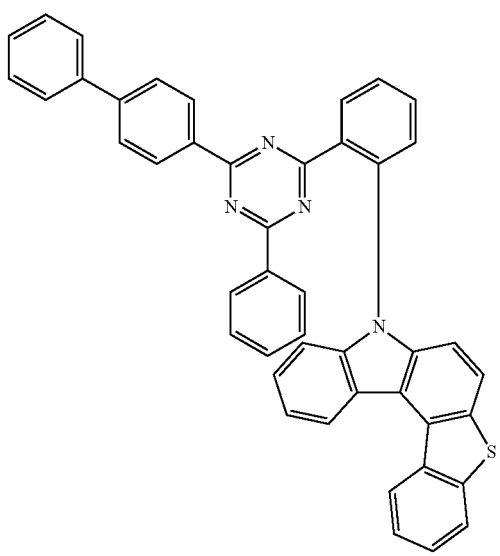
[1-70]
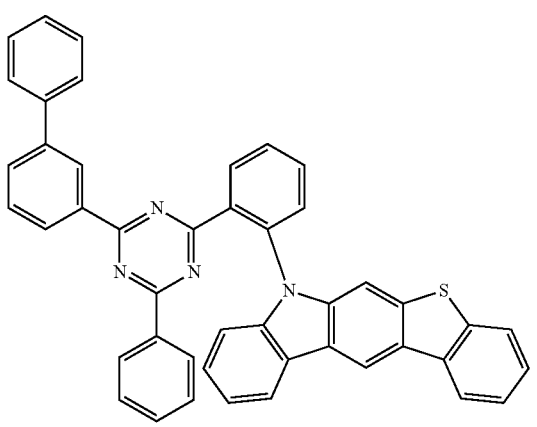
[1-73]
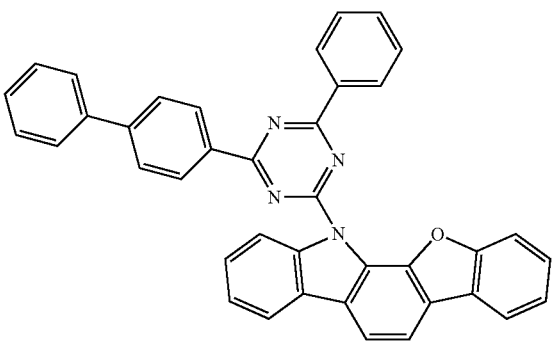

[1-74]
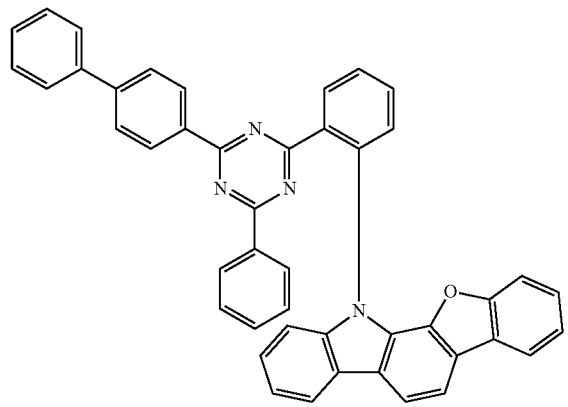
[1-77]
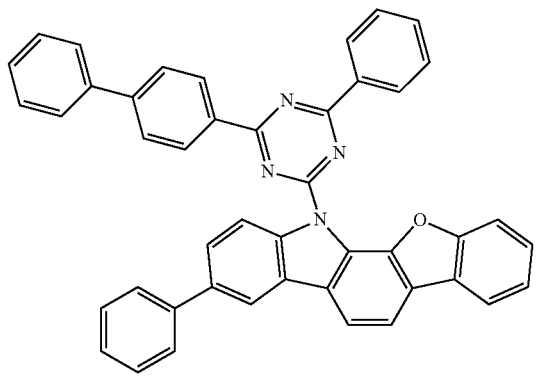
[1-75]
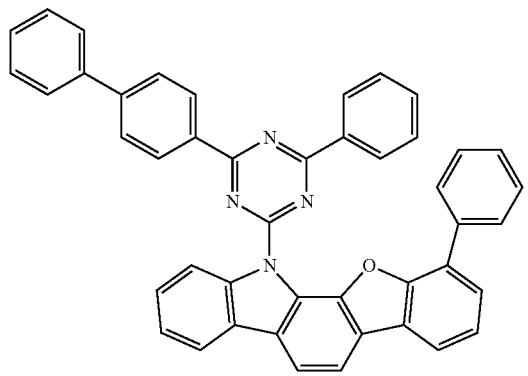
[1-78]
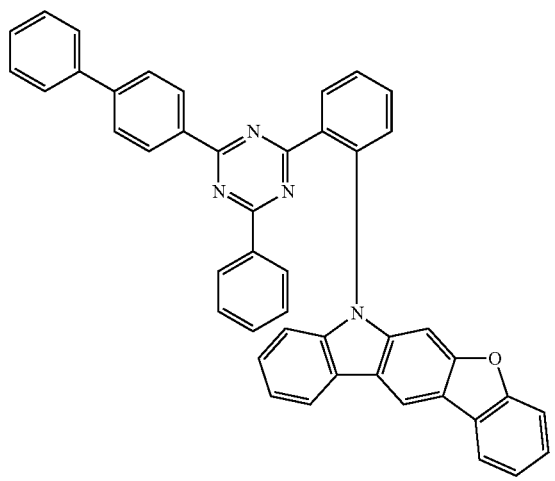
[1-76]
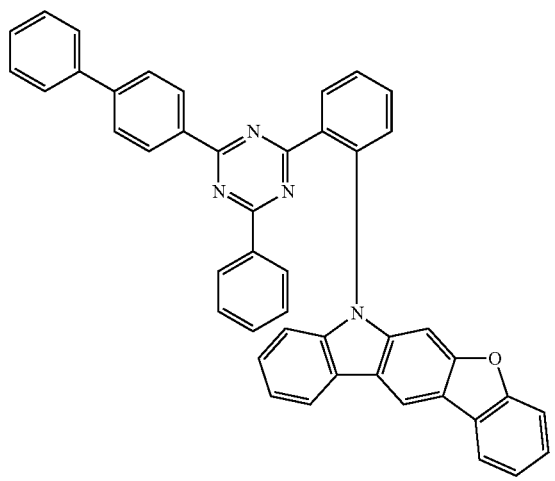
[1-79]
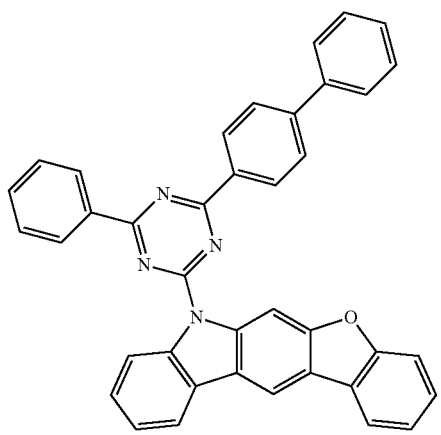

-continued

[1-80]

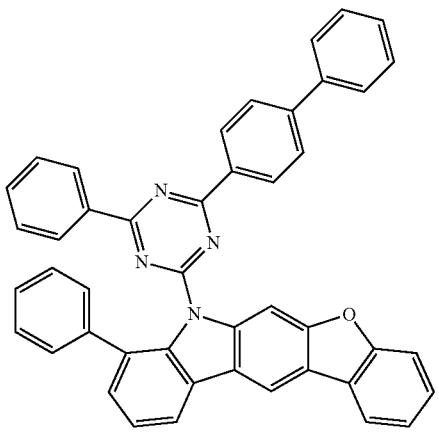

The second compound having the hole characteristics may include a structure in which a carbazole or carbazole derivative is substituted with a substituted or unsubstituted C6 to C30 aryl group, a substituted or unsubstituted dibenzofuranyl group, or a substituted or unsubstituted dibenzothiophenyl group. In an implementation, the second compound may be, e.g., represented by Chemical Formula II.

[Chemical Formula II]

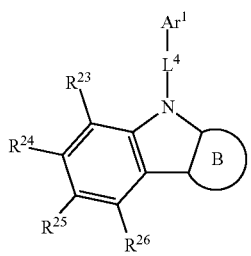

In Chemical Formula II, $L^4$ may be or may include, e.g., a single bond, a substituted or unsubstituted C6 to C20 arylene group, a substituted or unsubstituted C2 to C20 heterocyclic group, or a combination thereof.

$Ar^1$ may be or may include, e.g., a substituted or unsubstituted C6 to C30 aryl group, a substituted or unsubstituted dibenzofuranyl group, a substituted or unsubstituted dibenzothiophenyl group, or a combination thereof.

$R^{23}$ to $R^{26}$ may each independently be or include, e.g., hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof.

Ring B may be a group represented by one of Substituent B-1 to Substituent B-4:

[Substituent B-1]

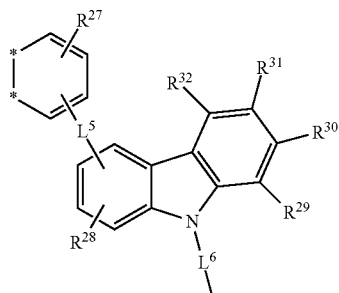

[Substituent B-2]

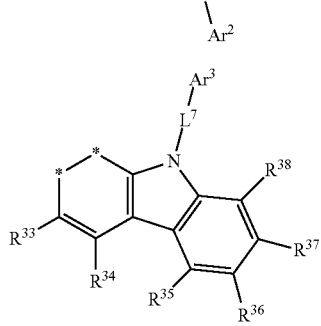

[Substituent B-3]

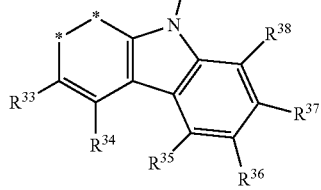

[Substituent B-4]

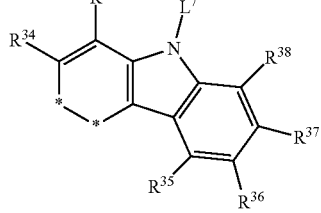

In Substituent B-1 to Substituent B-4, $L^5$ to $L^7$ may each independently be or include, e.g., a single bond, a substituted or unsubstituted C6 to C20 arylene group, a substituted or unsubstituted C2 to C20 heterocyclic group, or a combination thereof.

$Ar^2$ and $Ar^3$ may each independently be or include, e.g., a substituted or unsubstituted C6 to C30 aryl group, a substituted or unsubstituted dibenzofuranyl group, a substituted or unsubstituted dibenzothiophenyl group, or a combination thereof.

$R^{27}$ to $R^{38}$ may each independently be or include, e.g., hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof.

Each * is a linking carbon.

In an implementation, $L^4$ of Chemical Formula II may be, e.g., a single bond or a C6 to C12 arylene group.

In an implementation, $L^4$ in Chemical Formula II may be, e.g., a single bond or a substituted or unsubstituted phenyl group.

$Ar^1$ in Chemical Formula II may be, e.g., a substituted or unsubstituted phenyl group, a substituted or unsubstituted biphenyl group, a substituted or unsubstituted terphenyl group, a substituted or unsubstituted naphthyl group, a substituted or unsubstituted phenanthrene group, a substituted or unsubstituted triphenylene group, a substituted or unsubstituted fluorenyl group, a substituted or unsubstituted carbazolyl group, a substituted or unsubstituted dibenzofuranyl group, or a substituted or unsubstituted dibenzothiophenyl group.

In an implementation, $Ar^1$ in Chemical Formula II may be, e.g., a substituted or unsubstituted phenyl group or a substituted or unsubstituted biphenyl group.

In an implementation, Chemical Formula II may be represented by one of Chemical Formula IIA to Chemical Formula IIF, e.g., depending on the specific structures of carbazole and carbazole derivatives.

[Chemical Formula IIA]

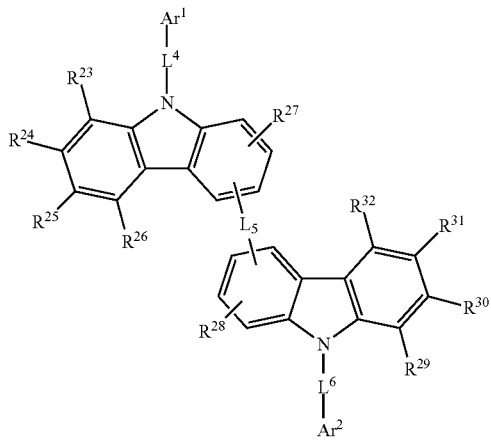

[Chemical Formula IIB]

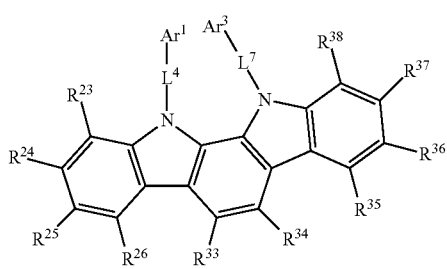

[Chemical Formula IIC]

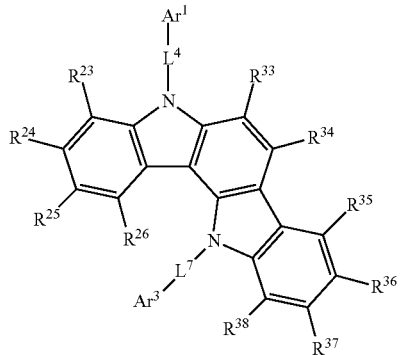

[Chemical Formula IID]

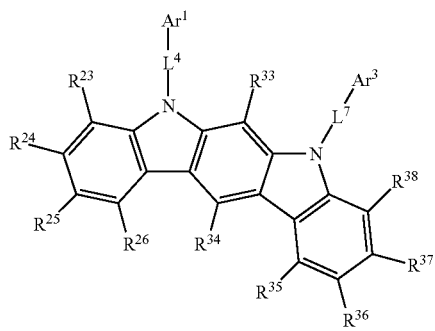

[Chemical Formula IIE]

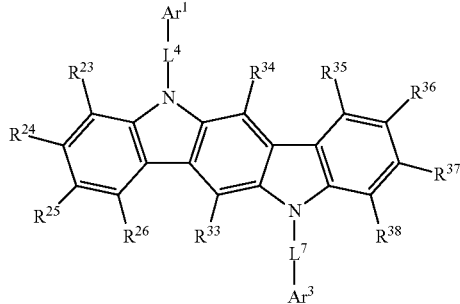

[Chemical Formula IIF]

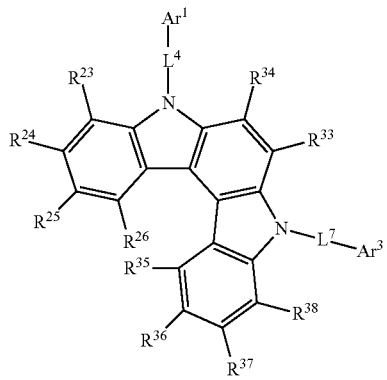

In Chemical Formula IIA to Chemical Formula IIF, $L^4$ to $L^7$, $Ar^1$ to $Ar^3$, and $R^{13}$ to $R^{21}$ may be defined the same as those described above.

In an implementation, $R^{23}$ to $R^{32}$ in Chemical Formula IIA may each independently be, e.g., hydrogen, a substituted or unsubstituted phenyl group, a substituted or unsubstituted carbazolyl group, a substituted or unsubstituted dibenzofuranyl group, or a substituted or unsubstituted dibenzothiophenyl group.

In an implementation, $L^4$ and $L^6$ in Chemical Formula IIA may each independently be, e.g., a single bond, a substituted or unsubstituted phenylene group, a substituted or unsubstituted biphenylene group, a substituted or unsubstituted naphthylene group, a substituted or unsubstituted dibenzofuranylene group, or a substituted or unsubstituted dibenzothiophenylene group.

In an implementation, $L^5$ in Chemical Formula IIA may be, e.g., a single bond or a substituted or unsubstituted phenylene group.

In an implementation, $Ar^1$ and $Ar^2$ in Chemical Formula IIA may each independently be, e.g., a substituted or unsubstituted phenyl group, a substituted or unsubstituted biphenyl group, a substituted or unsubstituted terphenyl group, a substituted or unsubstituted naphthyl group, a substituted or unsubstituted phenanthrene group, a substituted or unsubstituted triphenylene group, a substituted or unsubstituted fluorenyl group, a substituted or unsubstituted dibenzofuranyl group, or a substituted or unsubstituted dibenzothiophenyl group.

In an implementation, when $Ar^1$ and $Ar^2$ are substituted, the substituent may be a phenyl group or a cyano group.

In an implementation, $R^{23}$ to $R^{26}$ and $R^{33}$ to $R^{38}$ in Chemical Formula IIB to Chemical Formula IIF may each independently be, e.g., hydrogen, a substituted or unsubstituted phenyl group, a substituted or unsubstituted carbazolyl group, or a substituted or unsubstituted triphenylene group.

In an implementation, when $R^{23}$ to $R^{26}$ and $R^{33}$ to $R^{38}$ are substituted, the substituent may be, e.g., a phenyl group or a carbazolyl group.

In an implementation, $L^4$ and $L^7$ in Chemical Formula IIB to Chemical Formula IIF may each independently be, e.g., a single bond, a substituted or unsubstituted phenylene group, or a substituted or unsubstituted carbazolylene group.

In an implementation, $Ar^1$ and $Ar^3$ in Chemical Formula IIB to Chemical Formula IIF may each independently be, e.g., a substituted or unsubstituted phenyl group, a substituted or unsubstituted biphenyl group, a substituted or unsubstituted terphenyl group, a substituted or unsubstituted triphenylene group, a substituted or unsubstituted carbazolyl group, a substituted or unsubstituted dibenzofuranyl group, or a substituted or unsubstituted dibenzothiophenyl group.

In an implementation, when $Ar^1$ and $Ar^3$ are substituted, the substituent may be, e.g., a phenyl group, a cyano group, or a carbazolyl group.

In an implementation, each of $R^{23}$ to $R^{32}$ in Chemical Formula IIA may be hydrogen.

In an implementation, $L^4$ and $L^6$ in Chemical Formula IIA may each independently be, e.g., a single bond or a substituted or unsubstituted phenylene group.

In an implementation, $L^5$ in Chemical Formula IIA may be a single bond.

In an implementation, $Ar^1$ and $Ar^2$ in Chemical Formula IIA may each independently be, e.g., a substituted or unsubstituted phenyl group, or a substituted or unsubstituted biphenyl group.

In an implementation, $R^{23}$ to $R^{26}$ and $R^{33}$ to $R^{38}$ in Chemical Formula IIB to Chemical Formula IIF may each be hydrogen.

In an implementation, $L^4$ and $L^7$ in Chemical Formula IIB to Chemical Formula IIF may each independently be, e.g., a single bond or a substituted or unsubstituted phenylene group.

In an implementation, $Ar^1$ and $Ar^3$ in Chemical Formula IIB to Chemical Formula IIF may each independently be, e.g., a substituted or unsubstituted phenyl group or a substituted or unsubstituted biphenyl group.

In an implementation, the second compound may be represented by Chemical Formula IIA or Chemical Formula IIF.

In an implementation, Chemical Formula IIA may be, e.g., represented by one of Chemical Formula IIA-1 to Chemical Formula IIA-3.

[Chemical Formula IIA-1]

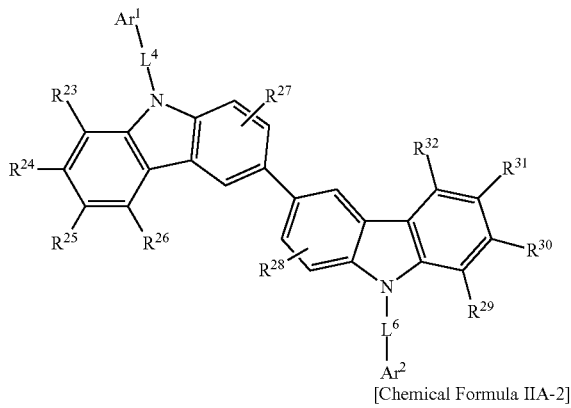

[Chemical Formula IIA-2]

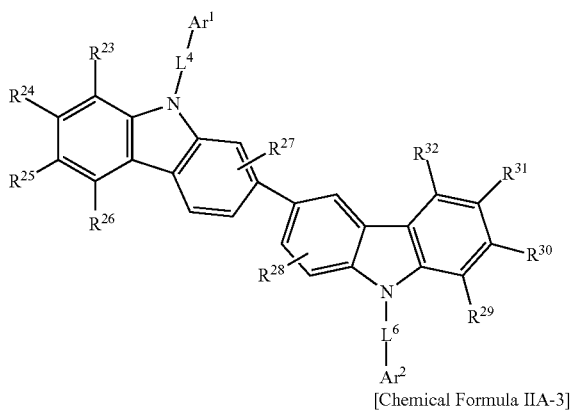

[Chemical Formula IIA-3]

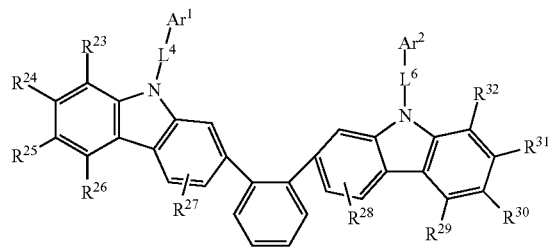

In Chemical Formula IIA-1 to Chemical Formula IIA-3, each of the linking group and substituent (e.g., variable groups) may be defined the same as those described above.

In an implementation, the second compound may be represented by f Chemical Formula IIA-1, Chemical Formula IIA-2, or Chemical Formula IIF.

In an implementation, in Chemical Formula IIA-1, and Chemical Formula IIA-2, $R^{23}$ to $R^{32}$ may each be hydrogen, $L^4$ and $L^6$ may each independently be, e.g., a single bond or a substituted or unsubstituted phenylene group, and $Ar^1$ and Ar² may each independently be, e.g., a substituted or unsubstituted phenyl group or a substituted or unsubstituted biphenyl group.

In an implementation, in Chemical Formula IIF, $R^{23}$ to $R^{26}$ and $R^{34}$ to $R^{38}$ may each be hydrogen, $L^4$ and $L^7$ may each independently be, e.g., a single bond or a substituted or unsubstituted phenylene group, and $Ar^1$ and $Ar^3$ may each independently be, e.g., a substituted or unsubstituted phenyl group or a substituted or unsubstituted biphenyl group.

In an implementation, the second compound may be, e.g., a compound of Group 2.

[Group 2]

[2-1]

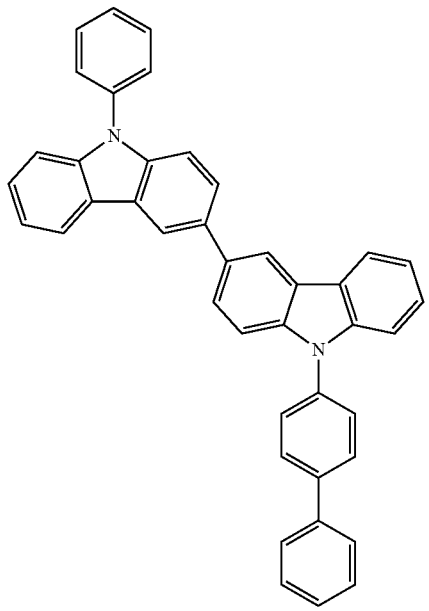

[2-2]

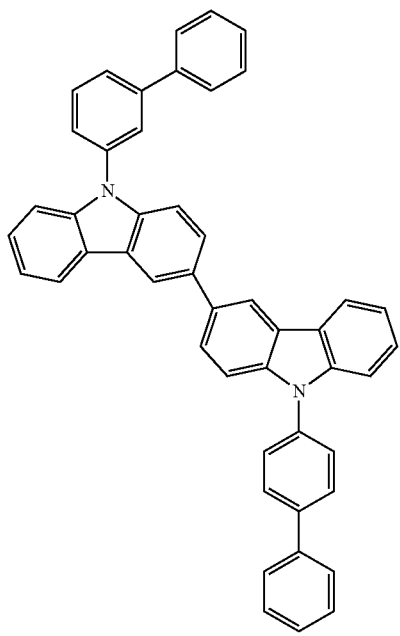

[2-3]

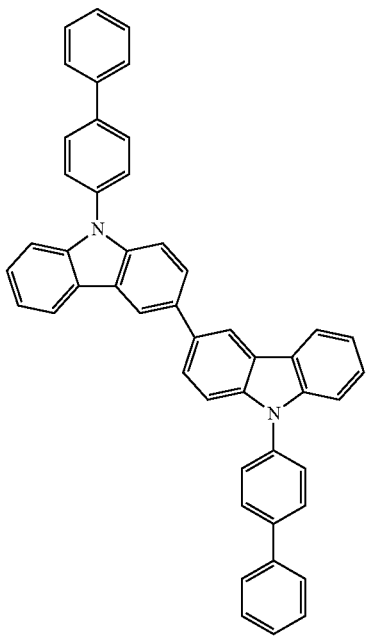

[2-4]

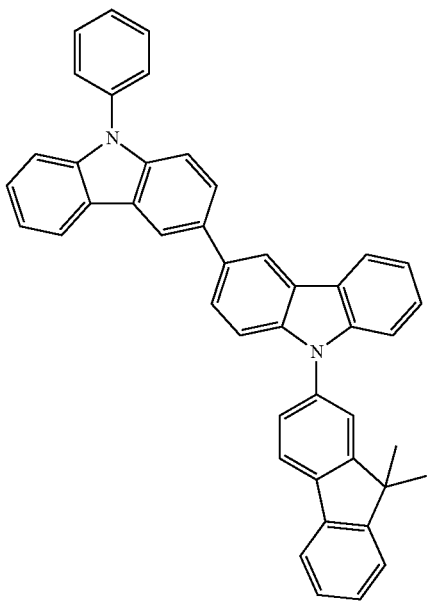

[2-5]
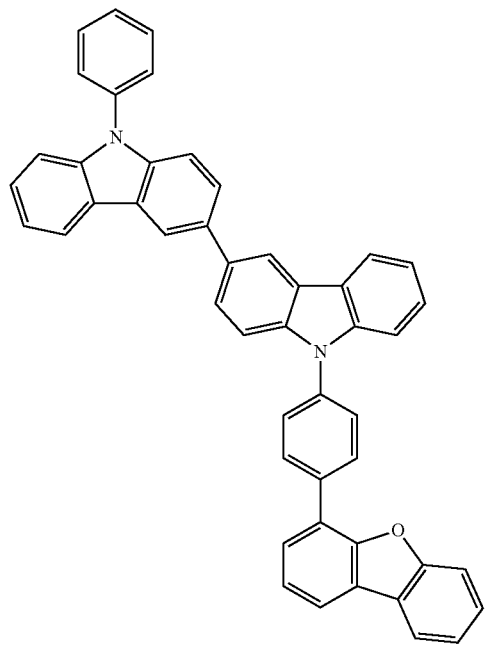
[2-6]
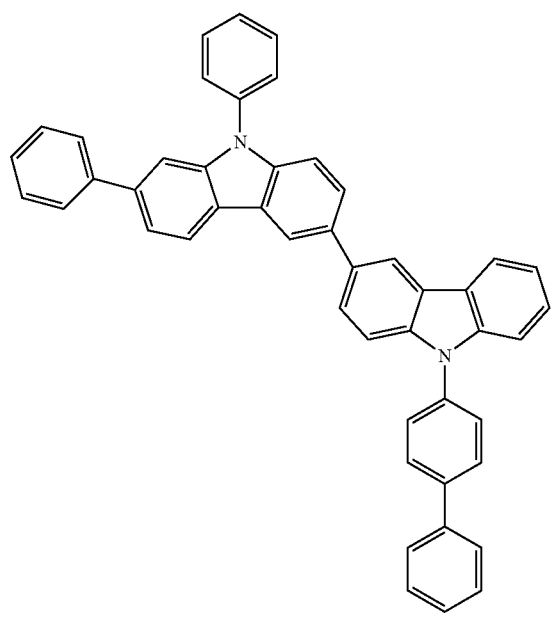
[2-7]
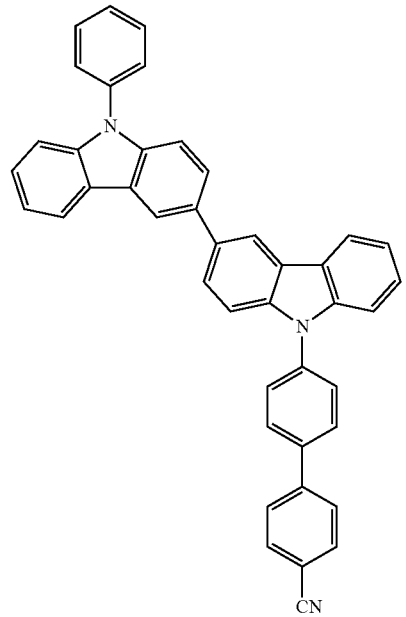
[2-8]
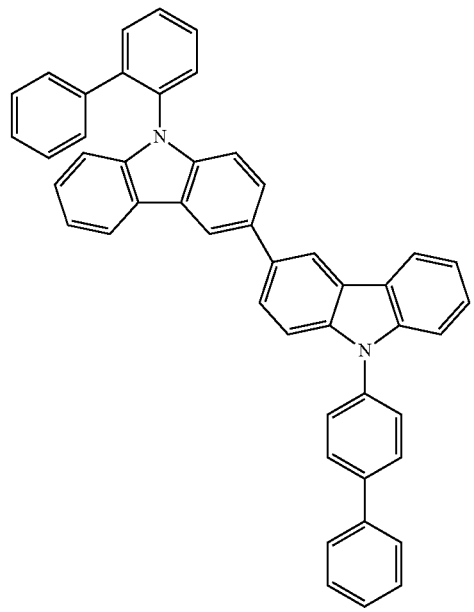

[2-9]
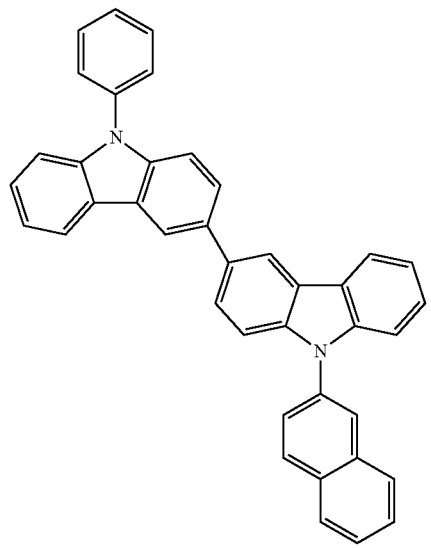
[2-10]
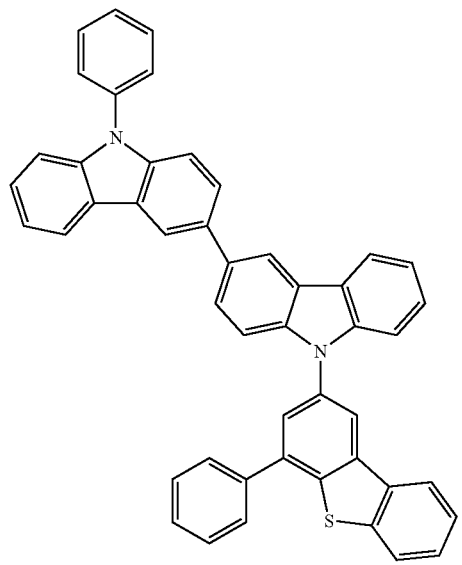
[2-11]
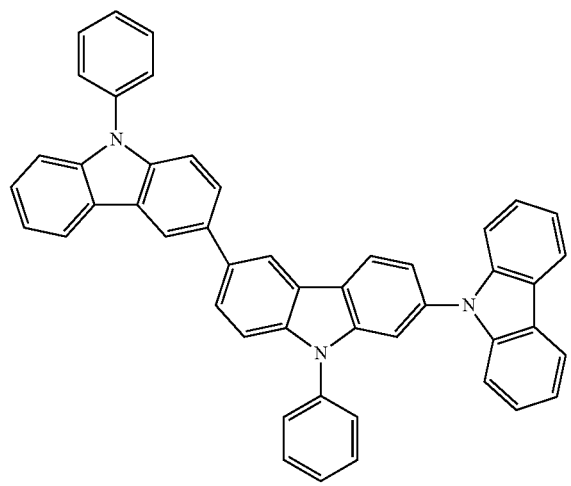
[2-12]
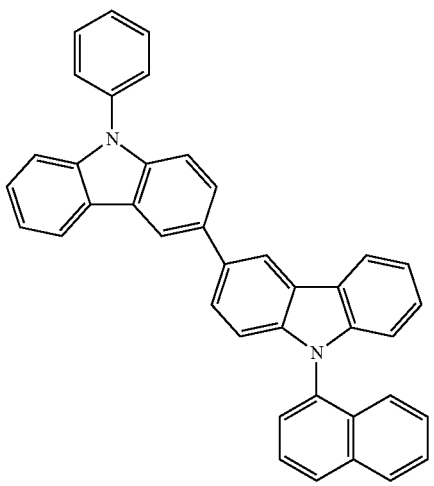
[2-13]
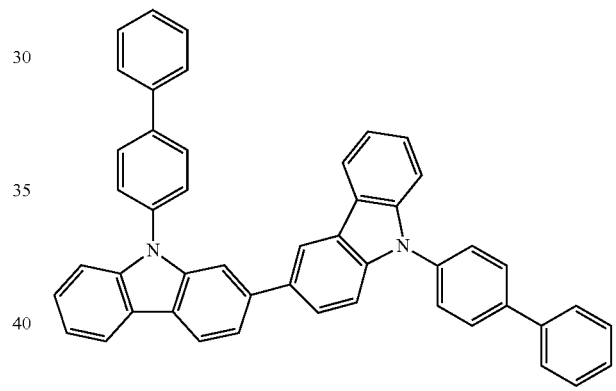
[2-14]
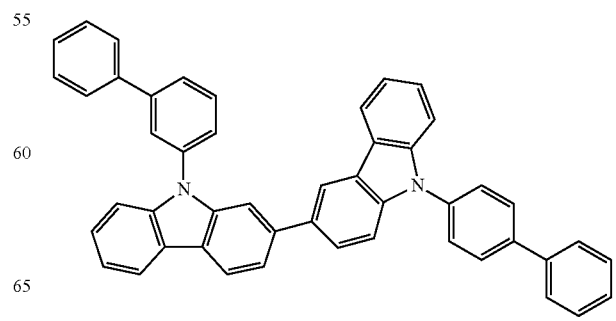

[2-15]
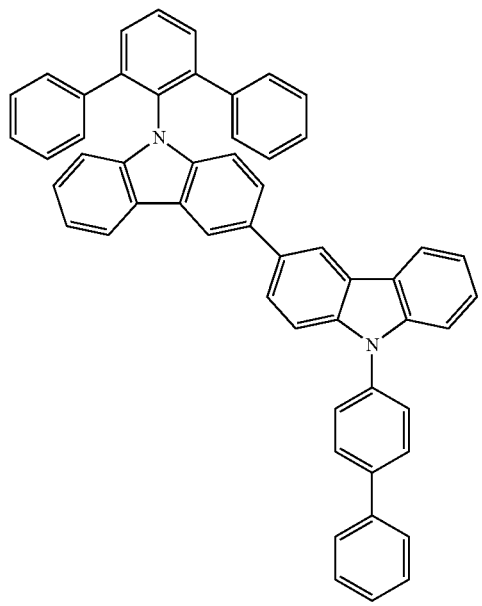
[2-17]
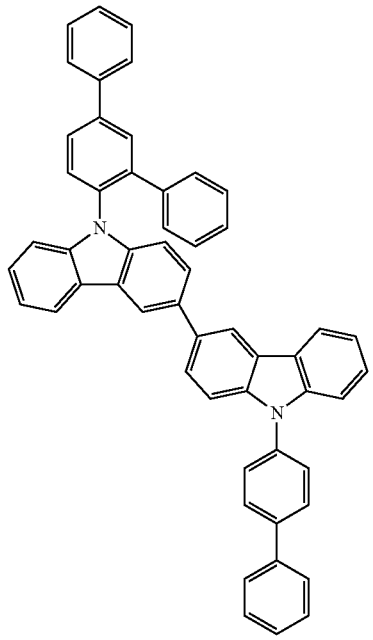
[2-16]
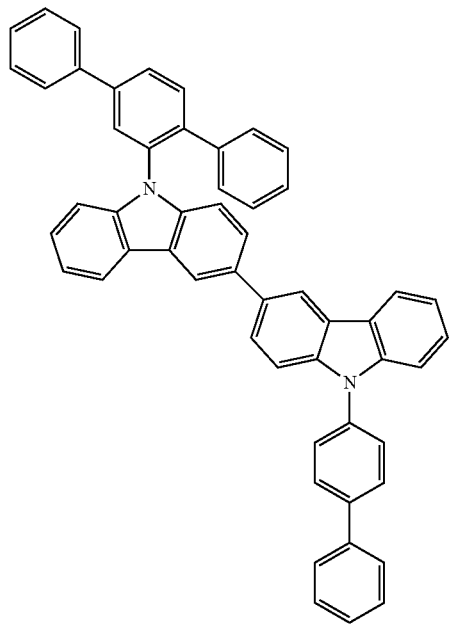
[2-18]
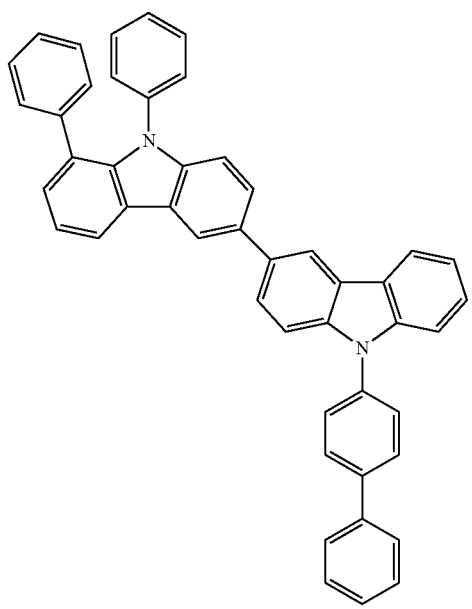

[2-19]
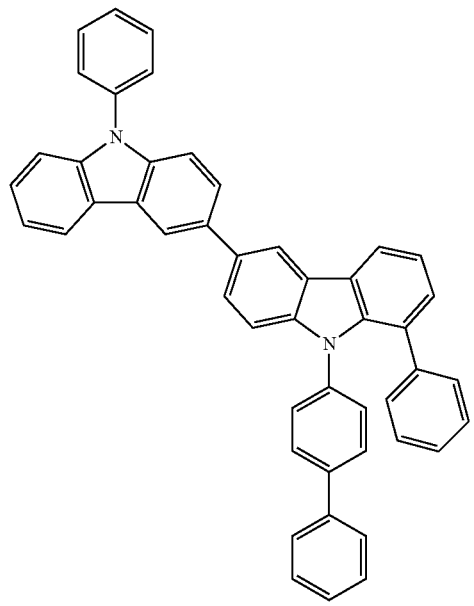
[2-21]
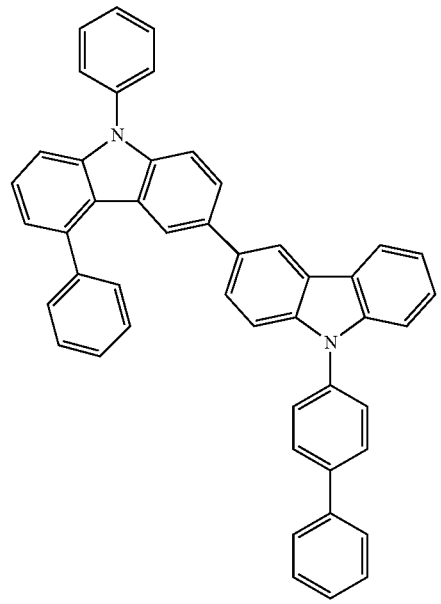
[2-20]
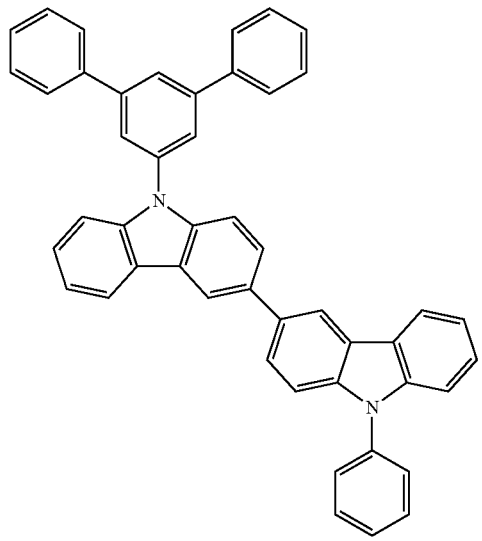
[2-22]
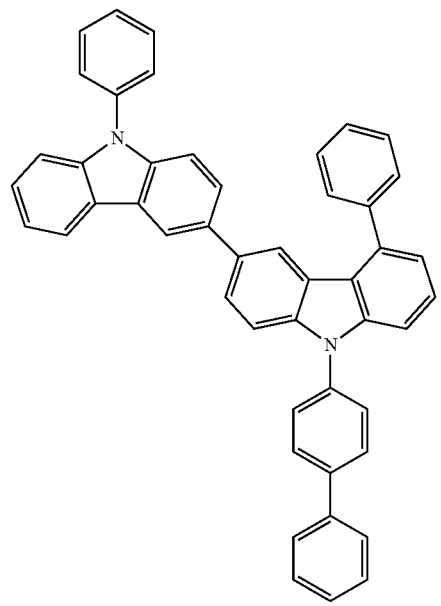

[2-23]
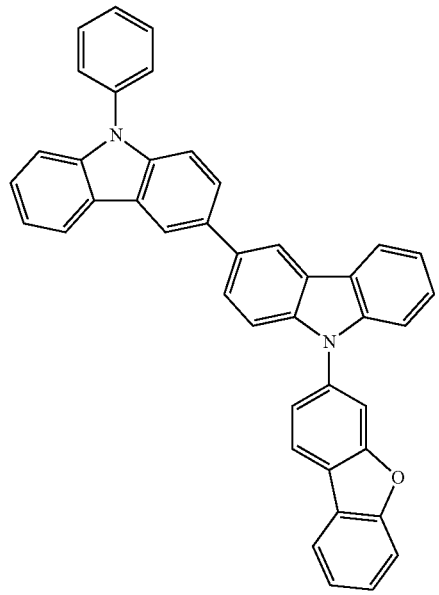
[2-24]
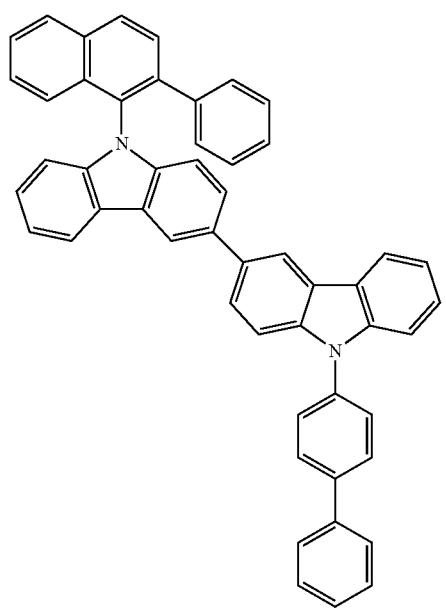
[2-25]
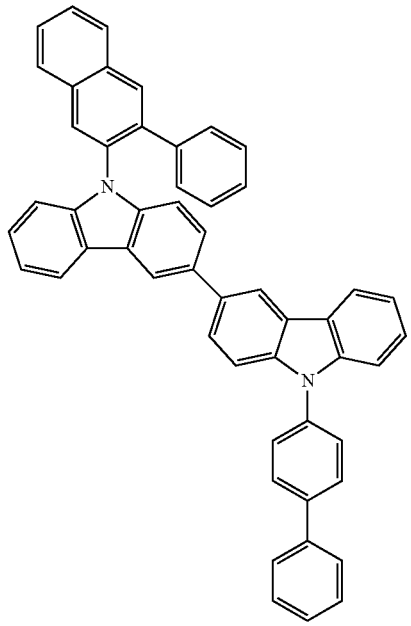
[2-26]
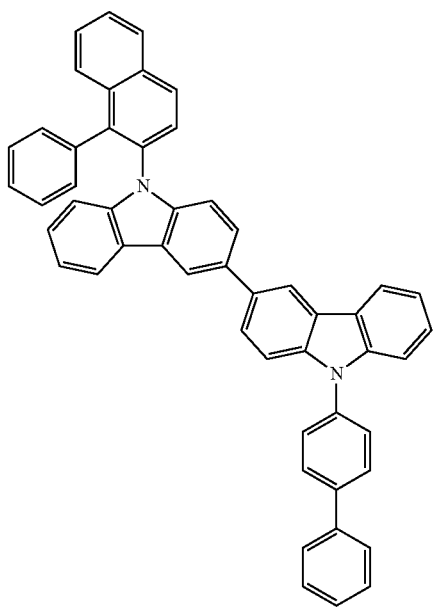

[2-27]
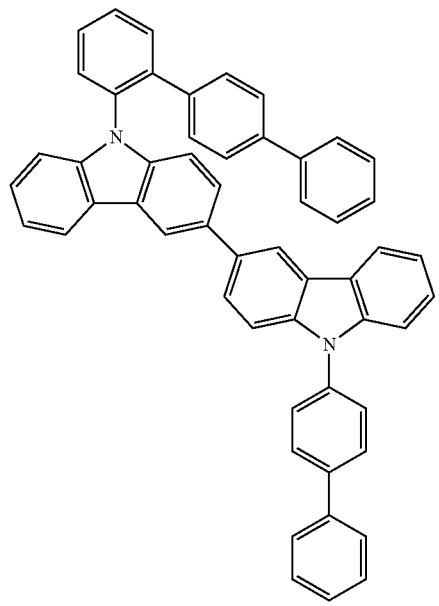
[2-28]
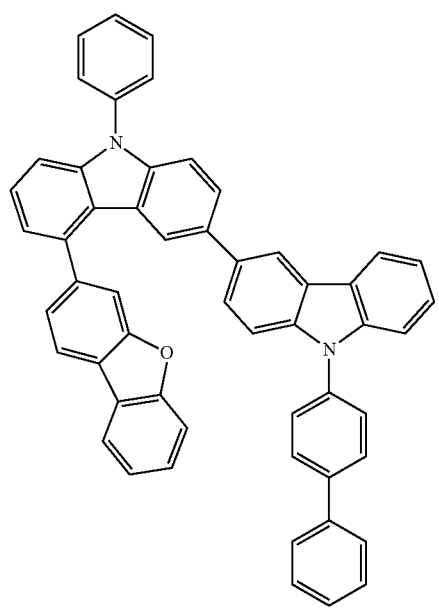
[2-29]
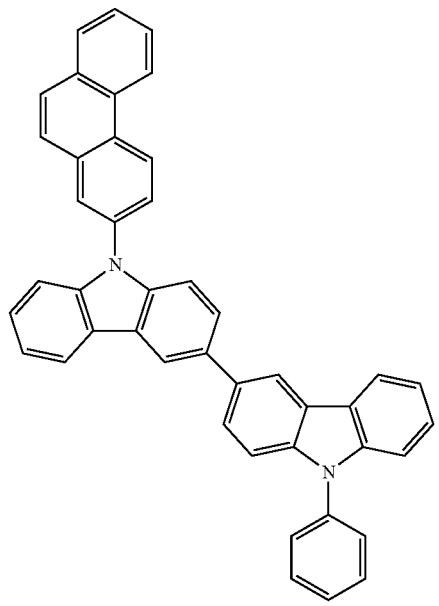
[2-30]
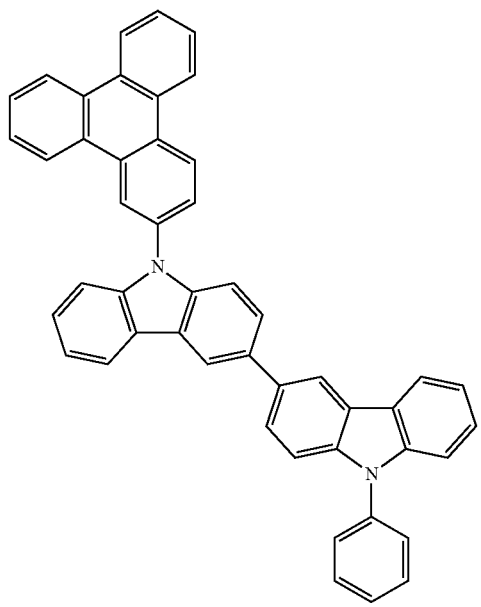

[2-31]
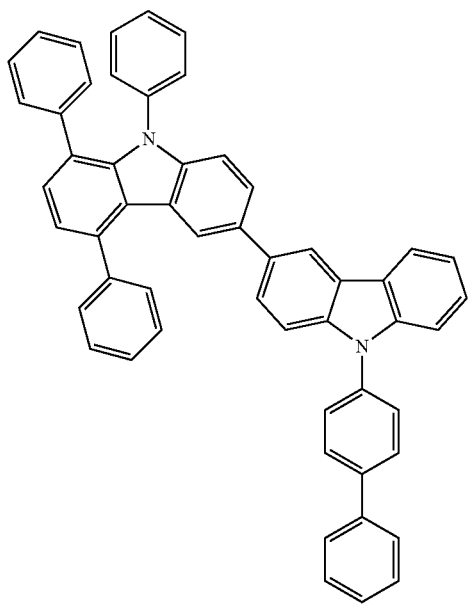
[2-32]
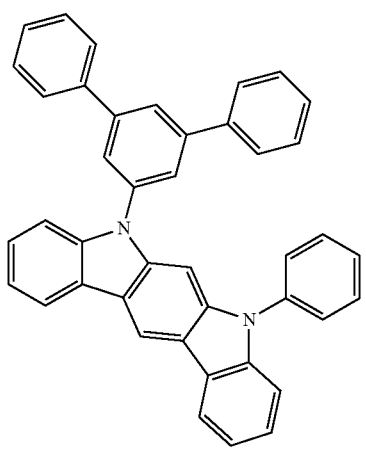
[2-33]
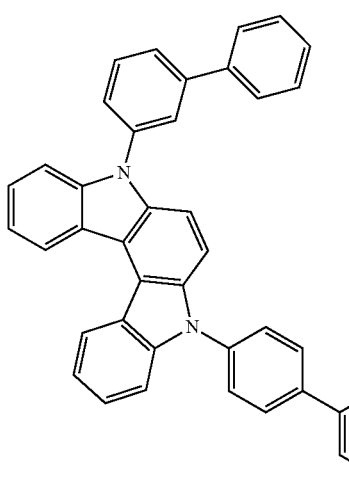
[2-34]
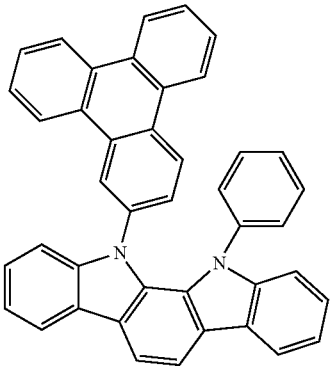
[2-35]
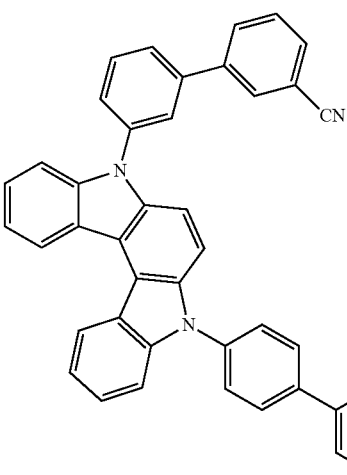
[2-36]
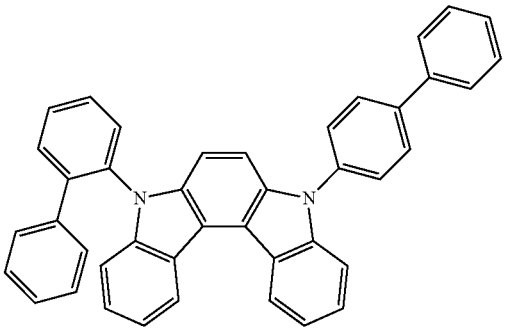
[2-37]
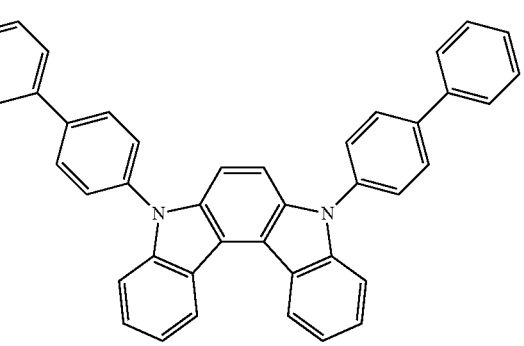

[2-38]
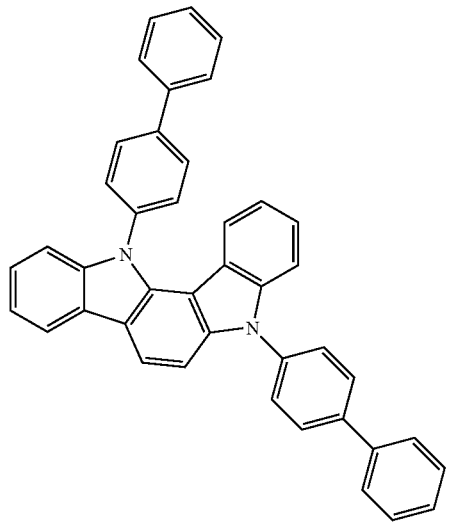
[2-39]
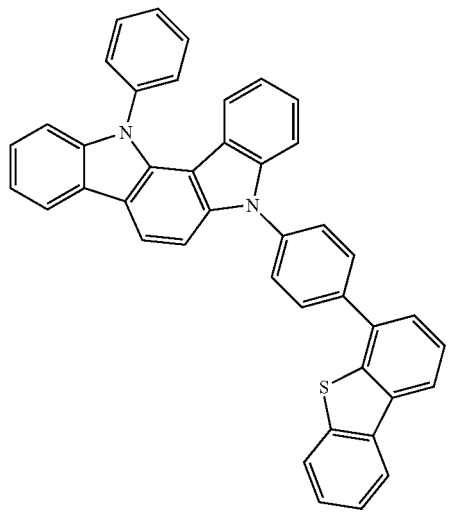
[2-40]
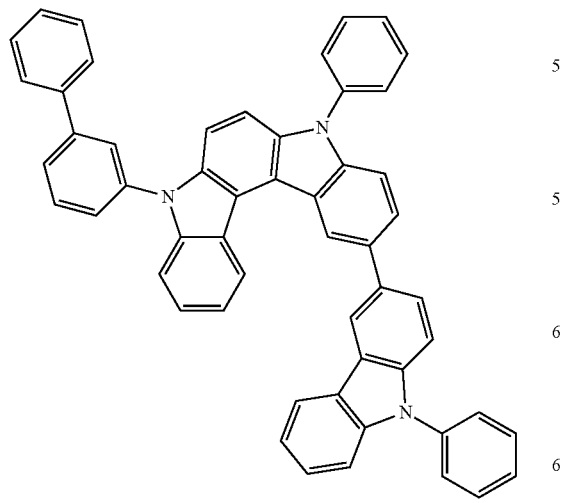
[2-41]
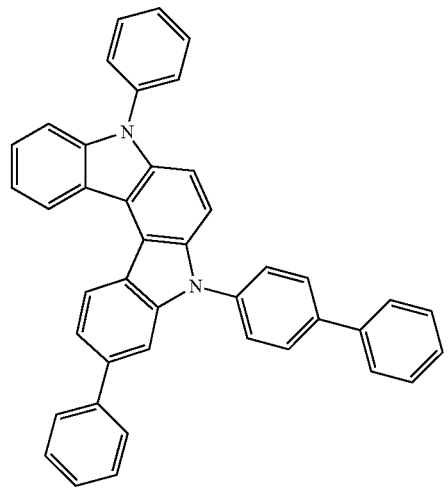
[2-42]
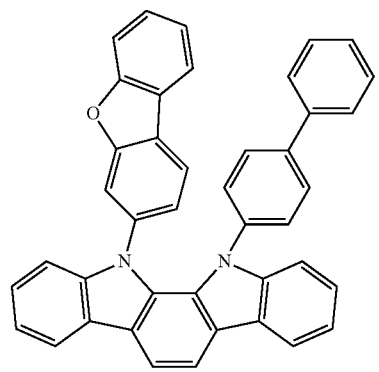
[2-43]
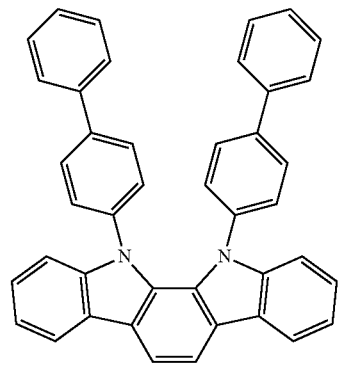

-continued
[2-44]
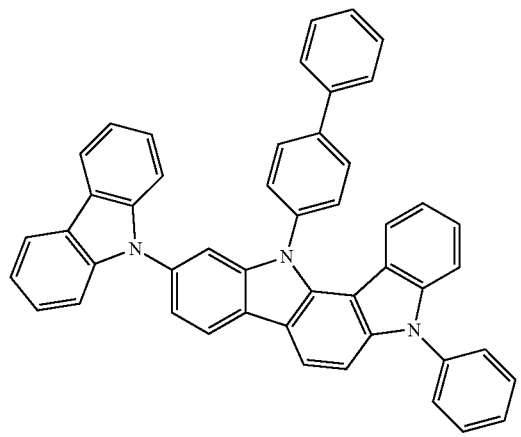
[2-45]
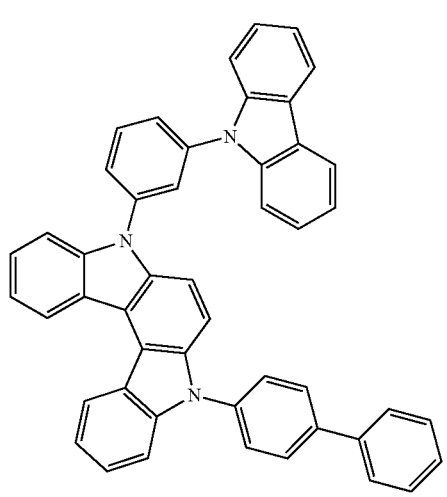
[2-46]
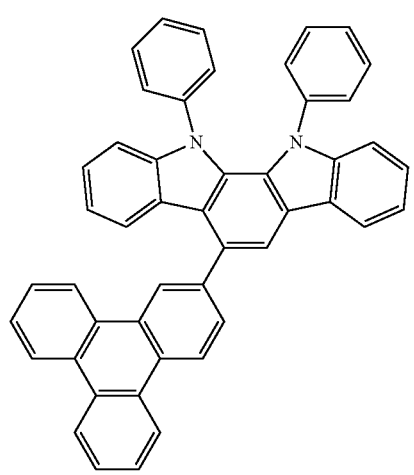
-continued
[2-47]
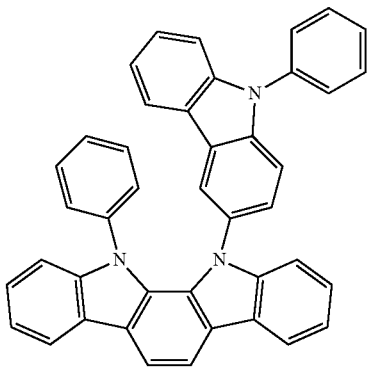
[2-48]
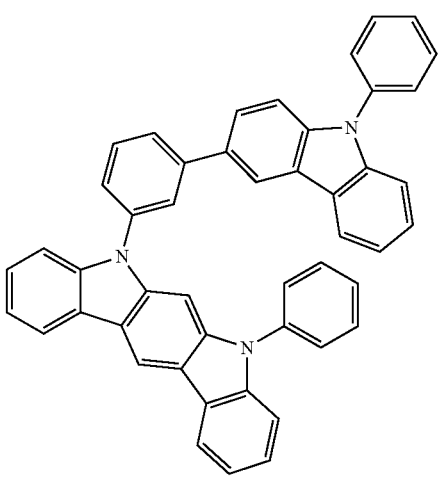
[2-49]
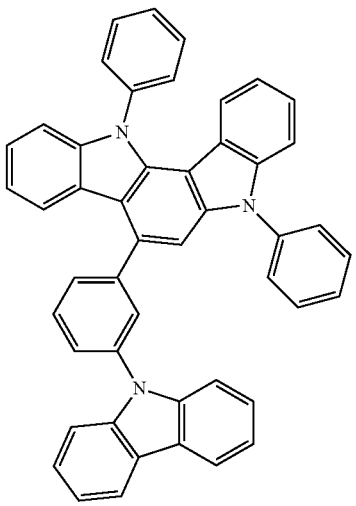
[2-50]
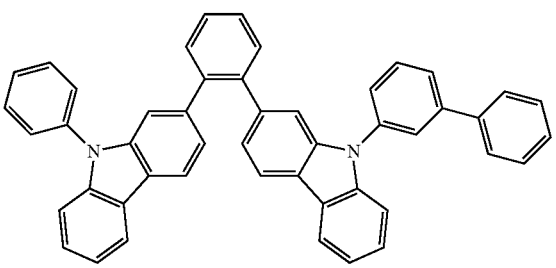

In an implementation, the third compound having the buffer characteristics may include a structure in which triphenylene is substituted with a fused aryl group. In an implementation, the third compound may be, e.g., represented by Chemical Formula III.

[Chemical Formula III]

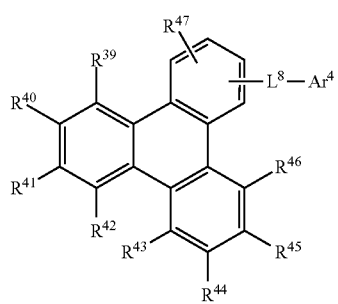

In Chemical Formula III, $R^{39}$ to $R^{47}$ may each independently be or include, e.g., hydrogen, deuterium, a substituted or unsubstituted C1 to C30 alkyl group, or a substituted or unsubstituted C6 to C30 aryl group.

$L^8$ may be, e.g., a substituted or unsubstituted C6 to C20 arylene group.

$Ar^4$ may be, e.g., a substituted or unsubstituted C10 to C20 fused aryl group.

The third compound may be represented, e.g., by Chemical Formula III-1 or Chemical Formula III-2, depending on the linking group substituting the triphenylene and the substitution position of the substituent.

[Chemical Formula III-1]

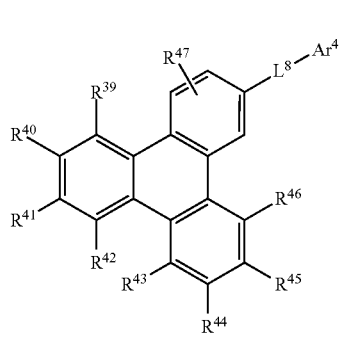

[Chemical Formula III-2]

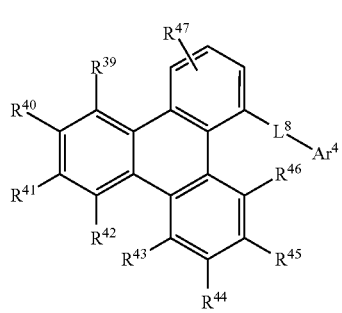

In Chemical Formula III-1 and Chemical Formula III-2, $R^{39}$ to $R^{47}$, $L^8$ and $Ar^4$ are defined the same as those described above.

In an implementation, $L^8$ in Chemical Formula III may be, e.g., a substituted or unsubstituted phenylene group.

In an implementation, when $L^8$ is substituted, the substituent may be, e.g., a phenyl group.

In an implementation, $L^8$ may be, e.g., a linking group of Group I below.

[Group I]

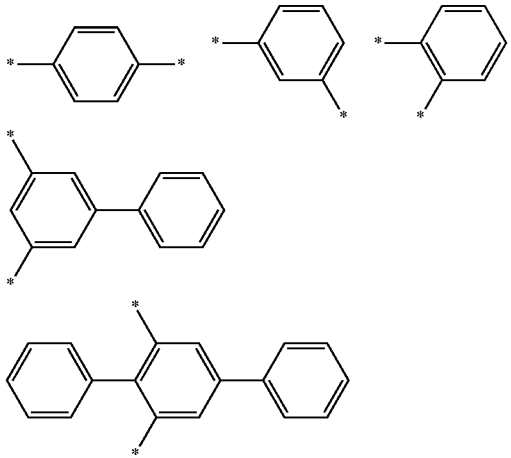

In Group I, * is a linking point.

In an implementation, $Ar^4$ in Chemical Formula III may be, e.g., a substituted or unsubstituted naphthyl group, a substituted or unsubstituted anthracenyl group, a substituted or unsubstituted phenanthrenyl group, a substituted or unsubstituted triphenylene group or a substituted or unsubstituted perylenyl group.

In an implementation, when $Ar^4$ is substituted, the substituent may be, e.g., a phenyl group.

In an implementation, $Ar^4$ may be, e.g., a group of Group II.

[Group II]

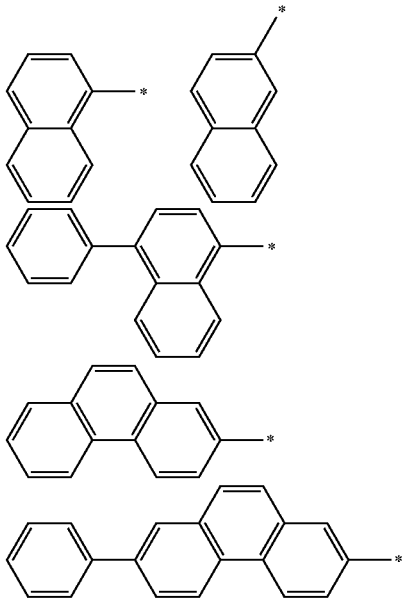

-continued

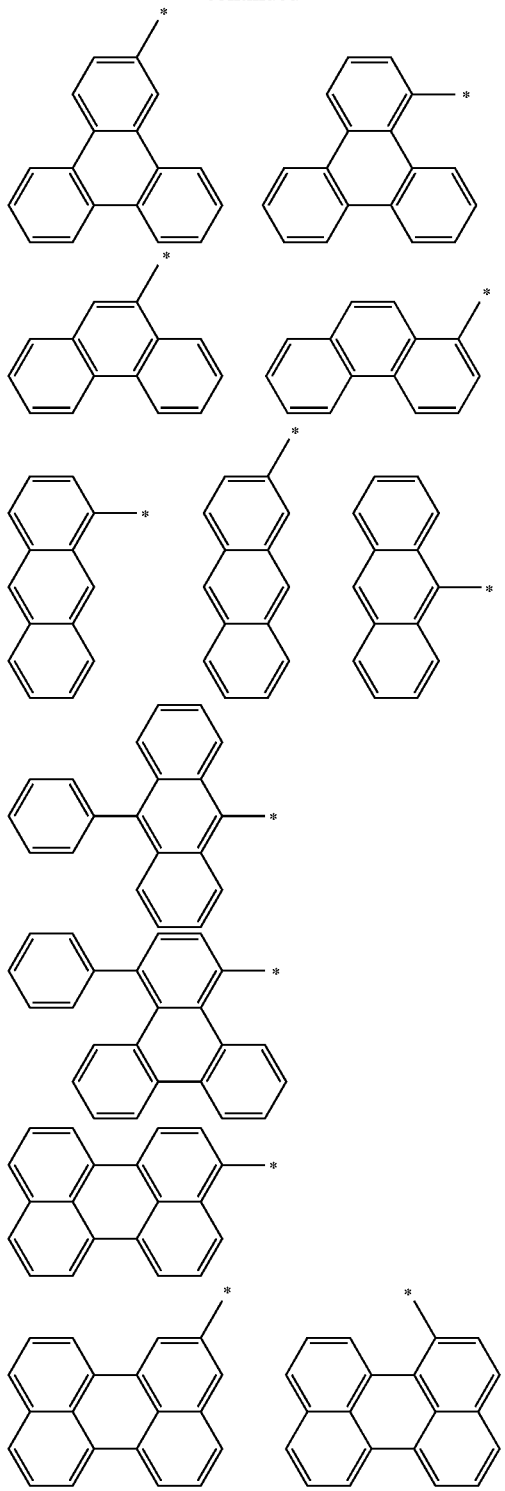

In an implementation, the third compound may be represented by Chemical Formula III-1.

In Chemical Formula III-1, $R^{39}$ to $R^{47}$ may each be hydrogen, $L^8$ may be, e.g., a substituted or unsubstituted meta-phenylene group, and $Ar^4$ may be, e.g., a substituted or unsubstituted naphthyl group, a substituted or unsubstituted phenanthrenyl group, or a substituted or unsubstituted triphenylene group.

In an implementation, the third compound may be, e.g., a compound of Group 3.

[Group 3]

[3-1]

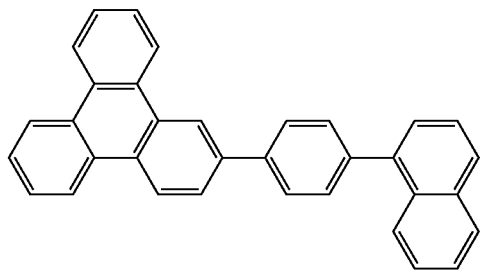

[3-2]

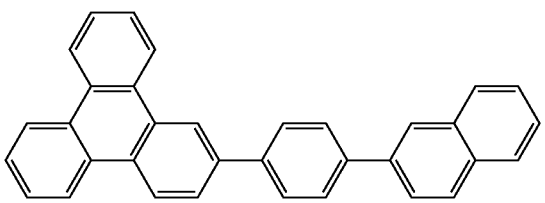

[3-3]

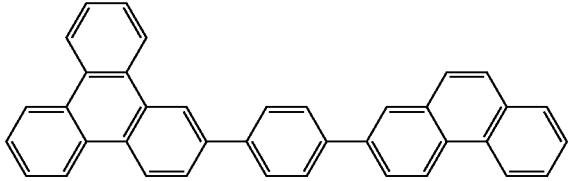

[3-4]

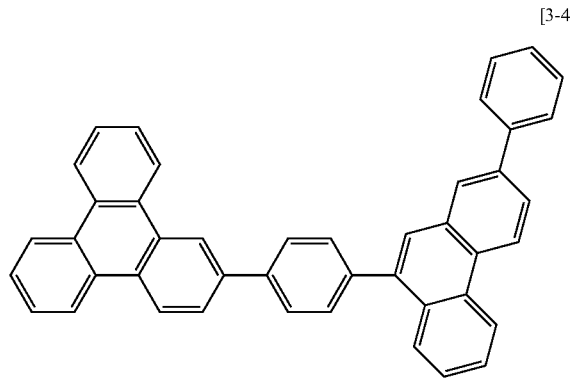

[3-5]

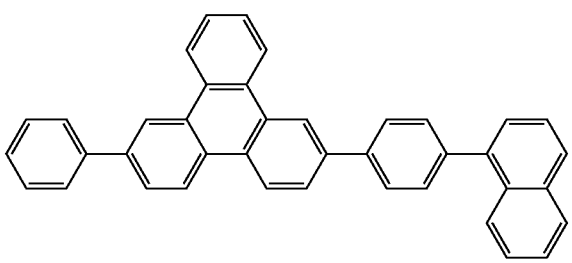

[3-6]
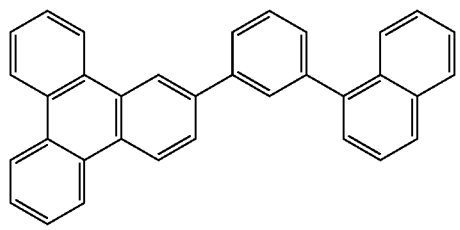
[3-10]
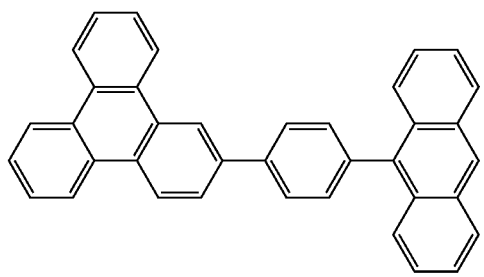
[3-7]
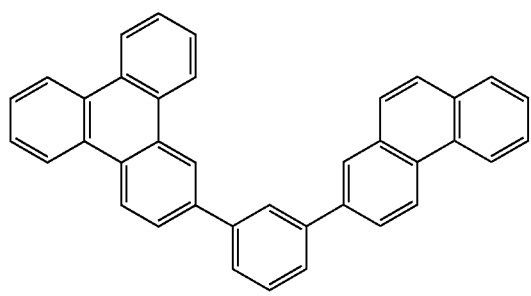
[3-11]
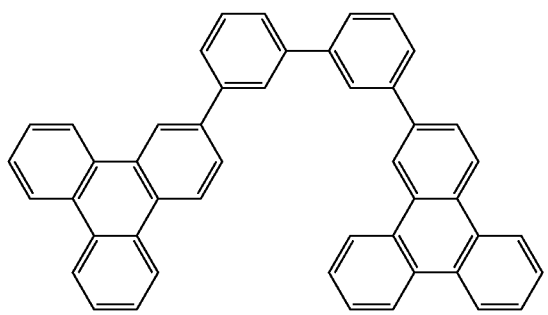
[3-8]
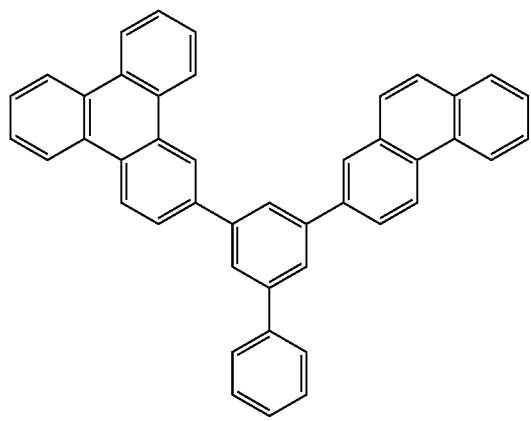
[3-12]
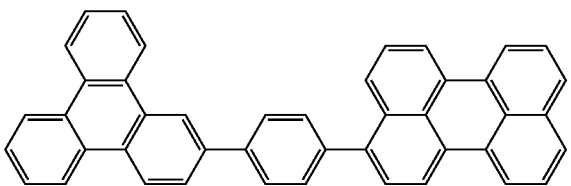
[3-13]
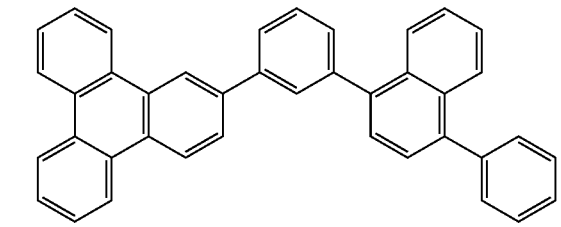
[3-14]
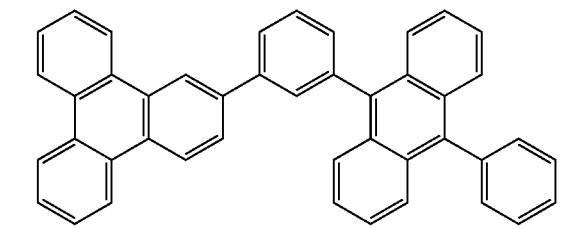
[3-9]
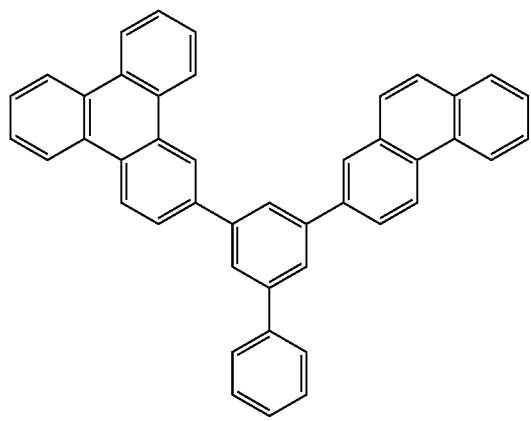
[3-15]
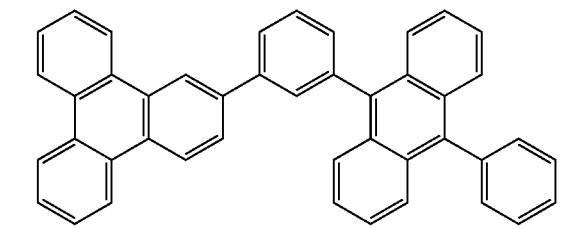

[3-16]

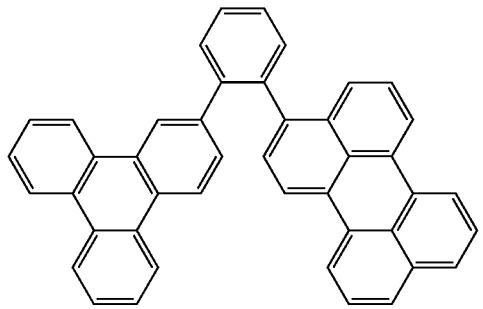

In an implementation, the first compound may include a nitrogen-containing 6-membered ring having high electron transport characteristics, and electrons may be stably and effectively transported to lower a driving voltage, to increase current efficiency, and to implement long life-span characteristics of a device.

In an implementation, the second compound may have a structure including carbazole having high HOMO energy, and may effectively inject and transport holes, thereby contributing to improvement of device characteristics.

In an implementation, the third compound may have a wide HOMO-LUMO band gap, thereby controlling the movement rate of holes and electrons of the first compound and the second compound, and hole trapping and exciton quenching may be prevented through relative movement of the light emitting layer region, which contributes to the improvement of the life-span characteristics of the device.

The three-host composition including the first compound, the second compound, and the third compound may achieve an optimum balance by more finely adjusting electron/hole characteristics in the device stack, compared with other compositions, and may help improve device characteristics greatly due to an appropriate balance of charges, compared with, e.g., a two-host composition such as a composition including the first compound and the second compound or a composition including the first compound and the third compound.

In an implementation, the first compound may be represented by the aforementioned Chemical Formula I-A-1 or Chemical Formula I-A-4, the second compound may be represented by the aforementioned Chemical Formula IIA-1, or Chemical Formula IIA-2, and the third compound may be represented by the aforementioned Chemical Formula III-1.

In an implementation, in Chemical Formula I-A-1 and Chemical Formula I-A-4, $Z^1$ to $Z^3$ may each be N, $L^1$ to $L^3$ may each independently be, e.g., a single bond or a substituted or unsubstituted phenylene group, and $R^1$ and $R^2$ may each independently be, e.g., a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group.

In an implementation, in Chemical Formula IIA-1 and Chemical Formula IIA-2, $R^{23}$ to $R^{32}$ may each be hydrogen, $L^4$ and $L^6$ may each independently be, e.g., a single bond or a substituted or unsubstituted phenylene group, and $Ar^1$ and $Ar^2$ may each independently be, e.g., a substituted or unsubstituted phenyl group or a substituted or unsubstituted biphenyl group.

In an implementation, in Chemical Formula III-1, $R^{39}$ to $R^{47}$ may each be hydrogen, $L^8$ may be, e.g., a substituted or unsubstituted meta-phenylene group, and $Ar^4$ may be, e.g., a substituted or unsubstituted naphthyl group, a substituted or unsubstituted phenanthrenyl group, or a substituted or unsubstituted triphenylene group.

In an implementation, the first compound may be represented by Chemical Formula I-A-1 or Chemical Formula I-A-4, the second compound may be represented by Chemical Formula IIF, and the third compound may be represented by Chemical Formula III-1.

In an implementation, the definitions of each substituent in Chemical Formula I-A-1, Chemical Formula I-A-4, and Chemical Formula III-1 may be the same as described above, and In an implementation, in Chemical Formula IIF, $R^{23}$ to $R^{26}$ and $R^{33}$ to $R^{38}$ may each be hydrogen, $L^4$ and $L^7$ may each independently be, e.g., a single bond or a substituted or unsubstituted phenylene group, and $Ar^1$ and $Ar^3$ may each independently be, e.g., a substituted or unsubstituted phenyl group or a substituted or unsubstituted biphenyl group.

In an implementation, in the composition for an organic optoelectronic device, the first compound may be included in an amount of about 20 wt % to about 50 wt %, the second compound may be included in an amount of about 40 wt % to about 60 wt %, and the third compound may be included in an amount of about 5 wt % to about 25 wt %, all wt % being based on a total weight of the first compound, the second compound, and the third compound. In an implementation, the first compound, the second compound, and the third compound may each be included in the composition in different amounts.

In an implementation, the first compound may be included in an amount of about 25 wt % to about 45 wt %, the second compound may be included in an amount of about 45 wt % to about 60 wt %, and the third compound may be included in an amount of about 5 wt % to about 20 wt %, based on the total weight of the first compound, the second compound, and the third compound.

In an implementation, the first compound may be included in an amount of about 30 wt % to about 40 wt %, the second compound may be included in an amount of about 50 wt % to about 55 wt %, and the third compound may be included in an amount of about 10 wt % to about 20 wt %, based on the total weight of the first compound, the second compound, and the third compound.

In an implementation, the composition for an organic optoelectronic device may include the first compound: the second compound: the third compound in a weight ratio of about 35:55:10, or about 40:50:10. Within the above ranges, the electron transport capability of the first compound, the hole transport capability of the second compound, and the buffering capability of the third compound are properly balanced, thereby improving the efficiency and life-span of the device.

The composition for an organic optoelectronic device may further include one or more compounds in addition to the aforementioned first compound, second compound, and third compound.

The composition for an organic optoelectronic device may further include a dopant. The dopant may be, e.g., a phosphorescent dopant, such as a red, green or blue phosphorescent dopant, and may be, e.g., a green phosphorescent dopant.

The dopant may be a material mixed with the composition including the first compound, the second compound, and the third compound in a small amount to facilitate light emission and may be a material such as a metal complex that emits light by multiple excitation into a triplet or more. The dopant may be, e.g., an inorganic, organic, or organic-inorganic compound, and one or more types thereof may be used.

Examples of the dopant may be a phosphorescent dopant and examples of the phosphorescent dopant may be an organometal compound including Ir, Pt, Os, Ti, Zr, Hf, Eu, Tb, Tm, Fe, Co, Ni, Ru, Rh, Pd, or a combination thereof. The phosphorescent dopant may be, e.g., a compound represented by Chemical Formula Z.

$$L^A M X^A \quad \text{[Chemical Formula Z]}$$

In Chemical Formula Z, M may be a metal, $L^A$ and $X^A$ are the same or different and may be ligands forming a complex compound with M.

The M may be, e.g., Ir, Pt, Os, Ti, Zr, Hf, Eu, Tb, Tm, Fe, Co, Ni, Ru, Rh, Pd, or a combination thereof and $L^A$ and $X^A$ may be, e.g., bidentate ligands.

The ligands represented by $L^A$ and $X^A$ may include ligands of Group D.

[Group D]

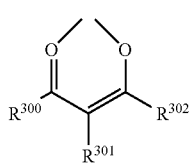
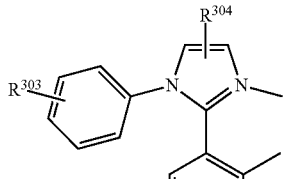
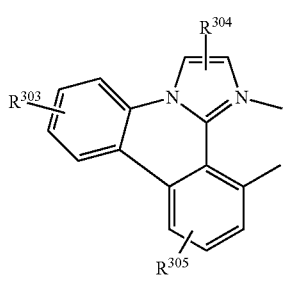
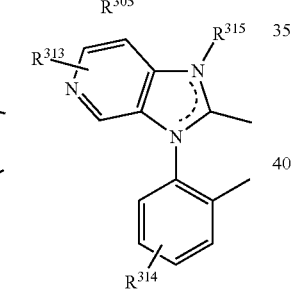
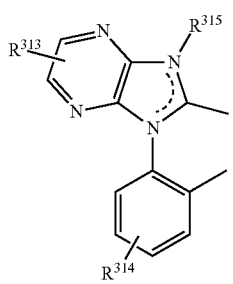
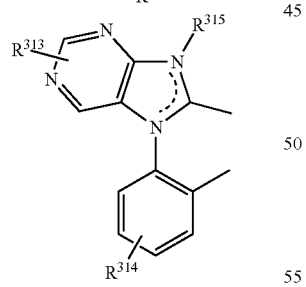
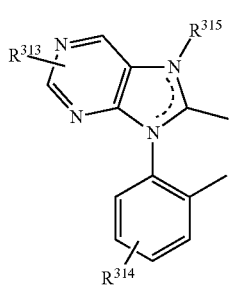
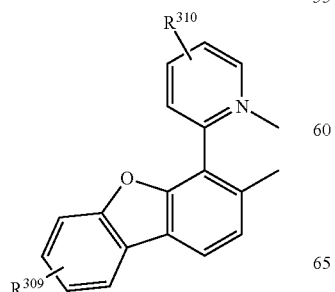

-continued

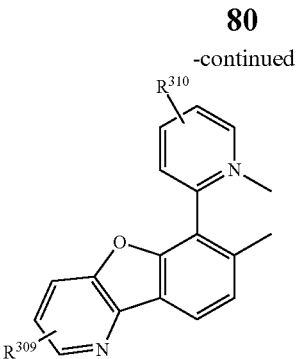
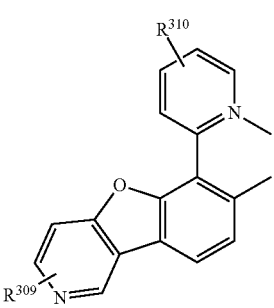
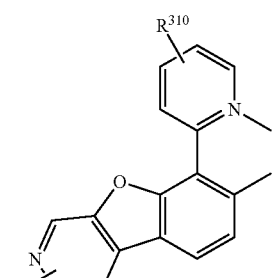
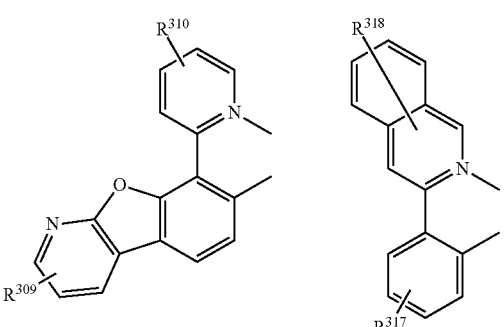
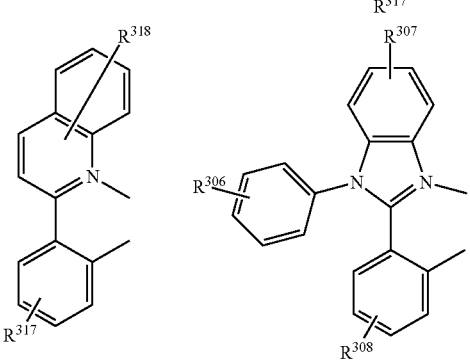

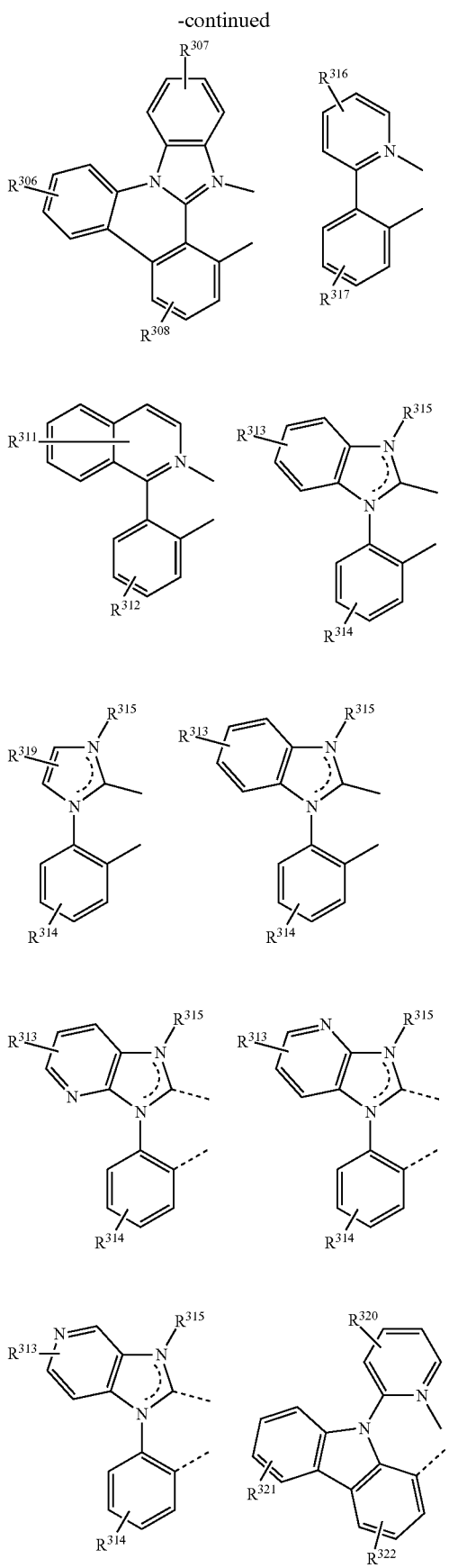

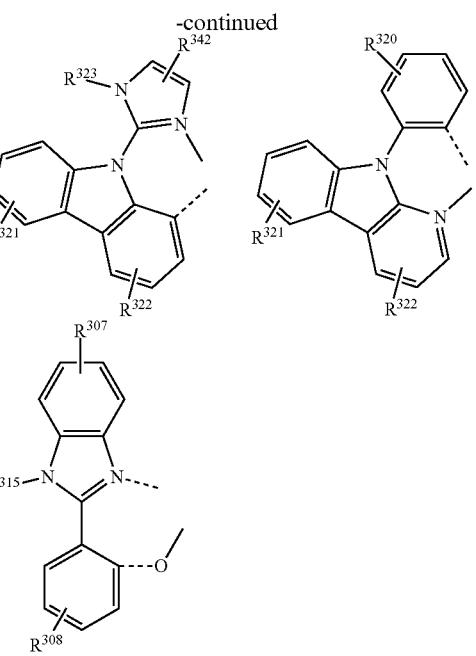

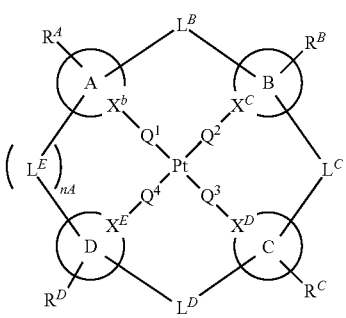

In Group D, $R^{300}$ to $R^{302}$ may each independently be, e.g., hydrogen, deuterium, a C1 to C30 alkyl group that is substituted or unsubstituted with a halogen, a C6 to C30 aryl group that is substituted or unsubstituted with a C1 to C30 alkyl, or a halogen.

$R^{303}$ to $R^{324}$ may each independently be, hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, a substituted or unsubstituted C6 to C30 arylamino group, $SF_5$, a trialkylsilyl group having a substituted or unsubstituted C1 to C30 alkyl group, a dialkylarylsilyl group having a substituted or unsubstituted C1 to C30 alkyl group and C6 to C30 aryl group, or a triarylsilyl group having a substituted or unsubstituted C6 to C30 aryl group.

In an implementation, a dopant represented by Chemical Formula Z-1 may be included.

[Chemical Formula Z-1]

In Chemical Formula Z-1, rings A, B, C, and D may each independently represent a 5-membered or 6-membered carbocyclic or heterocyclic ring;

$R^A$, $R^B$, $R^C$, and $R^D$ may each independently represent mono-, di-, tri-, or tetra-substitution, or unsubstitution;

$L^B$, $L^C$, and $L^D$ may each independent be a direct bond, BR, NR, PR, O, S, Se, C=O, S=O, SO$_2$, CRR', SiRR', GeRR', or a combination thereof;

when nA is 1, $L^E$ may be a direct bond, BR, NR, PR, O, S, Se, CO=O, S=O, SO$_2$, CRR', SiRR', GeRR', or a combination thereof; when nA is 0, $L^E$ does not exist; and $R^A$, $R^B$, $R^C$, $R^D$, R, and R' may each independently be, e.g., hydrogen, deuterium, a halogen, an alkyl group, a cycloalkyl group, a heteroalkyl group, an arylalkyl group, an alkoxy group, an aryloxy group, an amino group, a silyl group, an alkenyl group, a cycloalkenyl group, a heteroalkenyl group, an alkynyl group, an aryl group, a heteroaryl group, an acyl group, a carbonyl group, a carboxylic acid group, an ester group, a nitrile group, an isonitrile group, a sulfanyl group, a sulfinyl group, a sulfonyl group, a phosphino group, or a combination thereof; any adjacent $R^A$, $R^B$, $R^C$, $R^D$, R, and R' may be optionally linked to each other to provide a ring; $X^B$, $X^C$, $X^D$, and $X^E$ may each independently be carbon or nitrogen; and $Q^1$, $Q^2$, $Q^3$, and $Q^4$ may each represent oxygen or a direct bond.

The dopant according to an embodiment may be a platinum complex, and may be, e.g., represented by Chemical Formula IV.

[Chemical Formula IV]

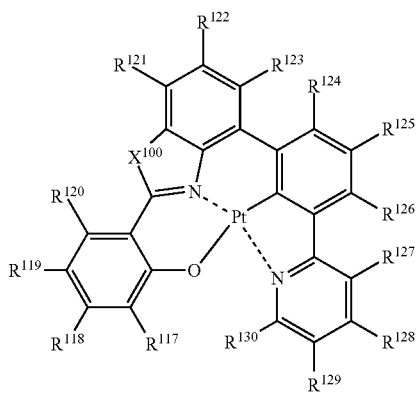

In Chemical Formula IV, $X^{100}$ may be, e.g., O, S, or N($R^{131}$).

$R^{117}$ to $R^{131}$ may each independently be, e.g., hydrogen, deuterium, a substituted or unsubstituted C1 to C10 alkyl group, a substituted or unsubstituted C6 to C20 aryl group, or —SiR$^{132}$R$^{133}$R$^{134}$, $R^{132}$ to $R^{134}$ may each independently be, e.g., a C1 to C6 alkyl group, and at least one of $R^{117}$ to $R^{131}$ may be —SiR$^{132}$R$^{133}$R$^{134}$ or a tert-butyl group.

Hereinafter, an organic optoelectronic device including the aforementioned composition for an organic optoelectronic device is described.

The organic optoelectronic device may be a suitable device to convert electrical energy into photoenergy and vice versa, e.g., an organic photoelectric device, an organic light emitting diode, an organic solar cell, or an organic photoconductor drum.

Herein, an organic light emitting diode as one example of an organic optoelectronic device is described referring to drawings.

Figure 2:
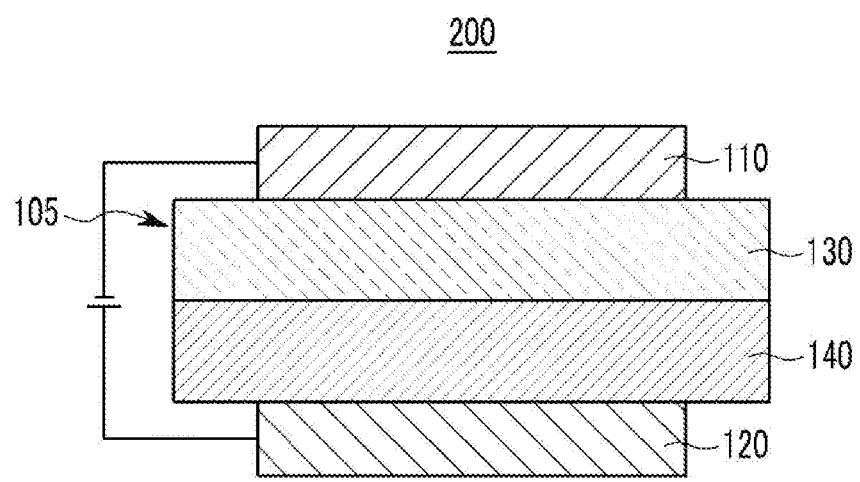

FIGS. 1 and 2 are cross-sectional views showing organic light emitting diodes according to embodiments.

Referring to FIG. 1, an organic light emitting diode 100 according to an embodiment may include an anode 120 and a cathode 110 facing each other and an organic layer 105 disposed between the anode 120 and cathode 110.

The anode 120 may be made of a conductor having a large work function to help hole injection, and may be, e.g., a metal, a metal oxide or a conductive polymer. The anode 120 may be, e.g., a metal such as nickel, platinum, vanadium, chromium, copper, zinc, gold, or the like or an alloy thereof; a metal oxide such as zinc oxide, indium oxide, indium tin oxide (ITO), indium zinc oxide (IZO), and the like; a combination of a metal and an oxide such as ZnO and Al or SnO$_2$ and Sb; a conductive polymer such as poly(3-methylthiophene), poly(3,4-(ethylene-1,2-dioxy)thiophene) (PEDOT), polypyrrole, or polyaniline.

The cathode 110 may be made of a conductor having a small work function to help electron injection, and may be, e.g., a metal, a metal oxide, or a conductive polymer. The cathode 110 may be, e.g., a metal such as magnesium, calcium, sodium, potassium, titanium, indium, yttrium, lithium, gadolinium, aluminum silver, tin, lead, cesium, barium, or the like, or an alloy thereof; or a multi-layer structure material such as LiF/Al, LiO$_2$/Al, LiF/Ca, LiF/Al, or BaF$_2$/Ca.

The organic layer 105 may include the aforementioned composition for an organic optoelectronic device.

The organic layer 105 may include, e.g., the light emitting layer 130, and the light emitting layer 130 may include, e.g., the aforementioned composition for an organic optoelectronic device.

The aforementioned composition for an organic optoelectronic device may be, e.g., a green light emitting composition.

The light emitting layer 130 may include, e.g., the aforementioned first compound, second compound, and third compound together as a phosphorescent host.

Referring to FIG. 2, an organic light emitting diode 200 may further include a hole auxiliary layer 140 in addition to the light emitting layer 130. The hole auxiliary layer 140 may help further increase hole injection or hole mobility and blocks electrons between the anode 120 and the light emitting layer 130. The hole auxiliary layer 140 may be, e.g., a hole transport layer, a hole injection layer, or an electron blocking layer, and may include at least one layer.

The hole auxiliary layer 140 may include, e.g., a compound of Group E.

In an implementation, the hole auxiliary layer 140 may include a hole transport layer between the anode 120 and the light emitting layer 130 and a hole transport auxiliary layer between the light emitting layer 130 and the hole transport layer, and a compound of Group E may be included in the hole transport auxiliary layer.

[Group E]
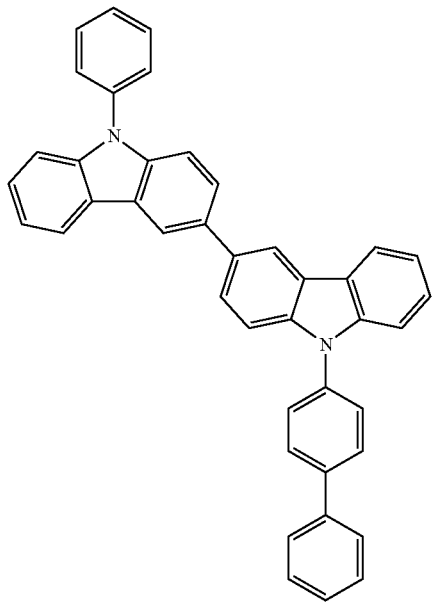 [SMILES: c1ccc(-c2ccc(-n3c4ccccc4c4cc(-c5ccc6c(c5)c5ccccc5n6-c5ccccc5)ccc43)cc2)cc1]
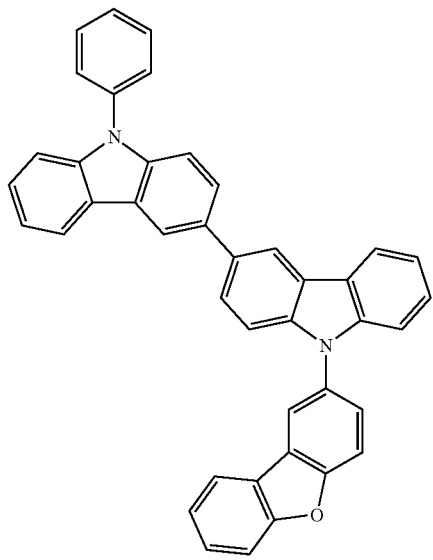
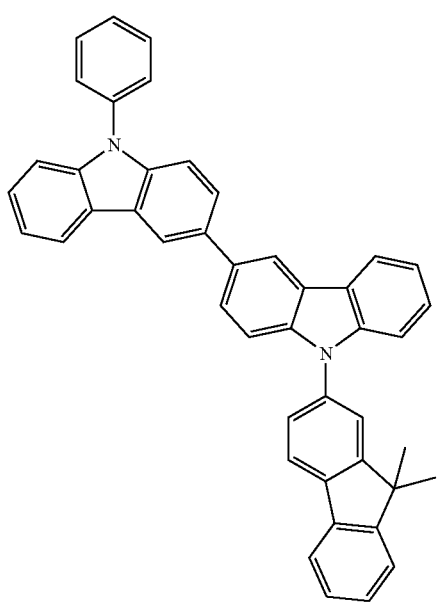
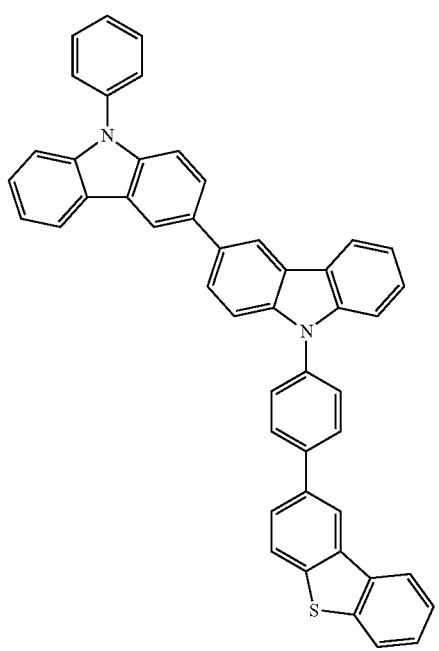

87
-continued
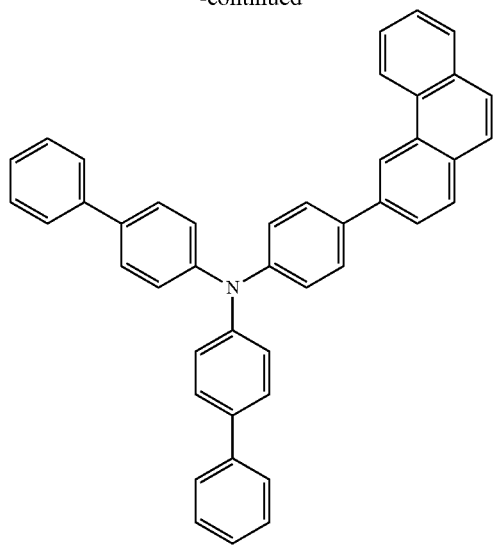
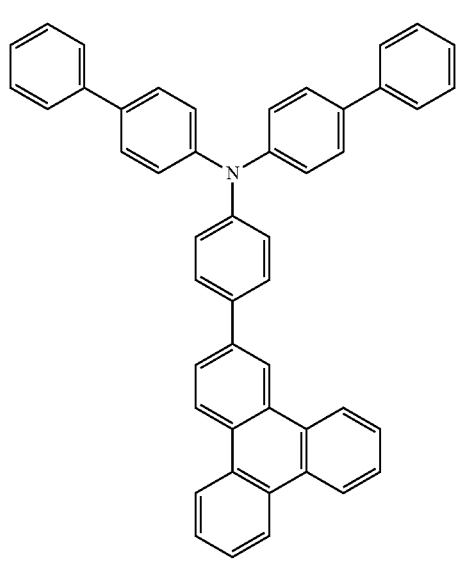
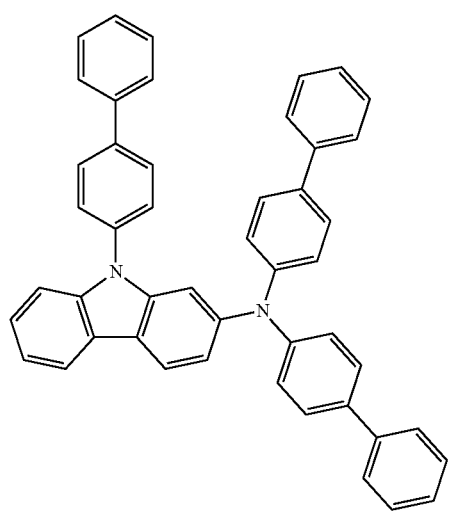
88
-continued
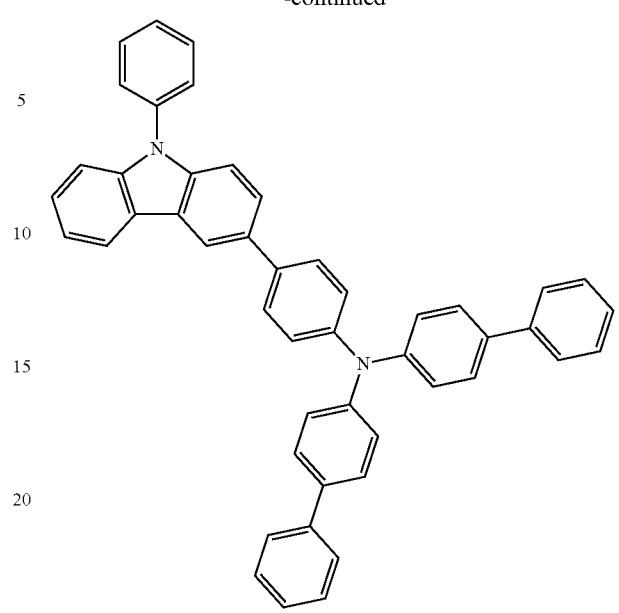
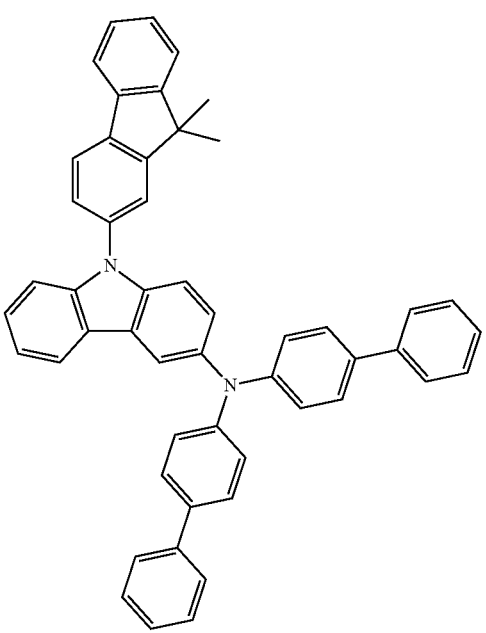

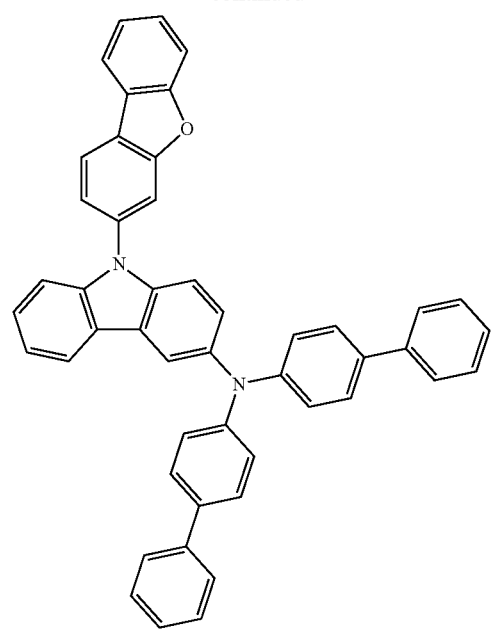
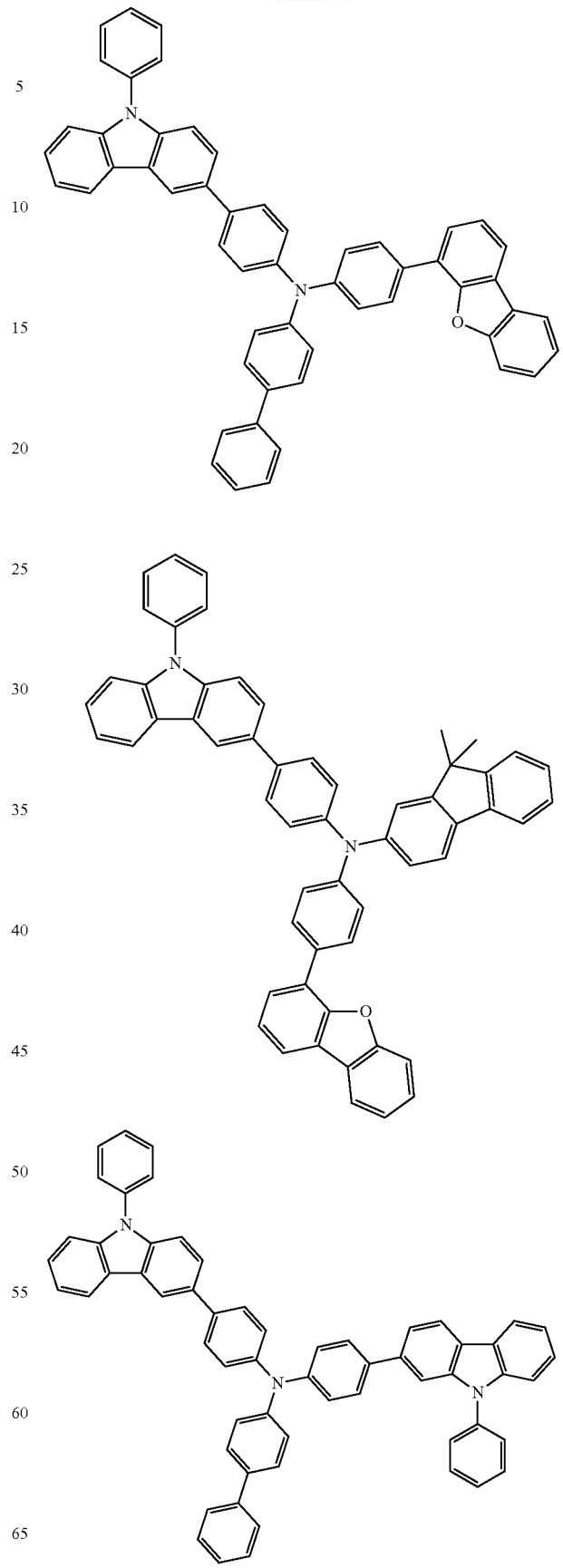

91
-continued
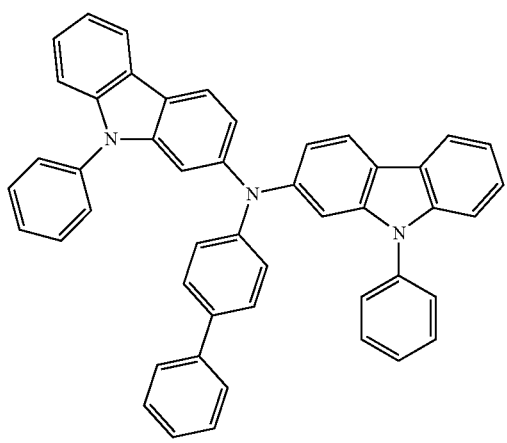
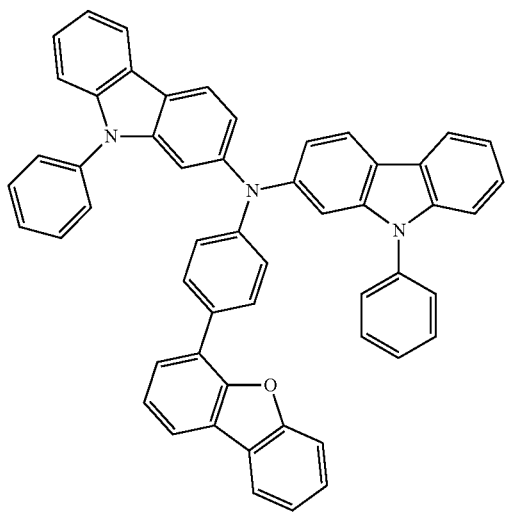
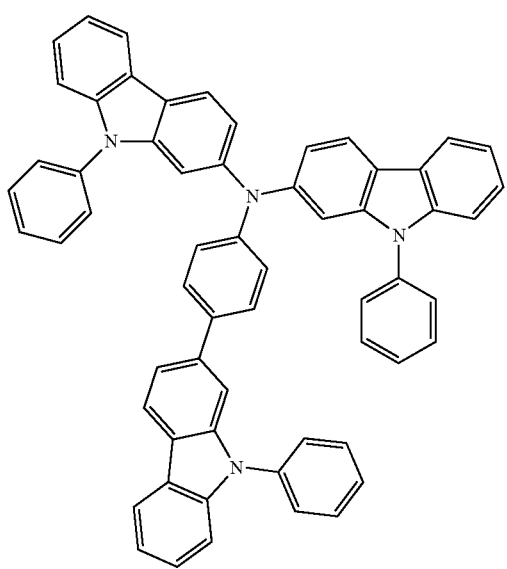
92
-continued
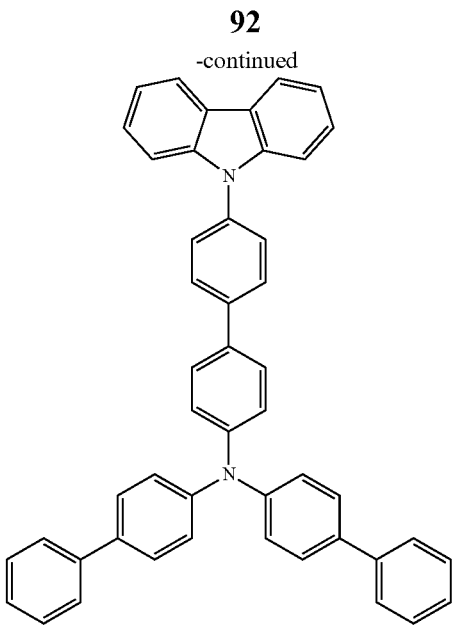
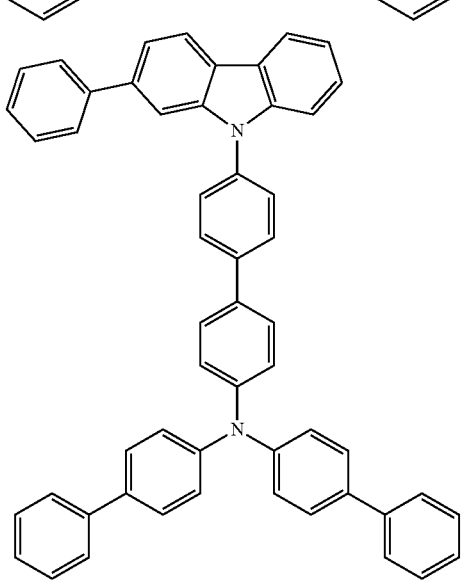
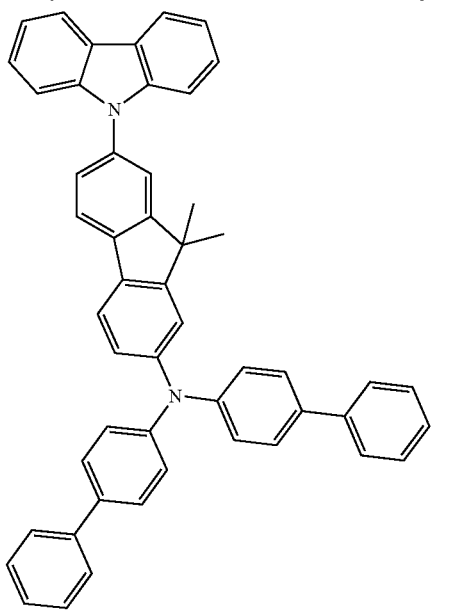

93
-continued
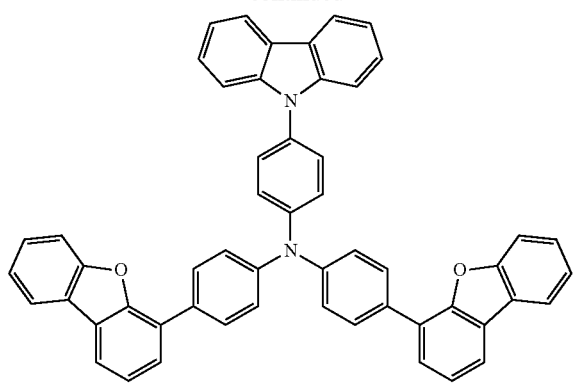
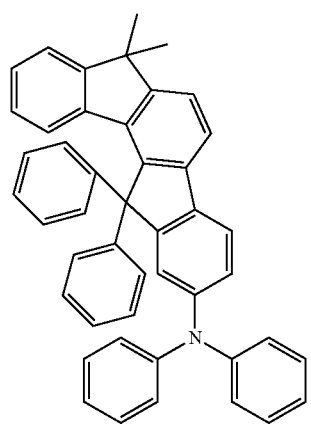
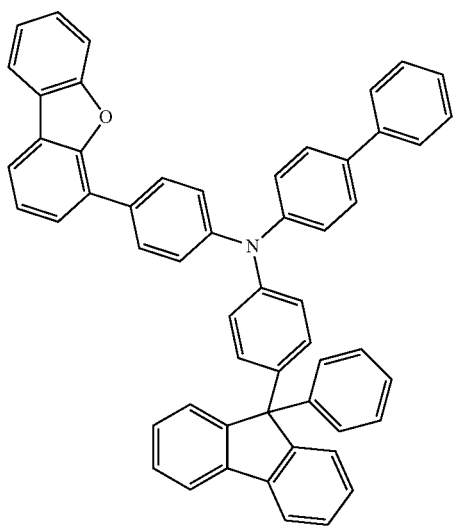
94
-continued
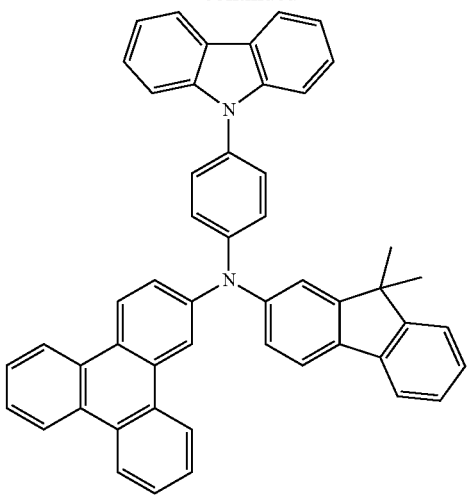
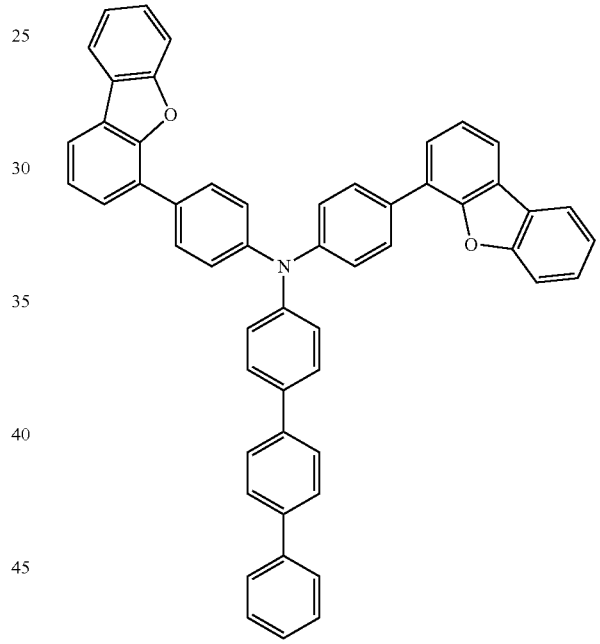
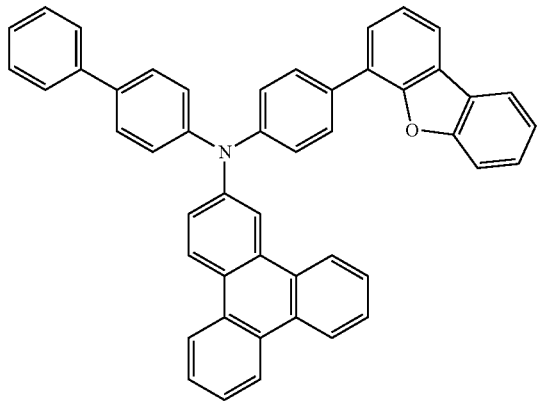

95
-continued
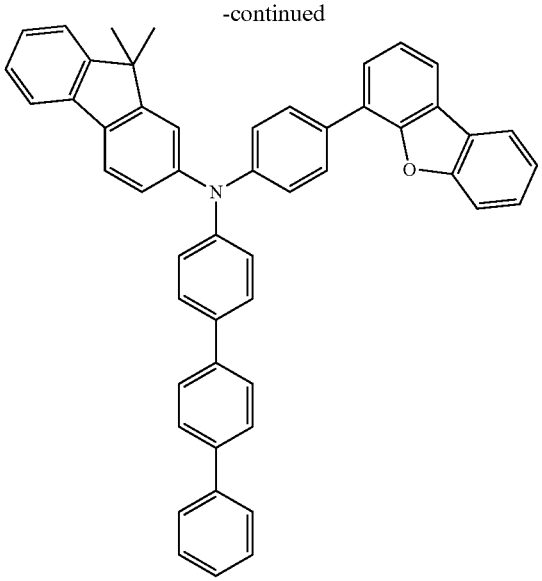
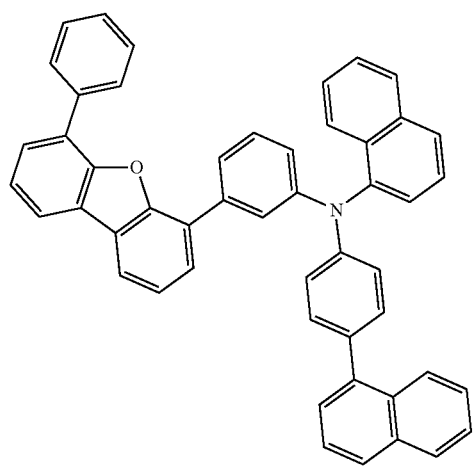
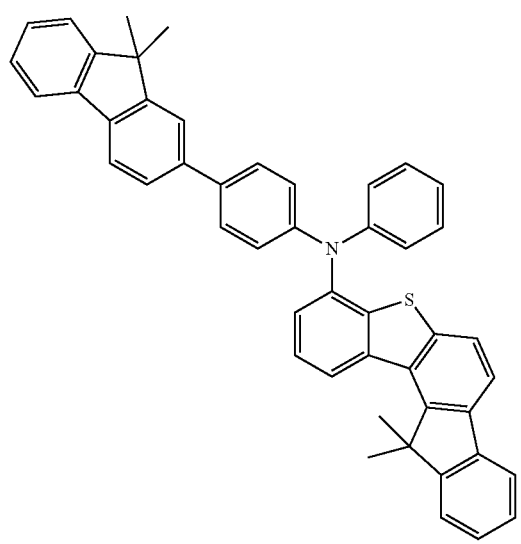
96
-continued
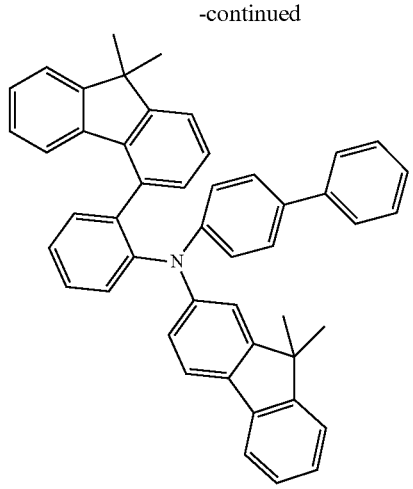
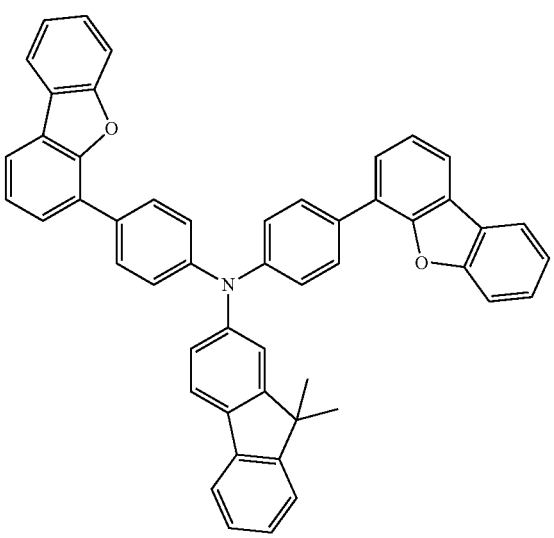
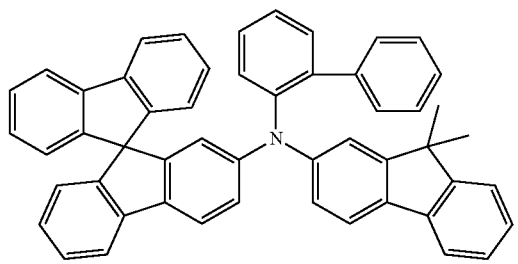

97
-continued
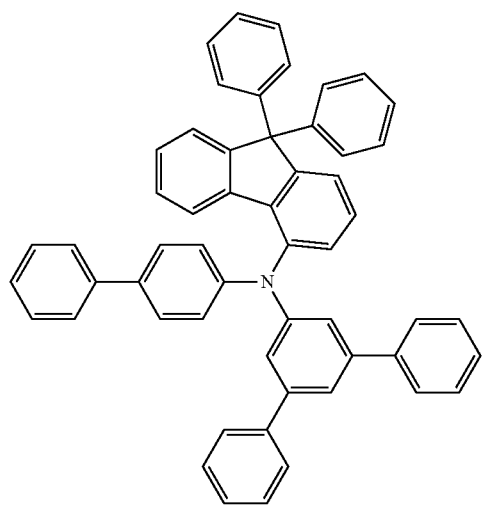
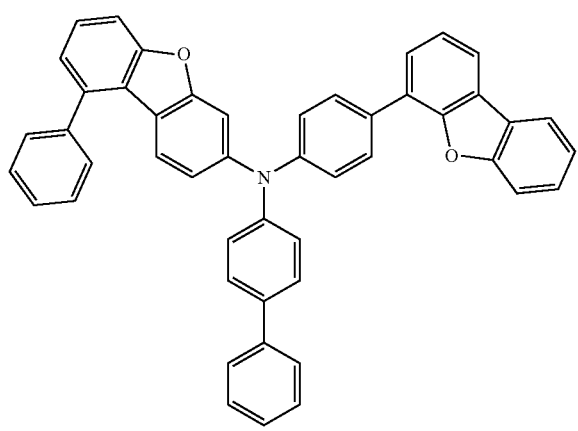
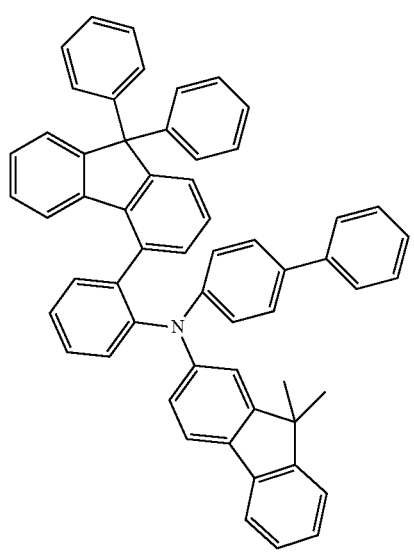
98
-continued
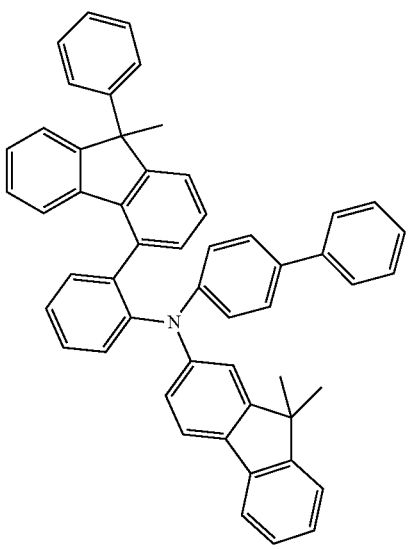
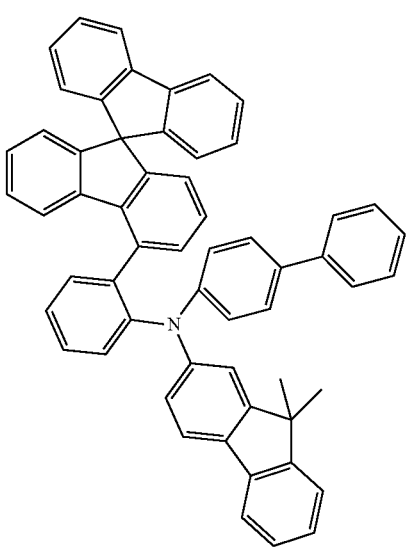
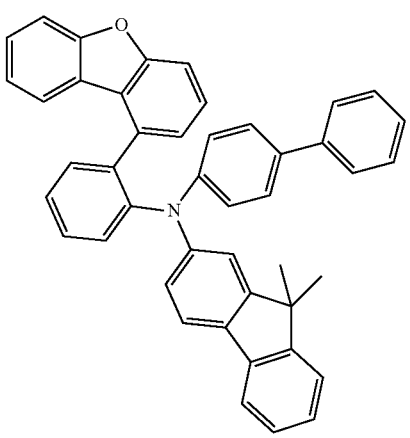

99
-continued
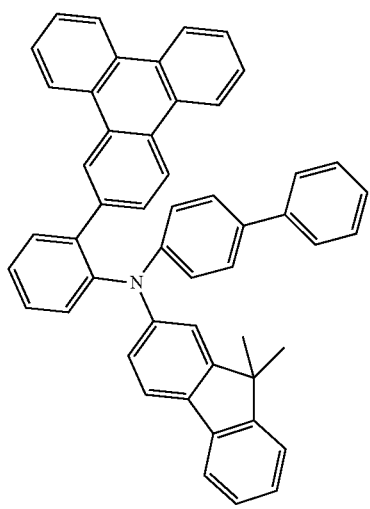
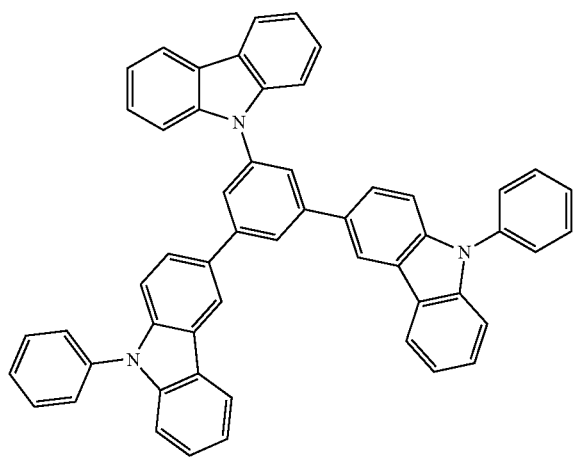
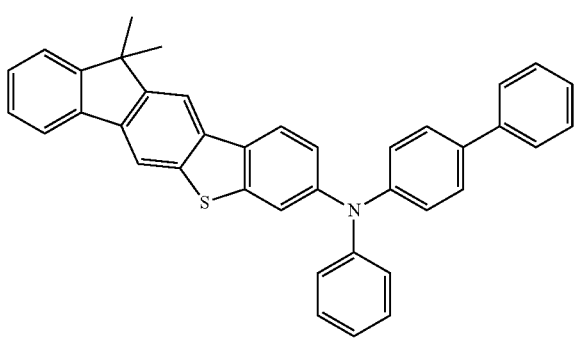
100
-continued
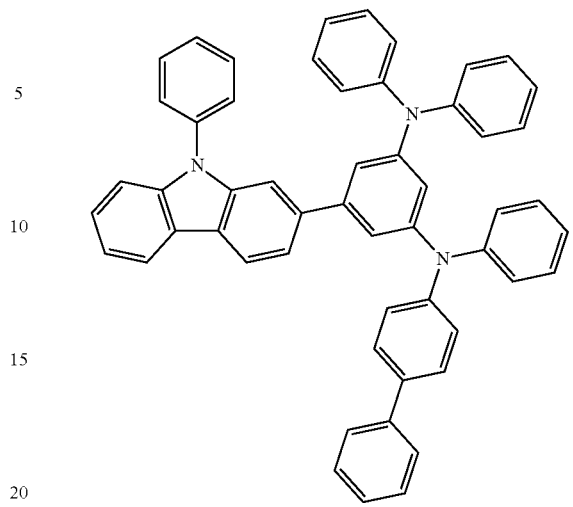
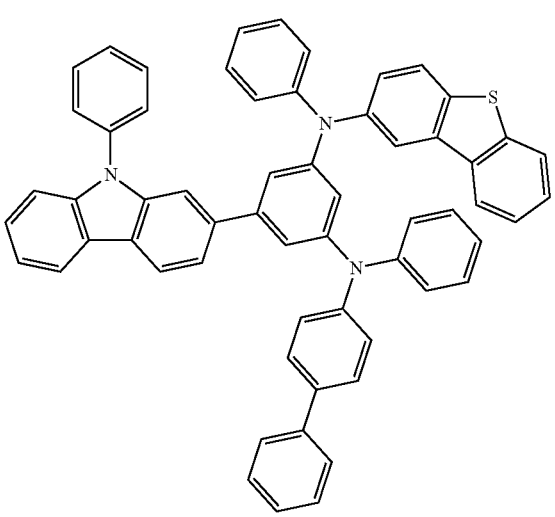
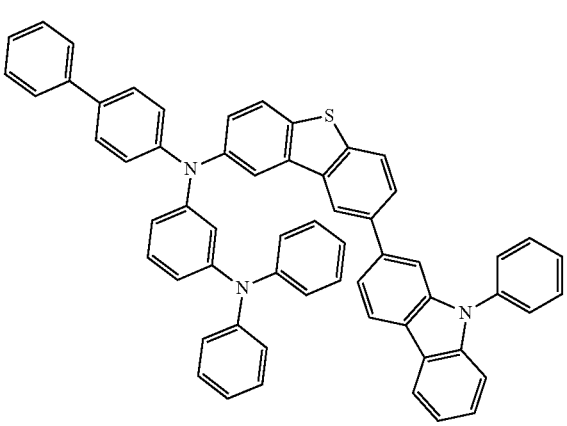

101
-continued
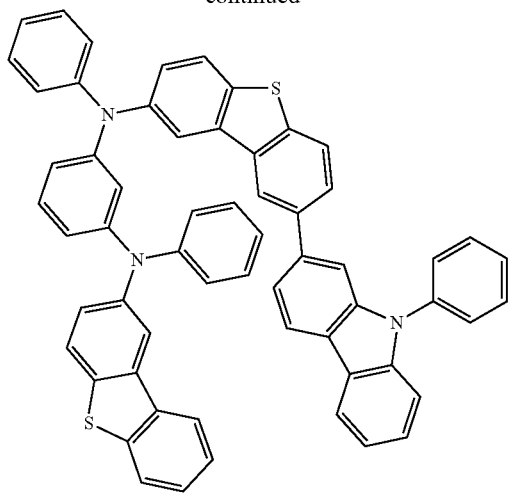
102
-continued
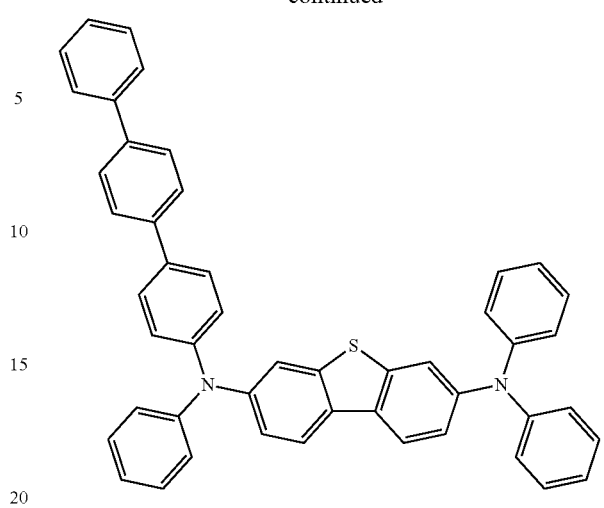
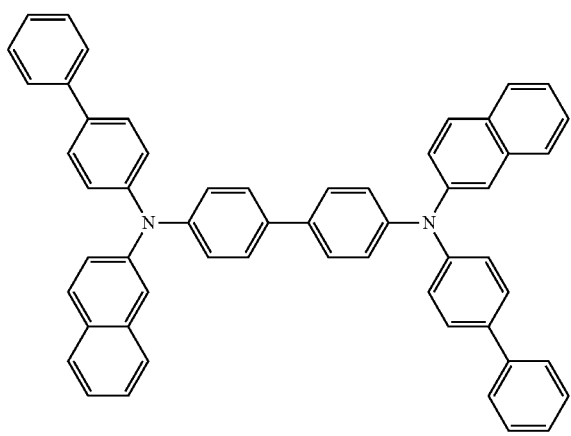
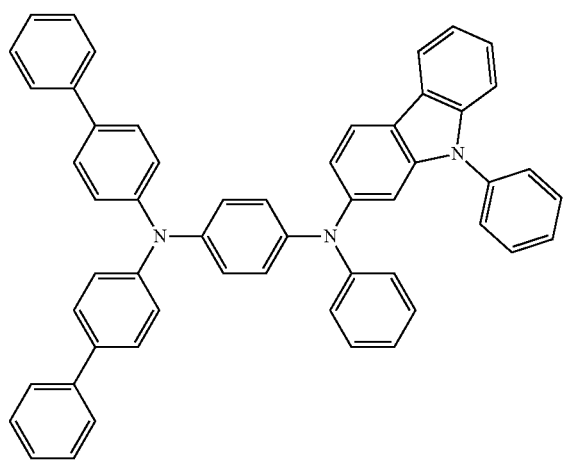
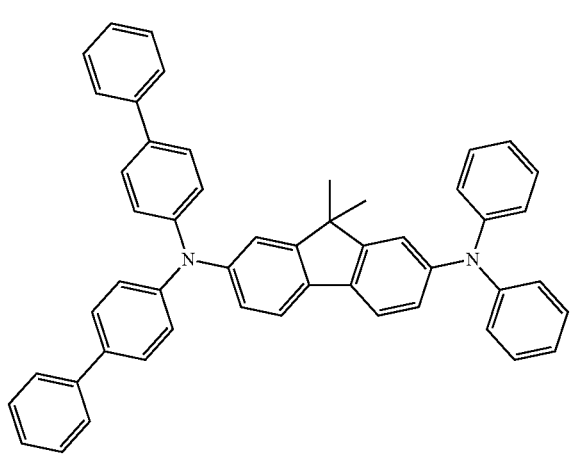
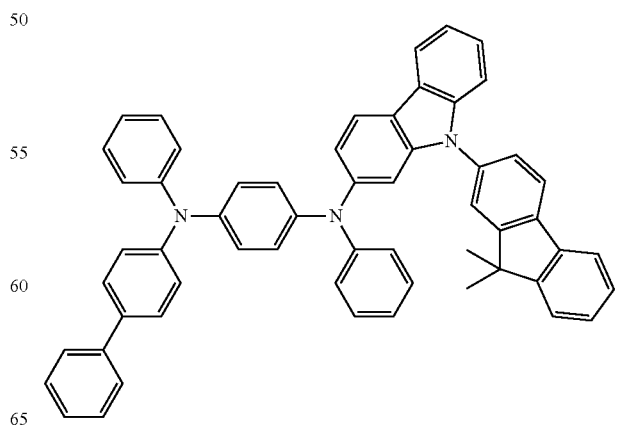

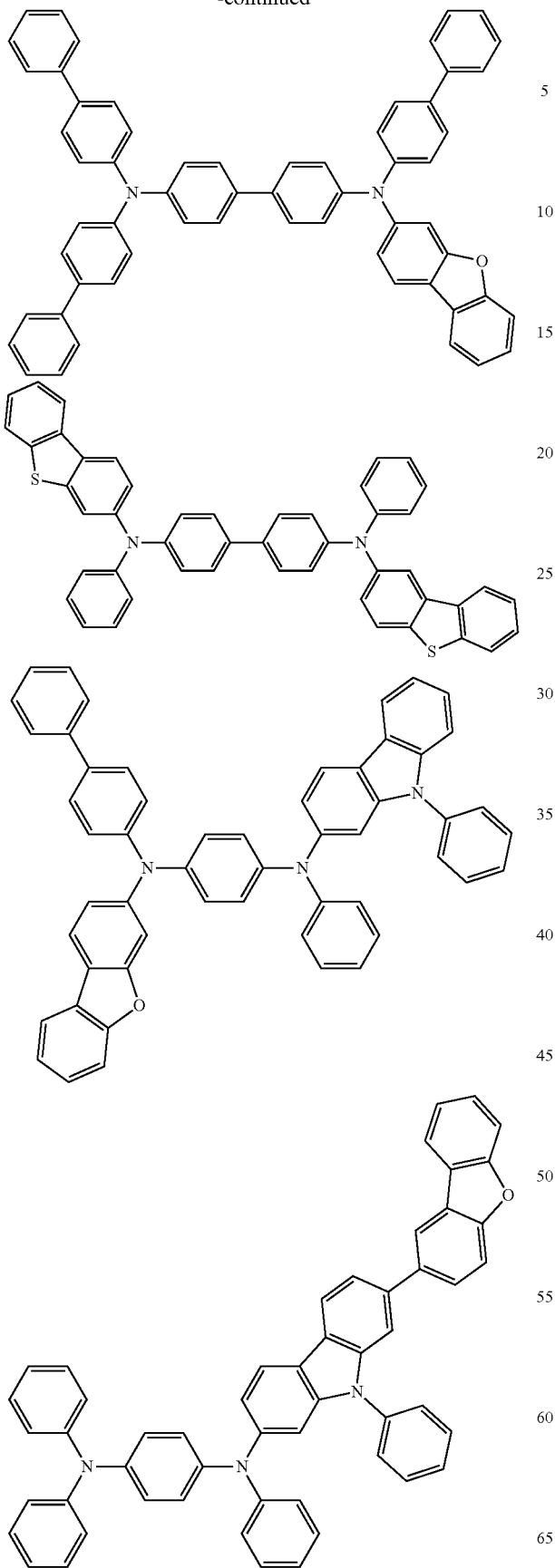
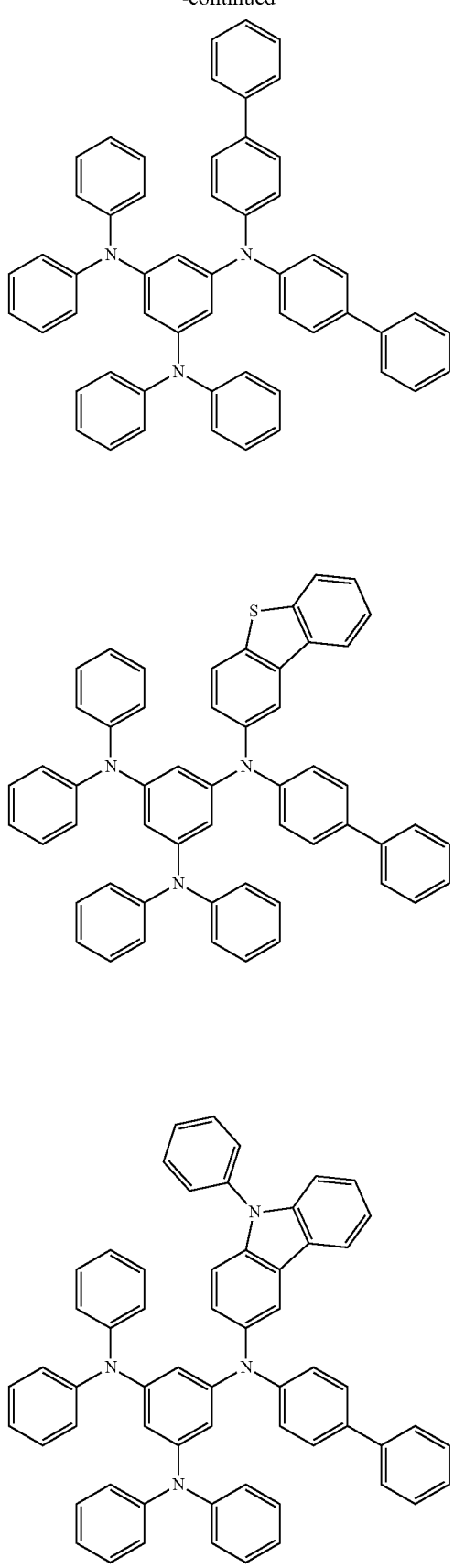

105
-continued
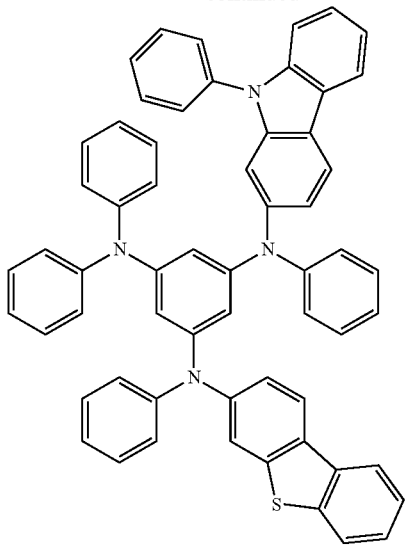
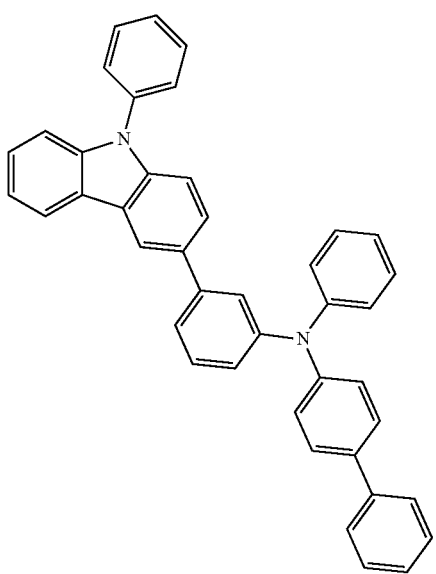
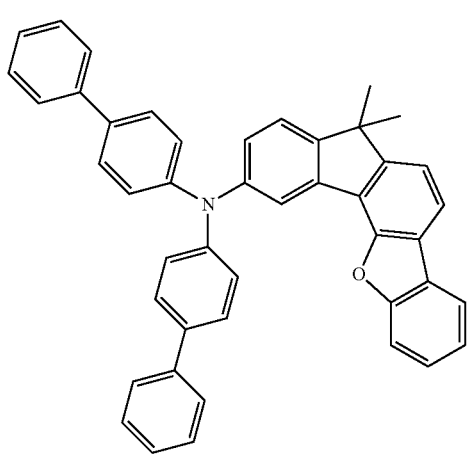
106
-continued
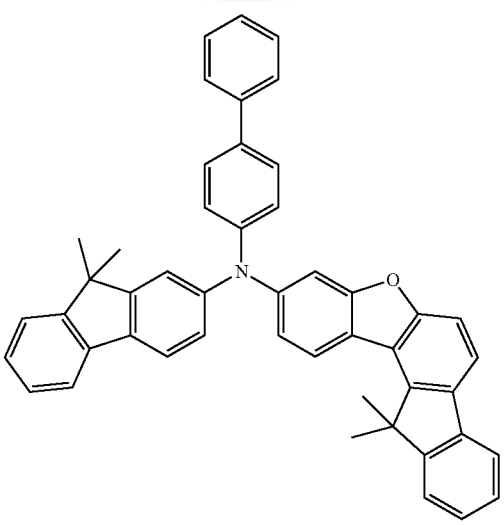
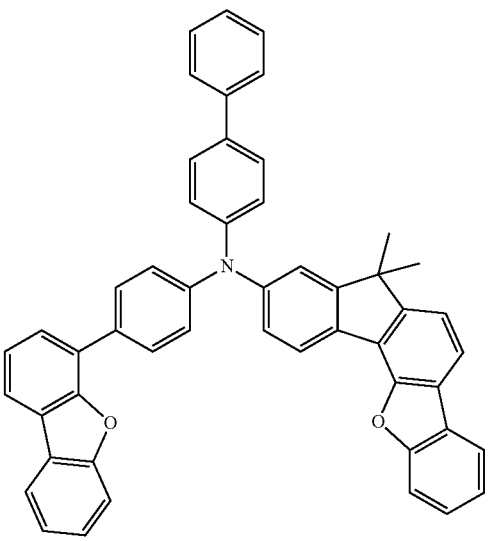
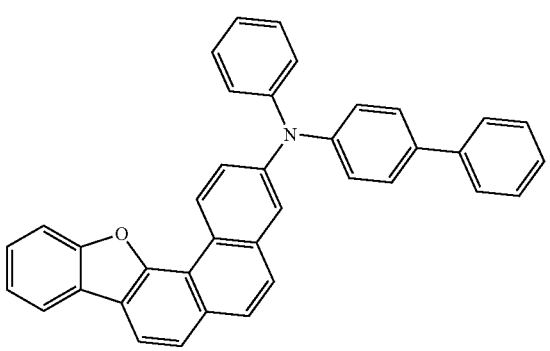

107
-continued
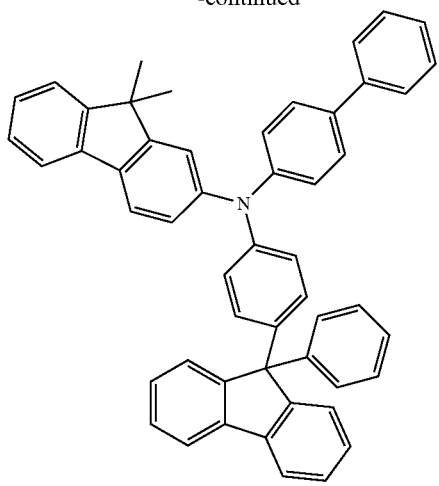
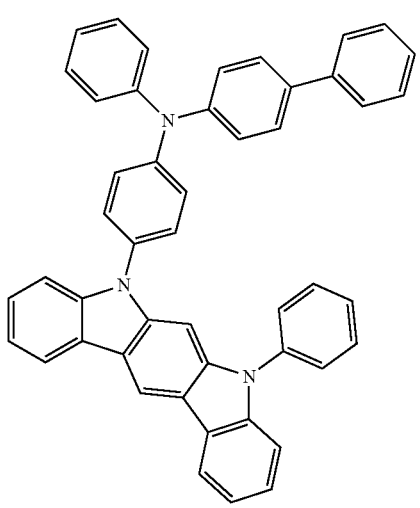
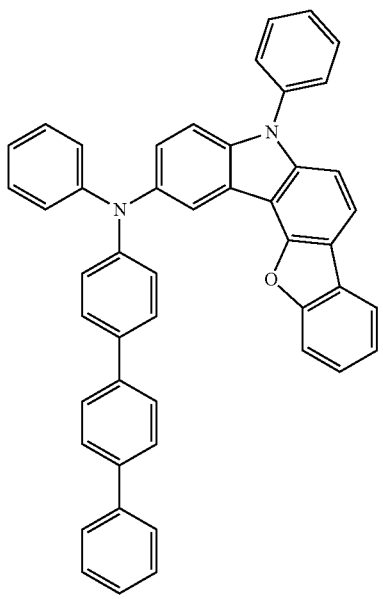
108
-continued
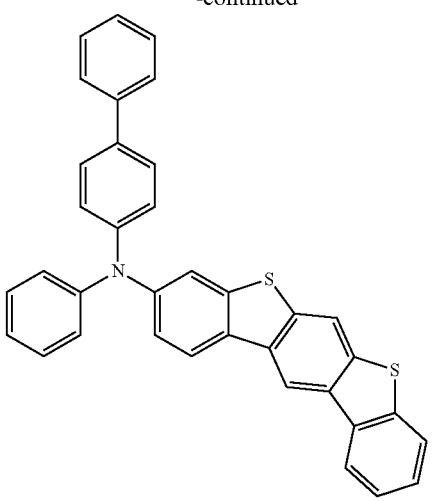
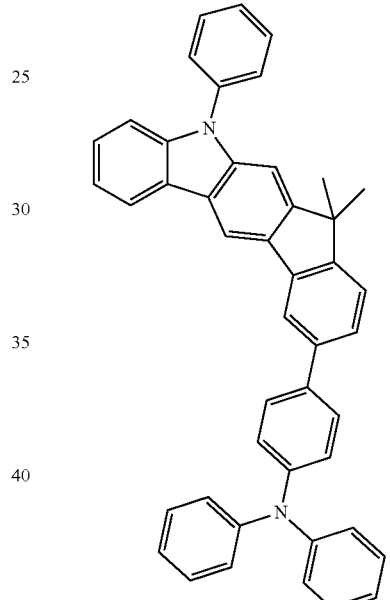
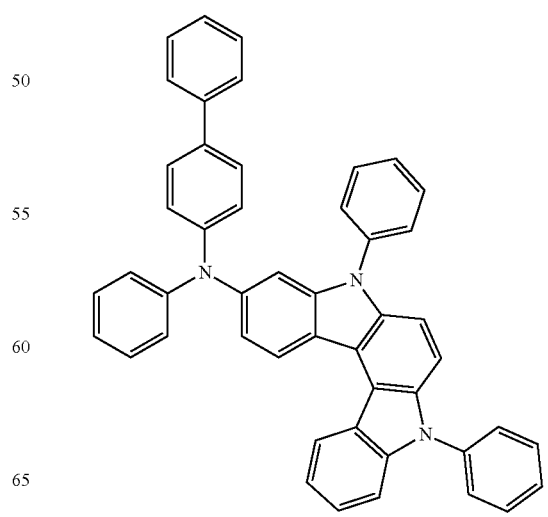

-continued

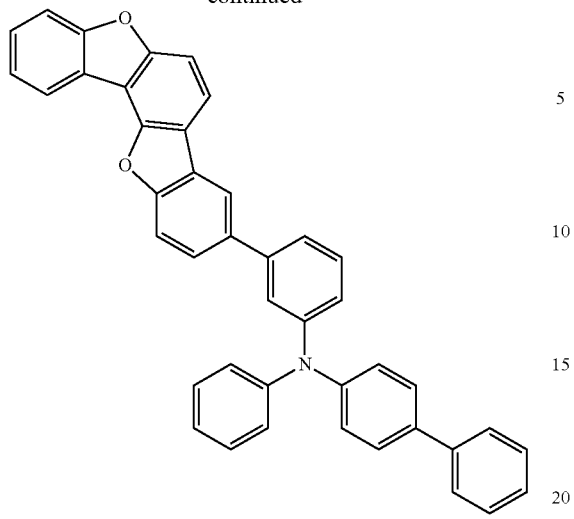

In the hole transport auxiliary layer, other suitable compounds may be used in addition to the compound.

In an implementation, an organic light emitting diode may further include an electron transport layer, an electron injection layer, or a hole injection layer as the organic layer 105.

The organic light emitting diodes 100 and 200 may be produced by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

Hereinafter, the embodiments are illustrated in more detail with reference to examples. However, these examples are exemplary, and the scope as claimed in claims is not limited thereto.

Preparation of Composition for Organic Optoelectronic Device ((Preparation of First Compound)

Synthesis Example 1: Synthesis of Intermediate Int-6

[Reaction Scheme 1]

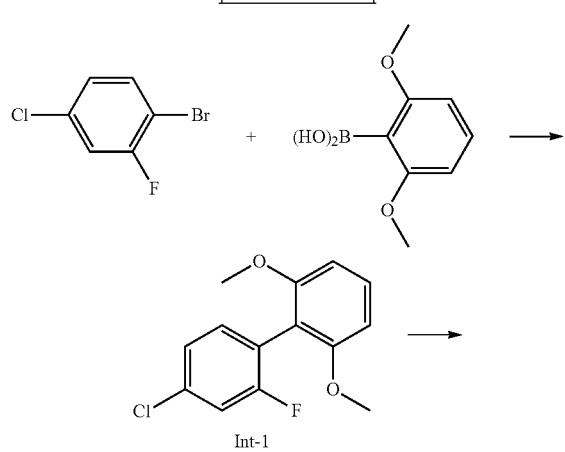

-continued

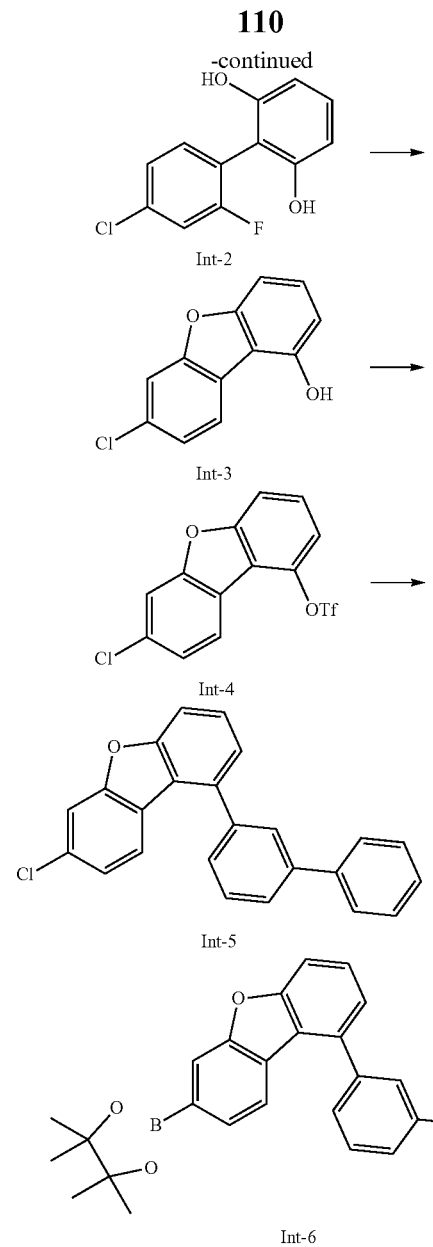

1$^{st}$ Step: Synthesis of Intermediate Int-1

61 g (291 mmol) of 1-bromo-4-chloro-2-fluorobenzene, 50.4 g (277 mmol) of 2,6-dimethoxyphenylboronic acid, 60.4 g (437 mmol) of $K_2CO_3$, and 10.1 g (8.7 mmol) of Pd(PPh$_3$)$_4$ were put in a round-bottomed flask and dissolved in 500 ml of THF and 200 ml of distilled water and then, stirred under reflux at 60° C. for 12 hours. When a reaction was completed, a product obtained therefrom after removing an aqueous layer was treated through column chromatography (Hexane:DCM (20%)) to obtain 38 g (51%) of Intermediate Int-1.

2$^{nd}$ Step: Synthesis of Intermediate Int-2

38 g (142 mmol) of Intermediate Int-1 and 165 g (1425 mmol) of pyridine hydrochloride were put in the round-bottomed flask and then, stirred under reflux at 200° C. for 24 hours. When a reaction was completed, the resultant was cooled down to ambient temperature and slowly poured into distilled water and then, stirred for 1 hour. A solid was filtered therefrom to obtain 23 g (68%) of Intermediate Int-2.

3rd Step: Synthesis of Intermediate Int-3

23 g (96 mmol) of Intermediate Int-2 and 20 g (144 mmol) of K₂CO₃ were put in a round-bottomed flask and dissolved in 100 ml of NMP and then, stirred under reflux at 180° C. for 12 hours. When a reaction was completed, the mixture was poured into an excess of distilled water. A solid was filtered therefrom, dissolved in ethylacetate (EA), and dried with MgSO₄, and an organic layer was removed under a reduced pressure. A product obtained therefrom was treated through column chromatography (Hexane:EA (30%)) to obtain 16 g (76%) of Intermediate Int-3.

4th Step: Synthesis of Intermediate Int-4

16 g (73 mmol) of Intermediate Int-3 and 12 ml (146 mmol) of pyridine were put in a round-bottomed flask and dissolved in 200 ml of DCM. After decreasing the temperature down to 0° C., 14.7 ml (88 mmol) of trifluoromethanesulfonic anhydride was slowly added thereto in a dropwise fashion. The obtained mixture was stirred for 6 hours, and when a reaction was completed, an excess of distilled water was added thereto and then, stirred for 30 minutes, and extracted with DCM. After removing an organic solvent therefrom under a reduced pressure, the residue was vacuum-dried to obtain 22.5 g (88%) of Intermediate Int-4.

5th Step: Synthesis of Intermediate Int-5

25 g (71.3 mmol) of Intermediate Int-4, 16.2 g (81.8 mmol) of 3-biphenylboronic acid, 14.8 g (106.9 mmol) of K₂CO₃, and 4.1 g (3.6 mmol) of Pd(PPh₃)₄ were used in the same method as the 1st step to synthesize 21 g (83%) of Intermediate Int-5.

6th Step: Synthesis of Intermediate Int-6

21 g (59.2 mmol) of Intermediate Int-5, 19.5 g (76.9 mmol) of bis(pinacolato)diboron, 2.4 g (2.9 mmol) of Pd(dppf)Cl₂, 3.3 g (11.8 mmol) of tricyclohexylphosphine, and 11.6 g (118.4 mmol) of potassium acetate were put in a round bottomed flask and dissolved in 320 ml of DMF. The solution was stirred under reflux at 120° C. for 10 hours. When a reaction was completed, the mixture was poured into an excess of distilled water and then, stirred for 1 hour. A solid was filtered therefrom and dissolved in DCM. MgSO₄ was used to remove moisture therefrom, and an organic solvent was filtered by using a silica gel pad and removed under a reduced pressure. A solid therefrom was recrystallized with ethyl acetate and hexane to obtain 18.5 g (70%) of Intermediate Int-6.

Synthesis Example 2: Synthesis of Intermediate Int-7

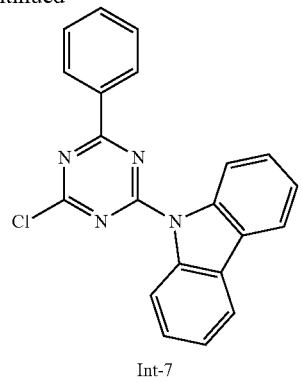

Int-7

30 g (132.7 mmol) of 2,4-dichloro-6-phenyl-1,3,5-triazine, 17.75 g (106.2 mmol) of carbazole, and 14.03 g (146.0 mmol) of NaOtBu were put in a round-bottomed flask and dissolved in 650 ml of THF and then, stirred at ambient temperature for 12 hours. A solid produced therein was filtered and stirred in an aqueous layer for 30 minutes. The solid was filtered and then, dried to obtain 20 g (42%) of Intermediate Int-7.

Synthesis Example 3: Synthesis of Compound 1-27

[Reaction Scheme 3]

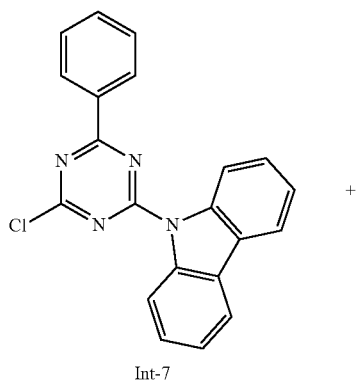

Int-7

+

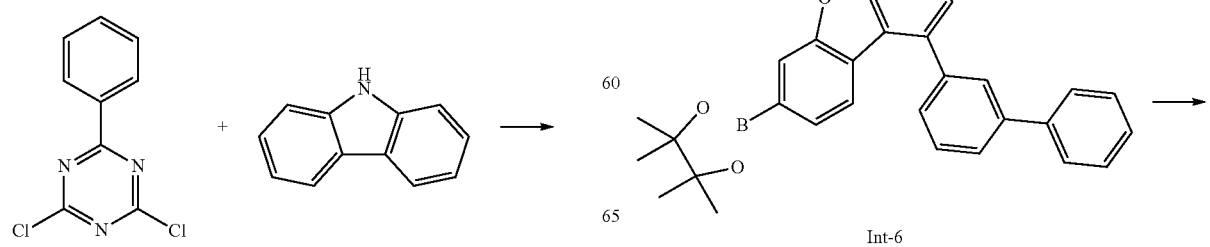

[Reaction Scheme 2]

113

-continued

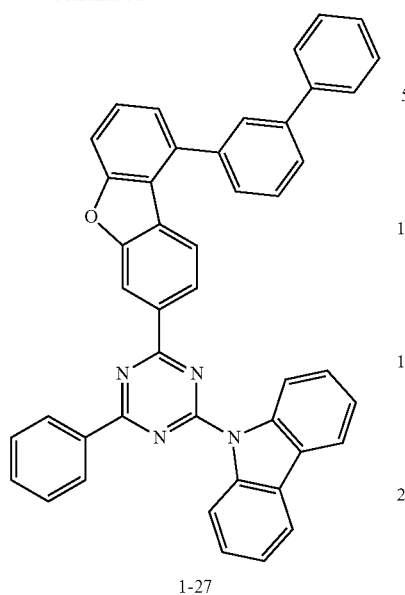

1-27

9.5 g (26.6 mmol) of Intermediate Int-7, 14.25 g (31.9 mmol) of Intermediate Int-6, 9.2 g (66.6 mmol) of K$_2$CO$_3$, and 1.5 g (1.3 mmol) of Pd (PPh$_3$)$_4$ were put in a round-bottomed flask and dissolved in 100 ml of THF and 40 ml of distilled water and then, stirred under reflux at 70° C. for 12 hours. When a reaction was completed, the mixture was added to 500 mL of methanol, and a solid crystallized therein was filtered, dissolved in monochlorobenzene (MCB), filtered with silica gel, and after removing an appropriate amount of an organic solvent, recrystallized with methanol to obtain 13.1 g (77%) of Compound 1-27.

(LC/MS theoretical value: 640.23 g/mol, measured value: M+=641.39 g/mol)

Synthesis Example 4: Synthesis of Compound 1-24

[Reaction Scheme 4]

114

-continued

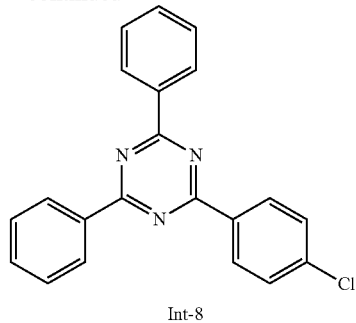

Int-8

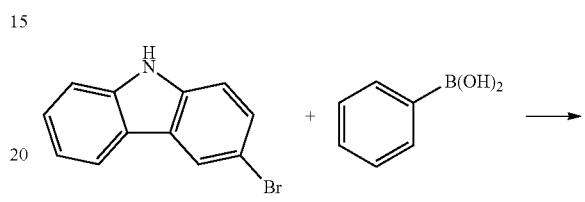

Int-9

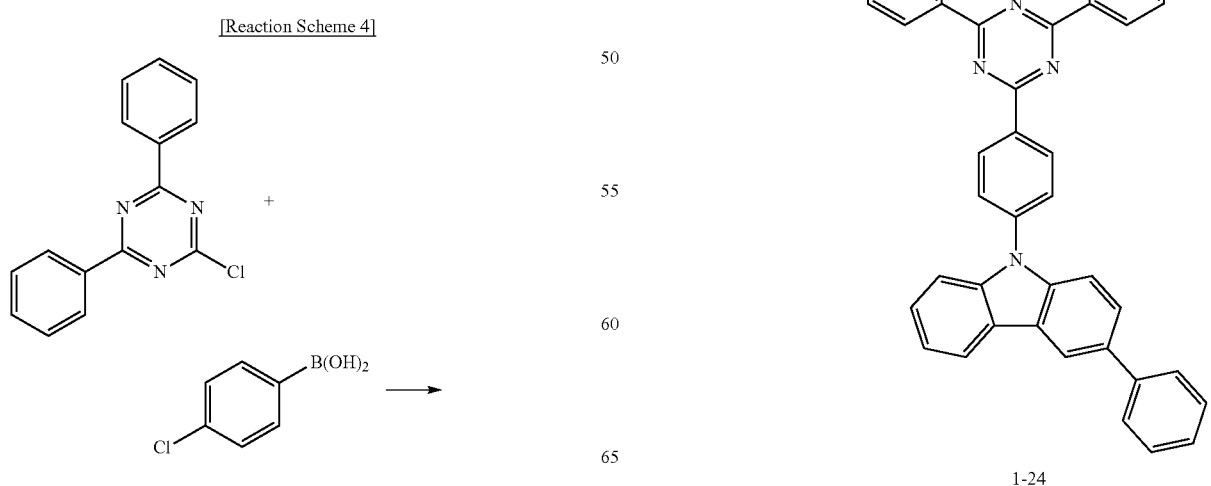

1st Step: Synthesis of Intermediate Int-8

23.4 g (87.3 mmol) of 2-chloro-4,6-diphenyl-1,3,5-triazine was added to 100 mL of THF, 100 mL of toluene, and 100 mL of distilled water, and 0.9 equivalent of 4-chlorophenylboronic acid, 0.03 equivalent of Pd(PPh$_3$)$_4$, and 2 equivalents of K$_2$CO$_3$ were added thereto and then, stirred under reflux under a nitrogen atmosphere for 6 hours. After removing an aqueous layer, an organic layer therefrom was dried under a reduced pressure. A solid obtained therefrom was washed with water and hexane and then, recrystallized with 200 mL of toluene to obtain 20 g (67%) of Intermediate Int-8.

2nd Step: Synthesis of Intermediate Int-9

35 g (142 mmol) of 3-bromo-9H-carbazole was dissolved in 500 mL of THF, and 17.3 g (142 mmol) of phenylboronic acid and 8.2 g (7.1 mmol) of Pd(PPh$_3$)$_4$ were added thereto and then stirred. 49.1 g (356 mmol) of K$_2$CO$_3$ saturated in water was added thereto and then, stirred under reflux at 80° C. for 12 hours. When a reaction was completed, water was added to the reaction solution, and the mixture was extracted with DCM, treated with MgSO$_4$ to removed moisture, filtered, and concentrated under a reduced pressure. The obtained residue was separated and purified through column chromatography (Hexane:DCM (20%)) to obtain 22.0 g (64%) of Intermediate Int-9.

3rd Step: Synthesis of Compound 1-24

22.0 g (90.4 mmol) of Intermediate Int-9, 31.1 g (90.4 mmol) of Intermediate Int-8, 13.1 g (135.6 mmol) of NaOtBu, 2.5 g (2.7 mmol) of Pd$_2$(dba)$_3$, and 5.5 g (50% in toluene) of P(t-Bu)$_3$ were added to 300 mL of xylene and then, stirred under reflux under a nitrogen flow for 12 hours. After removing the xylene, 200 mL of methanol was added to the obtained mixture, and a solid crystallized therein was filtered, dissolved in MCB, and filtered with silica gel, and an appropriate amount of an organic solvent was concentrated to obtain 32 g (64%) of Compound 1-24.

(LC/MS theoretical value: 550.22 g/mol, measured value: M+=551.23 g/mol)

Synthesis Example 5: Synthesis of Compound 1-41

[Reaction Scheme 5]

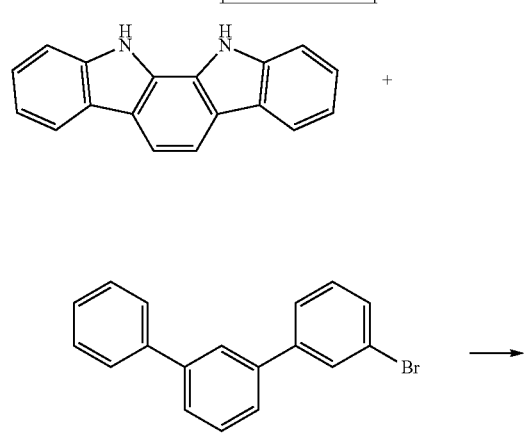

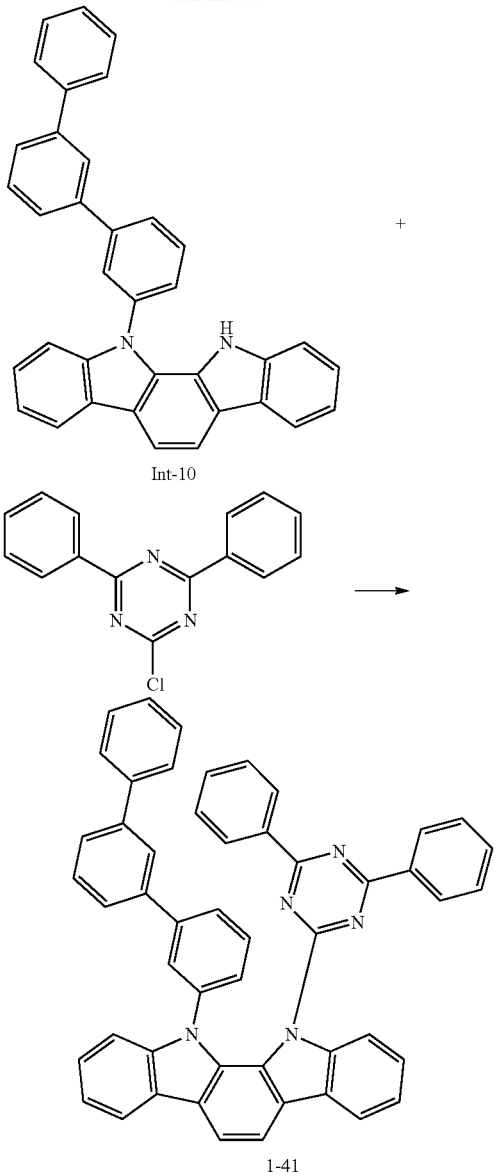

1st Step: Synthesis of Intermediate Int-10

15 g (58.5 mmol) of Indolo[2,3-a]carbazole, 18.1 g (58.5 mmol) of 3-bromo-m-terphenyl, 1.6 g (1.8 mmol) of Pd$_2$(dba)$_3$, 2.8 ml (5.8 mmol) of P(t-Bu)$_3$, and 8.4 g (87.8 mmol) of NaOtBu were suspended in 300 ml of xylene and then, stirred under reflux at 120° C. for 12 hours. When a reaction was completed, distilled water was added thereto and then, stirred for 30 minutes, and extracted, and an organic layer therefrom alone was purified through silica gel column (Hexane:DCM (30%)) to obtain 16.2 g (57%) of Intermediate Int-10.

2nd Step: Synthesis of Compound 1-41

16.1 g (33.2 mmol) of Intermediate Int-10 and 8.9 g (33.2 mmol) of 2-chloro-4,6-diphenyl-1,3,5-triazine were used in the same method as the 3rd step of Synthesis Example 4 to obtain 11.4 g (48%) of Compound 1-41.

(LC/MS theoretical value: 715.27 g/mol, measured value: M+=716.29 g/mol)

Synthesis Example 6: Synthesis of Compound 1-25

[Reaction Scheme 6]

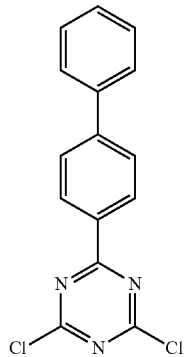 + 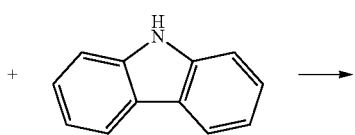 →

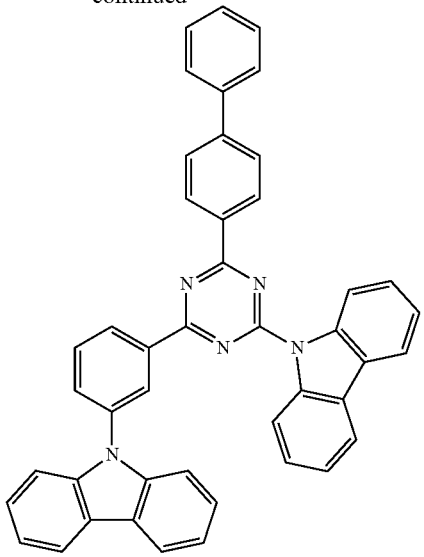

1-25

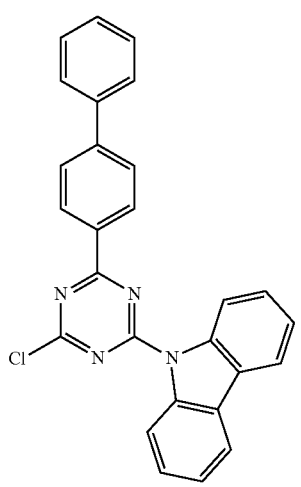 +

Int-11

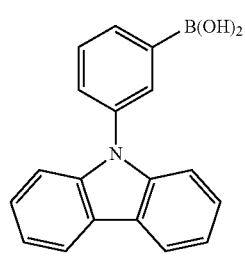

1st Step: Synthesis of Intermediate Int-11

65.5 g (216.8 mmol) of 2-[1,1'-biphenyl]-4-yl-4,6-dichloro-1,3,5-triazine and 25 g (149.5 mmol) of carbazole were suspended in 800 ml of THF, and 15.1 g (157.0 mmol) of NaOtBu was slowly added thereto. After stirring the mixture for 12 hours at ambient temperature, a solid produced therein was filtered, washed with distilled water, acetone, and hexane in order to obtain 40.2 g (62%) of Intermediate Int-11 as a target compound.

2nd Step: Synthesis of Compound 1-25

10 g (23.1 mmol) of Intermediate Int-11, 8.7 g (23.6 mmol) of 3-(9H-carbazol-9-yl)phenylboronic acid, 0.8 g (0.7 mmol) of Pd(PPh$_3$)$_4$, and 6.4 g (46.2 mmol) of K$_2$CO$_3$ were suspended in 100 ml of THF and 50 ml of distilled water and then, stirred under reflux for 12 hours. When a reaction was completed, a solid produced therein was filtered and washed with distilled water and acetone. The solid was recrystallized in 150 ml of dichlorobenzene (DCB) to obtain 11 g (74%) of Compound 1-25.

(LC/MS: theoretical value 639.75 g/mol, measured value: 640.40 g/mol)

Synthesis Example 7: Synthesis of Compound 1-46

[Reaction Scheme 7]

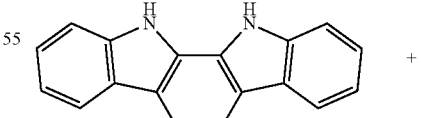 +

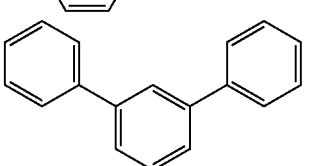 →

-continued

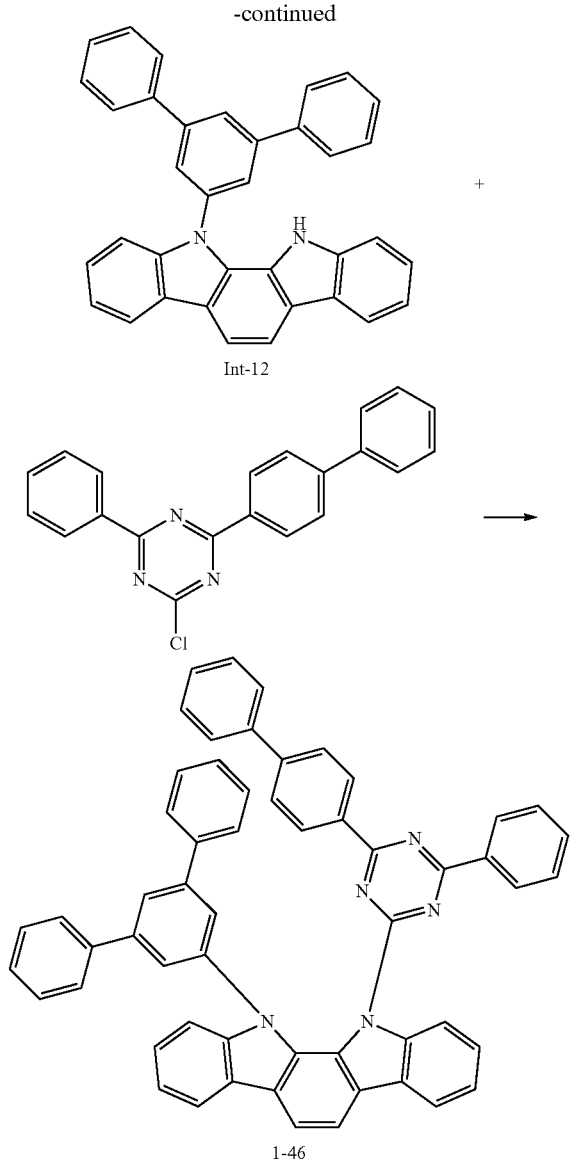

1ˢᵗ Step: Synthesis of Intermediate Int-12

12 g (46.8 mmol) of Indolo[2,3-a]carbazole, 14.5 g (46.8 mmol) of 1-bromo-3,5-diphenylbenzene, 1.3 g (1.4 mmol) of Pd₂(dba)₃, 2.3 ml (4.7 mmol) of P(t-Bu)₃, and 6.8 g (70.2 mmol) of NaOtBu were suspended in 220 ml of xylene and then, stirred under reflux at 120° C. for 12 hours. When a reaction was completed, distilled water was added thereto and then, stirred for 30 minutes and extracted, and an organic layer therefrom alone was purified through silica gel column (Hexane:DCM (30%)) to obtain 13.6 g (60%) of Intermediate Int-12.

2ⁿᵈ Step: Synthesis of Compound 1-46

13 g (26.8 mmol) of Intermediate Int-12 and 1.3 g (53.7 mmol) of NaH were suspended in 150 ml of dry N,N-dimethylformamide (DMF) and then, stirred under a nitrogen flow. Subsequently, 11.1 g (32.2 mmol) of 2-chloro-4-phenyl-6-(4-biphenyl)-1,3,5-triazine were suspended in 70 ml of dry DMF and then, slowly added to the mixture in a dropwise fashion. After completing the addition in a dropwise fashion, the obtained mixture was stirred for 6 hours. When a reaction was completed, distilled water was added thereto, and crystals precipitated therein were filtered and dried. The crystals were recrystallized in 150 ml of DCB to obtain 8.3 g (39%) of Compound 1-46.

(LC/MS: theoretical value: 791.30 g/mol, measured value: 792.11 g/mol)

Synthesis Example 8: Synthesis of Compound 1-73

[Reaction Scheme 8]

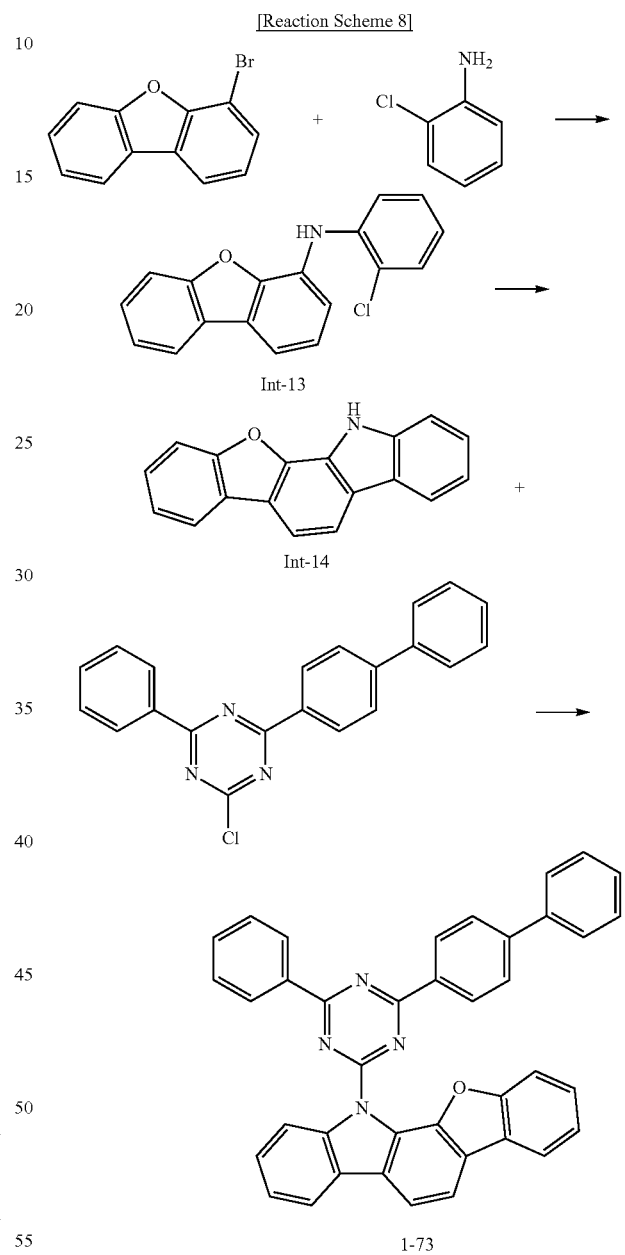

1ˢᵗ Step: Synthesis of Intermediate Int-13

50 g (202.4 mmol) of 4-bromodibenzofuran, 38.7 g (303.53 mmol) of 2-chloroaniline, 9.3 g (10.2 mmol) of Pd₂(dba)₃, 7.4 ml (30.4 mmol) of P(t-bu)₃, and 29.2 g (303.5 mmol) of NaOtBu were put in a round-bottomed flask and dissolved in 650 ml of toluene and then, stirred under reflux at 130° C. for 12 hours. When a reaction was completed, after removing an aqueous layer therefrom, the residue was treated through column chromatography (Hexane:DCM (20%)) to obtain 38 g (64%) of Intermediate Int-13.

2nd Step: Synthesis of Intermediate Int-14

50 g (170.2 mmol) of Intermediate Int-13, 7.8 g (8.5 mmol) of Pd$_2$(dba)$_3$, 110.9 g (340.4 mmol) of Cs$_2$CO$_3$, and 6.3 g (17.0 mmol) of PCy$_3$•HBF$_4$ (tricyclohexylphosphine tetrafluorobarate) were put in a round-bottomed flask and dissolved in 550 ml of DMAc and then, stirred under reflux at 160° C. for 12 hours. When a reaction was completed, an excess of distilled water was poured thereinto and then, stirred for 1 hour. A solid therein was filtered and dissolved in MCB at a high temperature. Subsequently, MgSO$_4$ was used to remove moisture, a silica gel pad was used to filter an organic solvent, and a filtrate therefrom was stirred. A solid obtained therefrom was filtered and vacuum-dried to obtain 26.9 g (62%) of Intermediate Int-14.

3rd Step: Synthesis of Compound 1-73

11.5 g (44.7 mmol) of Intermediate Int-14, 18.4 g (53.7 mmol) of 2-chloro-4-phenyl-6-(4-biphenyl)-1,3,5-triazine, and 2.2 g (89.5 mmol) of NaH were put in a round bottomed flask and dissolved in 180 ml of dry DMF and then, stirred under reflux at ambient temperature for 12 hours. When a reaction was completed, an excess of distilled water was poured thereinto and then, stirred for 1 hour. A solid therein was filtered and dissolved in MCB at a high temperature. MgSO$_4$ was used to remove moisture, a silica gel pad was used to filter an organic solvent, and a filtrate therefrom was stirred. A solid therein was filtered and vacuum-dried to obtain 22.1 g (88%) of Compound 1-73.

(LC/MS: theoretical value: 561.21 g/mol, measured value: 562.62 g/mol)

(Synthesis of Second Compound)

Synthesis Example 9: Synthesis of Compound 2-1

Compound 2-1 was synthesized as described in KR10-2017-0068927A.

Synthesis Example 10: Synthesis of Compound 2-2

Compound 2-2 was synthesized as described in KR10-2017-0037277A.

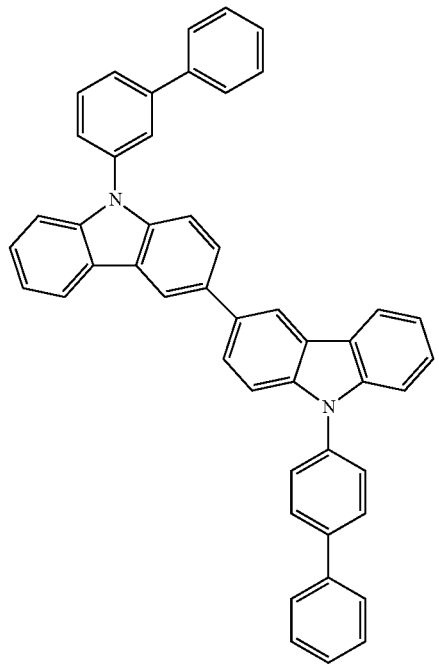 [SMILES: c1ccc(-c2ccc(-n3c4ccccc4c4cc(-c5ccc6c(c5)c5ccccc5n6-c5cccc(-c6ccccc6)c5)ccc43)cc2)cc1]

Synthesis Example 11: Synthesis of Compound 2-33

[Reaction Scheme 9]

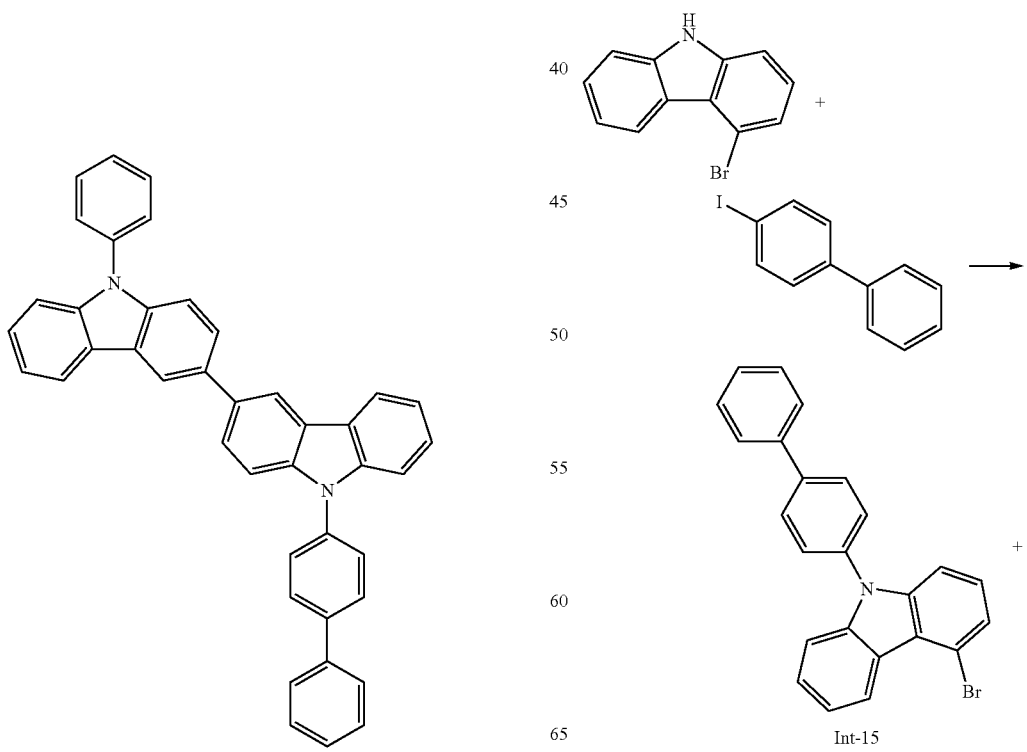

Int-15

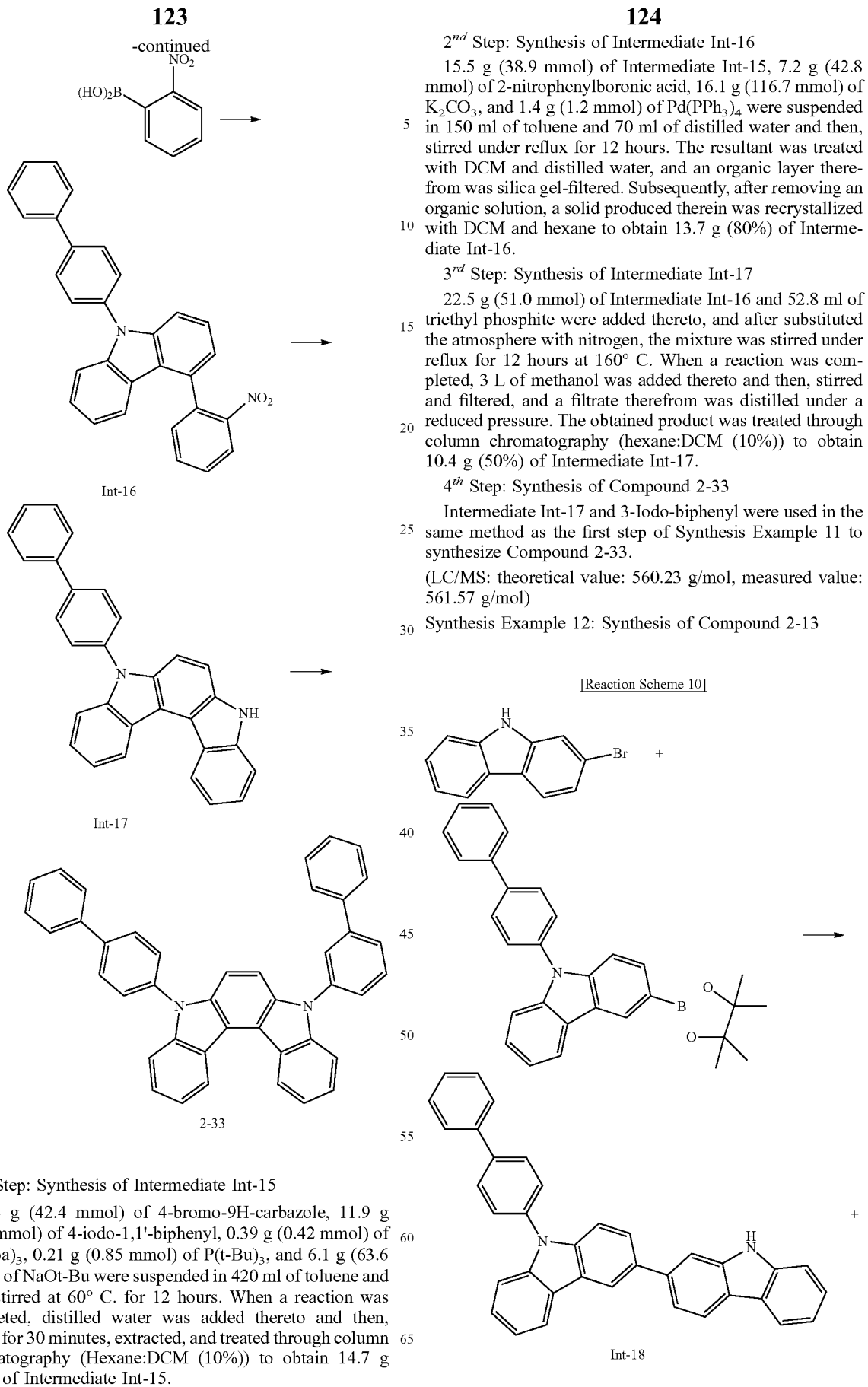

2nd Step: Synthesis of Intermediate Int-16

15.5 g (38.9 mmol) of Intermediate Int-15, 7.2 g (42.8 mmol) of 2-nitrophenylboronic acid, 16.1 g (116.7 mmol) of $K_2CO_3$, and 1.4 g (1.2 mmol) of $Pd(PPh_3)_4$ were suspended in 150 ml of toluene and 70 ml of distilled water and then, stirred under reflux for 12 hours. The resultant was treated with DCM and distilled water, and an organic layer therefrom was silica gel-filtered. Subsequently, after removing an organic solution, a solid produced therein was recrystallized with DCM and hexane to obtain 13.7 g (80%) of Intermediate Int-16.

3rd Step: Synthesis of Intermediate Int-17

22.5 g (51.0 mmol) of Intermediate Int-16 and 52.8 ml of triethyl phosphite were added thereto, and after substituted the atmosphere with nitrogen, the mixture was stirred under reflux for 12 hours at 160° C. When a reaction was completed, 3 L of methanol was added thereto and then, stirred and filtered, and a filtrate therefrom was distilled under a reduced pressure. The obtained product was treated through column chromatography (hexane:DCM (10%)) to obtain 10.4 g (50%) of Intermediate Int-17.

4th Step: Synthesis of Compound 2-33

Intermediate Int-17 and 3-Iodo-biphenyl were used in the same method as the first step of Synthesis Example 11 to synthesize Compound 2-33.

(LC/MS: theoretical value: 560.23 g/mol, measured value: 561.57 g/mol)

Synthesis Example 12: Synthesis of Compound 2-13

[Reaction Scheme 10]

1st Step: Synthesis of Intermediate Int-15

10.4 g (42.4 mmol) of 4-bromo-9H-carbazole, 11.9 g (42.4 mmol) of 4-iodo-1,1'-biphenyl, 0.39 g (0.42 mmol) of $Pd_2(dba)_3$, 0.21 g (0.85 mmol) of $P(t-Bu)_3$, and 6.1 g (63.6 mmol) of NaOt-Bu were suspended in 420 ml of toluene and then, stirred at 60° C. for 12 hours. When a reaction was completed, distilled water was added thereto and then, stirred for 30 minutes, extracted, and treated through column chromatography (Hexane:DCM (10%)) to obtain 14.7 g (87%) of Intermediate Int-15.

-continued

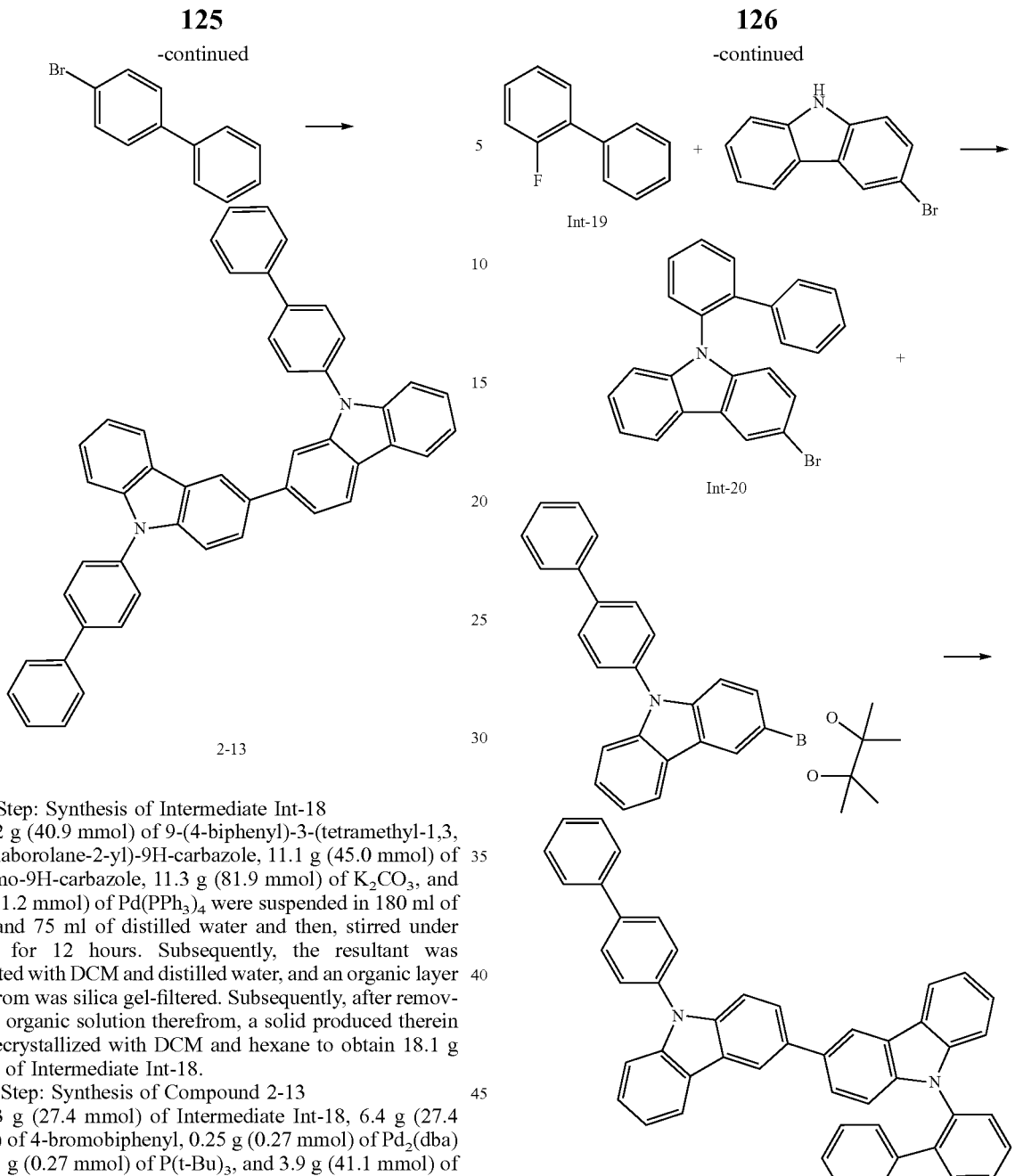

2-13

1st Step: Synthesis of Intermediate Int-18

18.2 g (40.9 mmol) of 9-(4-biphenyl)-3-(tetramethyl-1,3,2-dioxaborolane-2-yl)-9H-carbazole, 11.1 g (45.0 mmol) of 2-bromo-9H-carbazole, 11.3 g (81.9 mmol) of $K_2CO_3$, and 1.4 g (1.2 mmol) of $Pd(PPh_3)_4$ were suspended in 180 ml of THF and 75 ml of distilled water and then, stirred under reflux for 12 hours. Subsequently, the resultant was extracted with DCM and distilled water, and an organic layer therefrom was silica gel-filtered. Subsequently, after removing an organic solution therefrom, a solid produced therein was recrystallized with DCM and hexane to obtain 18.1 g (91%) of Intermediate Int-18.

2nd Step: Synthesis of Compound 2-13

13.3 g (27.4 mmol) of Intermediate Int-18, 6.4 g (27.4 mmol) of 4-bromobiphenyl, 0.25 g (0.27 mmol) of $Pd_2(dba)_3$, 0.13 g (0.27 mmol) of $P(t-Bu)_3$, and 3.9 g (41.1 mmol) of NaOtBu were suspended in 300 ml of toluene and then, stirred at 60° C. for 12 hours. When a reaction was completed, distilled water was added thereto and then, stirred for 30 minutes, extracted, and treated through column chromatography (hexane:DCM (10%)) to obtain 15.4 g (88%) of Compound 2-13.

LC-Mass (theoretical value: 636.26 g/mol, measured value: M+=637.40 g/mol)

Synthesis Example 13: Synthesis of Compound 2-8

[Reaction Scheme 11]

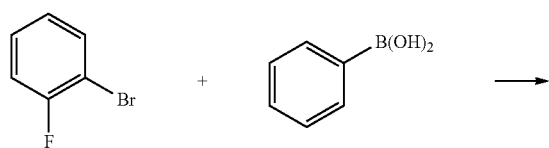

1st Step: Synthesis of Intermediate Int-19

105 g (600 mmol) of 2-bromo-1-fluorobenzene, 87.8 g (720 mmol) of phenylboronic acid, 124.4 g (900 mmol) of $K_2CO_3$, and 20.8 g (18 mmol) of $Pd(PPh_3)_4$ were suspended in 1,200 ml of THF and 450 ml of distilled water under a nitrogen flow and then, stirred under reflux for 12 hours. When a reaction was completed, the resultant was extracted with DCM and treated through column chromatography (Hexane:DCM (10%)) to obtain 77.5 g (75%) of Intermediate Int-19.

2nd Step: Synthesis of Intermediate Int-20

30 g (174.2 mmol) of Intermediate Int-19, 55.7 g (226.5 mmol) of 3-bromo-9H-carbazole, and 8.4 g (348.5 mmol) of NaH were suspended in 290 ml of N-methyl-2-pyrrolidone (NMP) under a nitrogen flow and then, stirred under reflux for 18 hours. The reactant was slowly poured into an excess of water and then, stirred, and a solid therein was filtered to obtain 41.6 g (60%) of Intermediate Int-20.

3$^{rd}$ Step: Synthesis of Compound 2-8

25.0 g (62.8 mmol) of Intermediate Int-20, 27.9 g (62.8 mmol) of 9-(4-biphenyl)-3-(tetramethyl-1,3,2-dioxaborolane-2-yl)-9H-carbazole, 17.4 g (125.5 mmol) of $K_2CO_3$, and 2.2 g (1.9 mmol) of $Pd(PPh_3)_4$ were suspended in 120 ml of THF and 60 ml of distilled water under a nitrogen flow and then, stirred under reflux for 12 hours. When a reaction was completed, the resultant was extracted with DCM and treated through column chromatography (Hexane:DCM (30%)), and a solid obtained therefrom was recrystallized with 250 ml of toluene to obtain 31.9 g (80%) of Compound 2-8.

LC-Mass (theoretical value: 636.78 g/mol, measured value: M+=637.87 g/mol)

(Synthesis of Third Compound)

Synthesis Example 14: Synthesis of Compound 3-7

[Reaction Scheme 12]

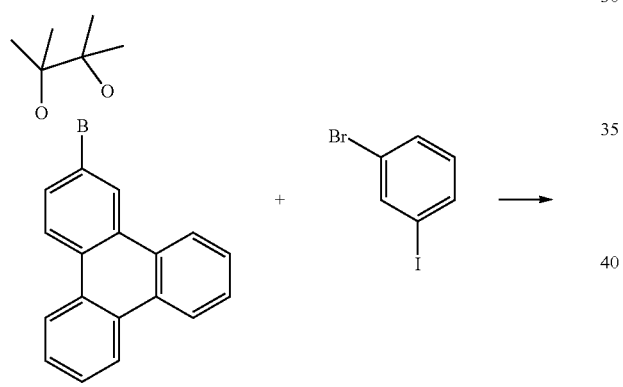

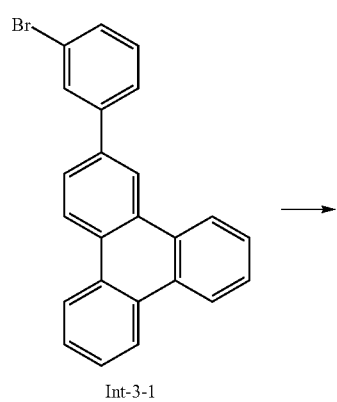

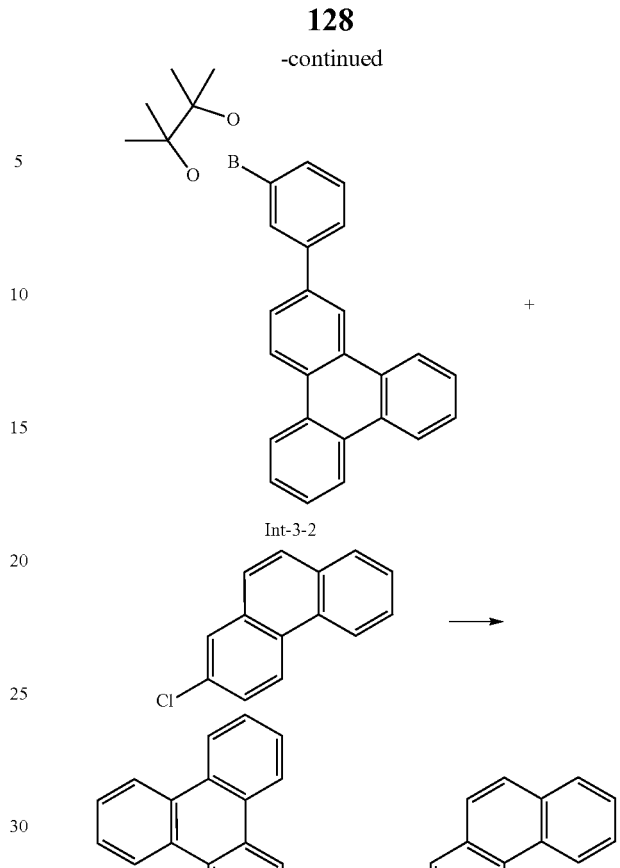

1$^{st}$ Step: Synthesis of Intermediate Int-3-1

50.3 g (142.1 mmol) of 4,4,5,5-tetramethyl-2-(triphenylen-2-yl)-1,3,2-dioxaborolane, 40.2 g (142.1 mmol) of 1-bromo-3-iodobenzene, 29.5 g (213.2 mmol) of $K_2CO_3$, and 4.9 g (4.3 mmol) of $Pd(PPh_3)_4$ were suspended in 280 ml of THF and 110 ml of distilled water under a nitrogen flow and then, stirred under reflux for 8 hours. When a reaction was completed, the resultant was extracted with DCM and threated through column chromatography (Hexane:DCM (20%)) to obtain 39.3 g (78%) of Intermediate Int-3-1.

2$^{nd}$ Step: Synthesis of Intermediate Int-3-2

77 g (203.3 mmol) of Intermediate Int-3-1, 59.4 g (233.8 mmol) of bis(pinacolato)diboron, 4.8 g (5.9 mmol) of $Pd(dppf)Cl_2$, and 28.9 g (294.8 mmol) of potassium acetate were put in a round-bottomed flask and dissolved in 400 ml of DMF. The mixture was stirred under reflux at 120° C. for 12 hours. When a reaction was completed, the mixture was poured into an excess of distilled water and then, stirred for 1 hour. A solid therein was filtered and dissolved in DCM. $MgSO_4$ was used to remove moisture, and an organic solvent was filtered with a silica gel pad and removed under a reduced pressure. A solid therefrom was recrystallized with ethyl acetate and hexane to obtain 41.8 g (70%) of Intermediate Int-3-2.

3$^{rd}$ Step: Synthesis of Compound 3-7

61.2 g (142.1 mmol) of Intermediate Int-3-2, 30.2 g (142.1 mmol) of 2-chloro-phenanthrene, 29.5 g (213.2 mmol) of K$_2$CO$_3$, and 4.9 g (4.3 mmol) of Pd(PPh$_3$)$_4$ were suspended in 280 ml of THF and 110 ml of distilled water under a nitrogen flow and stirred under reflux for 8 hours. When a reaction was completed, the resultant was extracted with DCM and treated through column chromatography (Hexane:DCM (20%)) to obtain 68.6 g (78%) of Compound 3-7 as a solid.

LC-Mass (theoretical value: 618.23 g/mol, measured value: M+=619.40 g/mol)

Synthesis Example 15: Synthesis of Compound 3-11

Synthesis Example 16: Synthesis of Compound 3-6

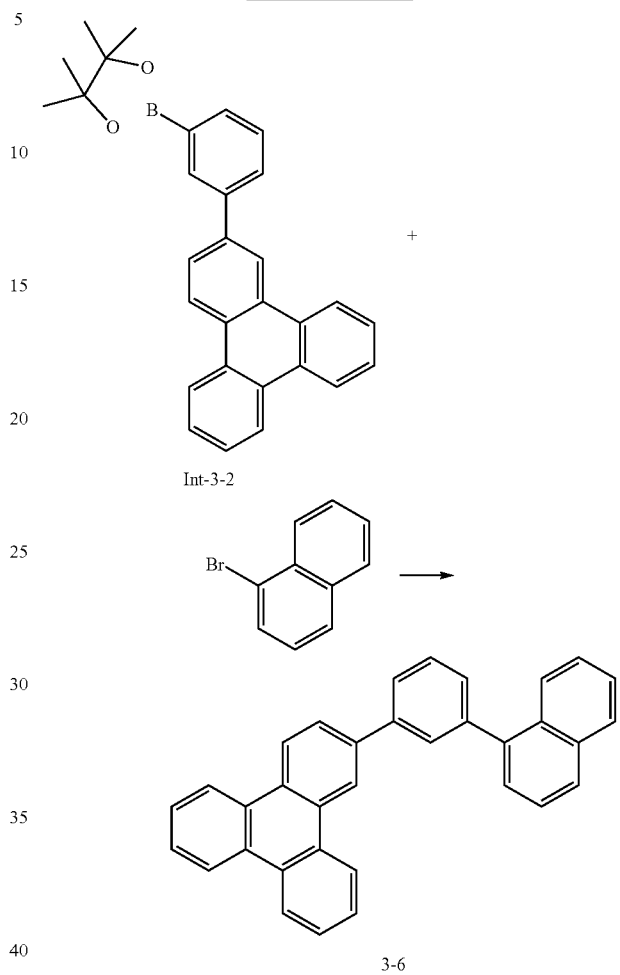

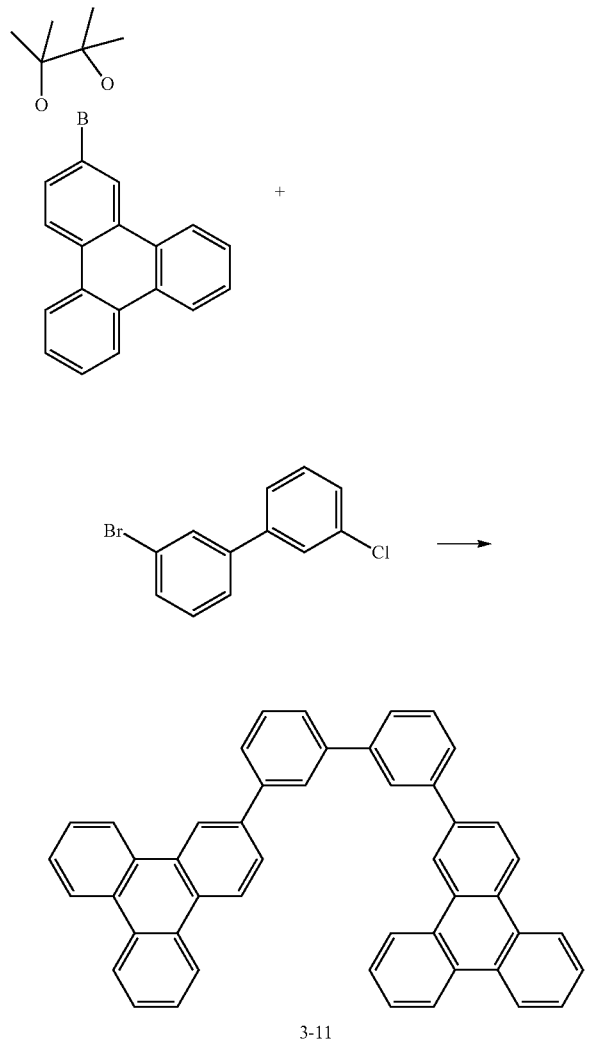

50.3 g (142.1 mmol) of 4,4,5,5-tetramethyl-2-(triphenylen-2-yl)-1,3,2-dioxaborolane, 19.0 g (71.1 mmol) of 3-bromo-3'-chloro-biphenyl, 29.5 g (213.2 mmol) of K$_2$CO$_3$, and 4.9 g (4.3 mmol) of Pd(PPh$_3$)$_4$ were suspended in 280 ml of THF and 110 ml of distilled water under a nitrogen flow and then, stirred under reflux for 8 hours. When a reaction was completed, the resultant was extracted with DCM and treated through column chromatography (Hexane:DCM (20%)) to obtain 30.2 g (70%) of Compound 3-11.

LC-Mass (theoretical value: 606.23 g/mol, measured value: M+=607.40 g/mol)

61.2 g (142.1 mmol) of Intermediate Int-3-2, 29.4 g (142.1 mmol) of 2-bromo-naphthalene, 29.5 g (213.2 mmol) of K$_2$CO$_3$, and 4.9 g (4.3 mmol) of Pd(PPh$_3$)$_4$ were suspended in 280 ml of THF and 110 ml of distilled water under a nitrogen flow and then, stirred under reflux for 8 hours. When a reaction was completed, the resultant was extracted with DCM and treated through column chromatography (Hexane:DCM (20%)) to obtain 43.4 g (71%) of Compound 3-6 as a solid.

LC-Mass (theoretical value: 430.17 g/mol, measured value: M+=431.36 g/mol)

(Manufacture of Organic Light Emitting Diode)

EXAMPLE 1

The glass substrate coated with ITO (Indium tin oxide) was washed with distilled water. After washing with the distilled water, the glass substrate was ultrasonically washed with isopropyl alcohol, acetone, or methanol, and dried and then, moved to a plasma cleaner, cleaned by using oxygen plasma for 10 minutes, and moved to a vacuum depositor. This obtained ITO transparent electrode was used as an anode, Compound A doped with 3% NDP-9 (available from Novaled) was vacuum-deposited on the ITO substrate to form a 1,400 Å-thick hole transport layer, and Compound B was deposited on the hole transport layer to form a 350

Å-thick hole transport auxiliary layer. On the hole transport auxiliary layer, a 400 Å-thick light emitting layer was formed by vacuum-depositing Compound 1-27, Compound 2-2, and Compound 3-7 as a host simultaneously and doping 15 wt % of PtGD as a dopant. Herein, Compound 1-27, Compound 2-2, and Compound 3-7 were used in a weight ratio of 35:55:10, and the ratios are separately described for the following Examples and Comparative Examples. Subsequently, Compound C was deposited on the light emitting layer to form a 50 Å-thick electron transport auxiliary layer, and Compound D and LiQ were simultaneously vacuum deposited at a weight ratio of 1:1 to form a 300 Å-thick electron transport layer. On the electron transport layer, Liq and Al were sequentially vacuum-deposited to be 15 Å thick and 1,200 Å thick, manufacturing an organic light emitting diode having the following structure.

ITO/Compound A (3% NDP-9 doping, 1,400 Å)/Compound B (350 Å)/EML[85 wt % of host (1-27:2-2:3-7=35:55:10 (wt %)):15 wt % of [PtGD]] (400 Å)/Compound C (50 Å)/Compound D: LiQ (300 Å)/LiQ (15 Å)/Al (1,200 Å).

Compound A: N-(biphenyl-4-yl)-9,9-dimethyl-N-(4-(9-phenyl-9H-carbazol-3-yl)phenyl)-9H-fluoren-2-amine Compound B: N,N-bis(9,9-dimethyl-9H-fluoren-4-yl)-9,9-spirobi(fluorene)-2-amine Compound C: 2-(3-(3-(9,9-dimethyl-9H-fluoren-2-yl)phenyl)phenyl)-4,6-diphenyl-1,3,5-triazine Compound D: 8-(4-(4,6-di(naphthalen-2-yl)-1,3,5-triazin-2-yl)phenyl)quinolone

[PtGD]

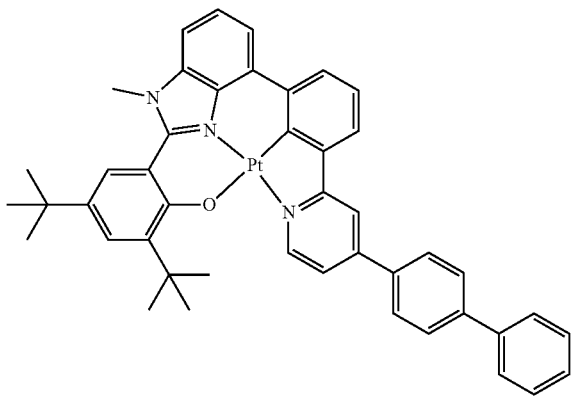

EXAMPLES 2 AND 3

Organic light emitting diodes were manufactured in the same manner as in Example 1, except that the compositions were changed to the hosts shown in Tables 2 and 3.

COMPARATIVE EXAMPLES 1 TO 6

Organic light emitting diodes were manufactured in the same manner as in Example 1, except that the compositions were changed to the hosts shown in Tables 1 to 3.

Evaluation

The luminous efficiency and life-span of the organic light emitting diodes according to Examples 1 to 3 and Comparative Examples 1 to 6 were measured.

Specific measurement methods are as follows, and the results are shown in

Tables 1 to 3.

(1) Measurement of Current Density Change Depending on Voltage Change

The obtained organic light emitting diodes were measured regarding a current value flowing in the unit diode, while increasing the voltage from 0 V to 10 V using a current-voltage meter (Keithley 2400), and the measured current value was divided by area to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Current Efficiency and Calculation of Efficiency Ratio

The current efficiency (cd/A) of luminance of 9000 nit was calculated using the luminance, current density, and voltage measured from the (1) and (2).

The relative efficiency ratio was calculated based on the current efficiency value of one of the Comparative Examples.

(4) Measurement of Life-span and Calculation of Life-span Ratio

The luminance (cd/m$^2$) was maintained at 24,000 cd/m$^2$, and the time at which the current efficiency (cd/A) decreased to 95% was measured to obtain results.

The relative life-span ratios were calculated based on the life-span value of one of the Comparative Examples.

TABLE 1

| | First host | Second host | Third host | First host: Second host: Third host ratio (wt:wt:wt) | Efficiency ratio (%) | Life-span ratio T97 (%) |
|---|---|---|---|---|---|---|
| Example 1 | 1-27 | 2-2 | 3-7 | 35:55:10 | 100 | 116 |
| Comparative Example 1 | 1-27 | 2-2 | — | 35:65:0 | 100 | 100 |
| Comparative Example 2 | 1-27 | — | 3-7 | 35:0:65 | 80 | 70 |

TABLE 2

| | First host | Second host | Third host | First host: Second host: Third host ratio (wt:wt:wt) | Efficiency ratio (%) | Life-span ratio T97 (%) |
|---|---|---|---|---|---|---|
| Example 2 | 1-24 | 2-33 | 3-3 | 35:55:10 | 100 | 116 |
| Comparative Example 3 | 1-24 | 2-33 | — | 35:65:0 | 100 | 100 |
| Comparative Example 4 | 1-24 | — | 3-3 | 35:0:65 | 80 | 70 |

TABLE 3

| | First host | Second host | Third host | First host: Second host: Third host ratio (wt:wt:wt) | Efficiency ratio (%) | Life-span ratio T97 (%) |
|---|---|---|---|---|---|---|
| Example 3 | 1-25 | 2-13 | 3-6 | 40:50:10 | 100 | 116 |
| Comparative Example 5 | 1-25 | 2-13 | — | 40:60:0 | 100 | 100 |
| Comparative Example 6 | 1-25 | — | 3-6 | 40:0:60 | 80 | 70 |

Referring to Tables 1 to 3, the organic light emitting diodes according to Examples 1 to 3 exhibited significantly improved life-span while maintaining the same/similar level of efficiency compared with the organic light emitting diodes according to Comparative Examples 1 to 6.

By way of summation and review, organic light emitting diodes (OLEDs) are attracting much attention in recent years due to increasing demands for flat panel display devices. The organic light emitting diode is a device that converts electrical energy into light, and the performance of the organic light emitting diode may be influenced by an organic material between electrodes.

One or more embodiments may provide a composition for an organic optoelectronic device having high efficiency and a long life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for an organic optoelectronic device, the composition comprising:
   a first compound;
   a second compound; and
   a third compound,
   wherein:
   the first compound is represented by one of Chemical Formula I-A and Chemical Formula I-D to Chemical Formula I-I,
   the second compound is represented by Chemical Formula II, and
   the third compound is represented by Chemical Formula III:

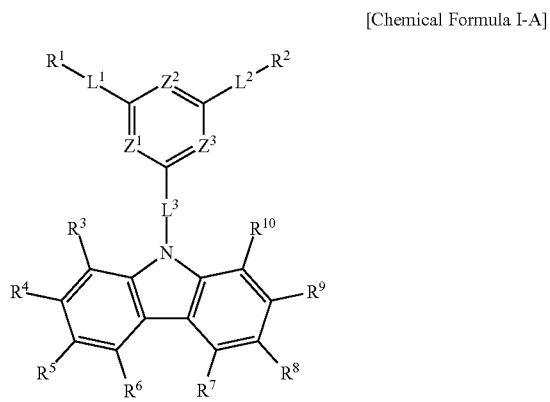

[Chemical Formula I-A]

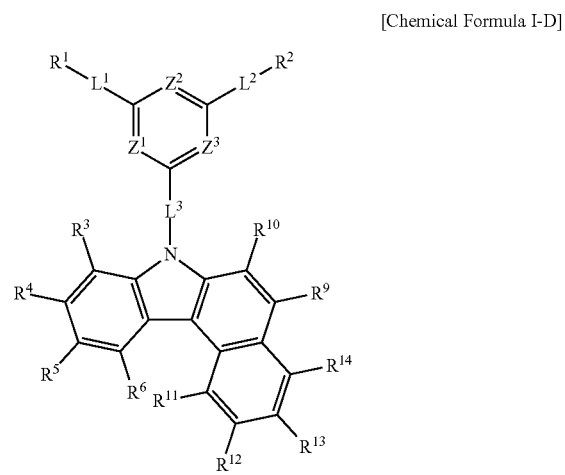

[Chemical Formula I-D]

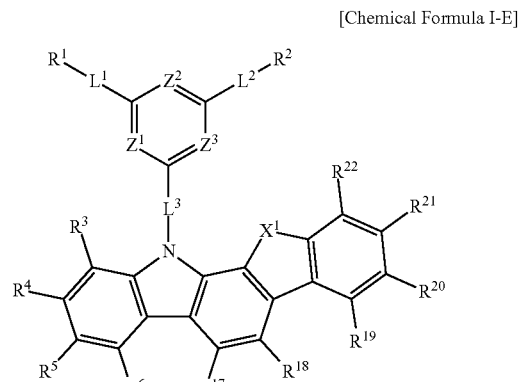

[Chemical Formula I-E]

[Chemical Formula I-F]

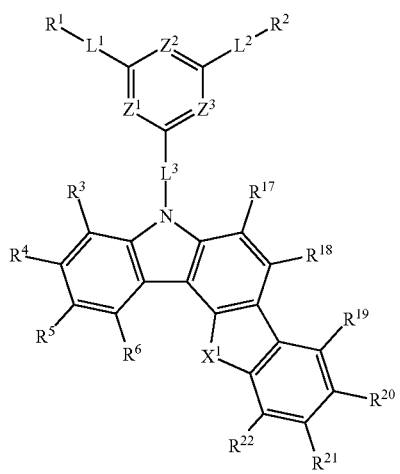

[Chemical Formula I-G]

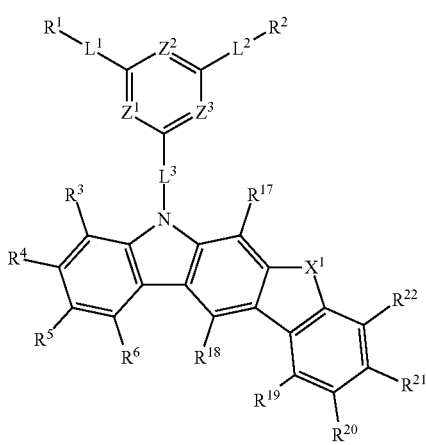

[Chemical Formula I-H]

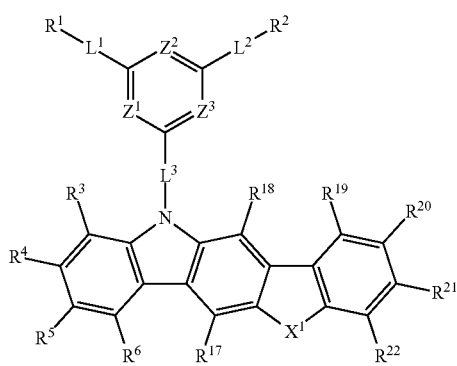

[Chemical Formula I-I]

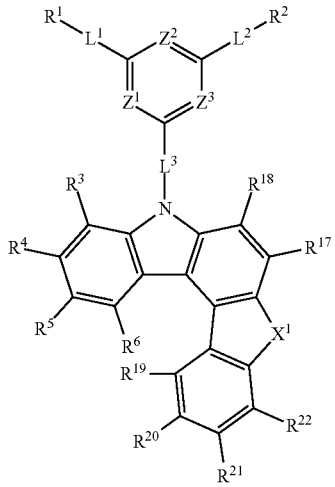

wherein, in Chemical Formula I-A and Chemical Formula I-D to Chemical Formula I-I, $Z^1$ to $Z^3$ is N or $C-L^a-R^a$, at least two of $Z^1$ to $Z^3$ being N, $L^a$ and $L^1$ to $L^3$ are each independently a single bond, a substituted or unsubstituted C6 to C20 arylene group, a substituted or unsubstituted C2 to C20 heterocyclic group, or a combination thereof, $R^1$ and $R^2$ are each independently a substituted or unsubstituted C6 to C30 aryl group, a substituted or unsubstituted C2 to C30 heterocyclic group, or a combination thereof, $R^a$ and $R^3$ to $R^6$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, $X^1$ is O, S, or $NR^b$, and $R^b$ and $R^7$ to $R^{22}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof,

[Chemical Formula II]

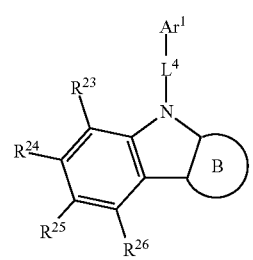

wherein, in Chemical Formula II, $L^4$ is a single bond, a substituted or unsubstituted C6 to C20 arylene group, a substituted or unsubstituted C2 to C20 heterocyclic group, or a combination thereof, Ar¹ is a substituted or unsubstituted C6 to C30 aryl group, a substituted or unsubstituted dibenzofuranyl group, a substituted or unsubstituted dibenzothiophenyl group, or a combination thereof, R²³ to R²⁶ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and B is a group represented by one of Substituent B-1 to Substituent B-4:

[Substituent B-1]

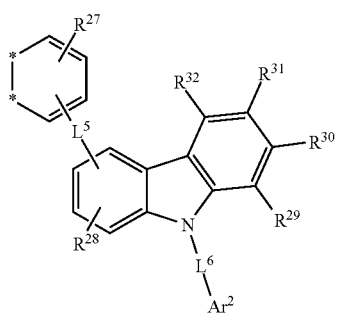

[Substituent B-2]

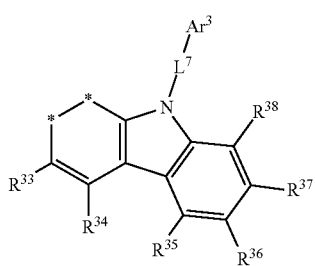

[Substituent B-3]

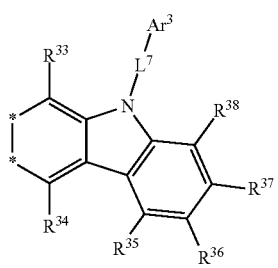

[Substituent B-4]

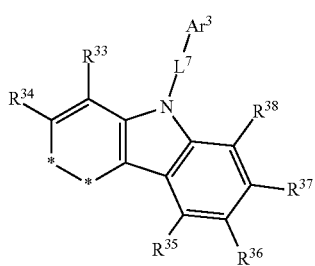

wherein, in Substituent B-1 to Substituent B-4,

L⁵ to L⁷ are each independently a single bond, a substituted or unsubstituted C6 to C20 arylene group, a substituted or unsubstituted C2 to C20 heterocyclic group, or a combination thereof, Ar² and Ar³ are each independently a substituted or unsubstituted C6 to C30 aryl group, a substituted or unsubstituted dibenzofuranyl group, a substituted or unsubstituted dibenzothiophenyl group, or a combination thereof, R²⁷ to R³⁸ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and

* is a linking carbon;

[Chemical Formula III]

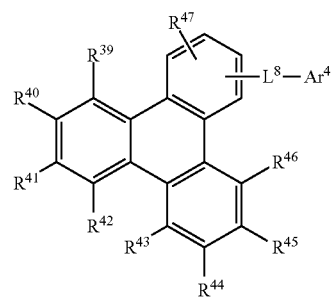

wherein, in Chemical Formula III,

R³⁹ to R⁴⁷ are each independently hydrogen, deuterium, a substituted or unsubstituted C1 to C30 alkyl group, or a substituted or unsubstituted C6 to C30 aryl group, L⁸ is a substituted or unsubstituted C6 to C20 arylene group, and Ar⁴ is a substituted or unsubstituted C10 to C20 fused aryl group.

2. The composition as claimed in claim 1, wherein the first compound is represented by Chemical Formula IA-1, Chemical Formula IA-4, or Chemical Formula IE-1:

[Chemical Formula IA-1]

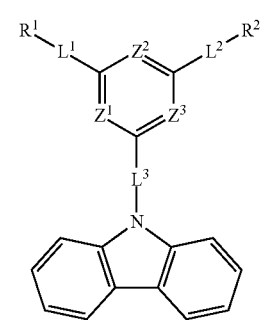

[Chemical Formula IA-4]

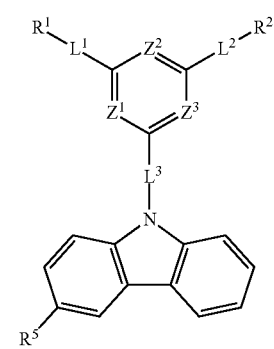

[Chemical Formula IE-1]

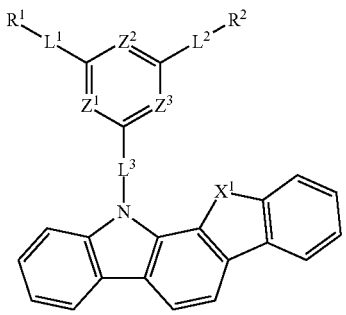

wherein, in Chemical Formula IA-1, Chemical Formula IA-4, and Chemical Formula IE-1, $Z^1$ to $Z^3$, $L^1$ to $L^3$, $R^1$, $R^2$, $R^5$, and $X^1$ are defined the same as those of Chemical Formula I-A and Chemical Formula I-D to Chemical Formula I-I.

3. The composition as claimed in claim 1, wherein the second compound is represented by Chemical Formula IIA or Chemical Formula IIF:

[Chemical Formula IIA]

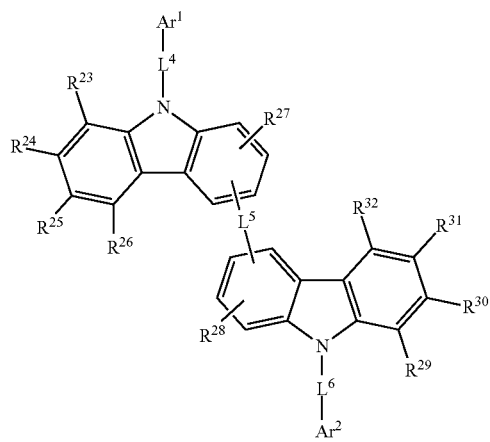

[Chemical Formula IIF]

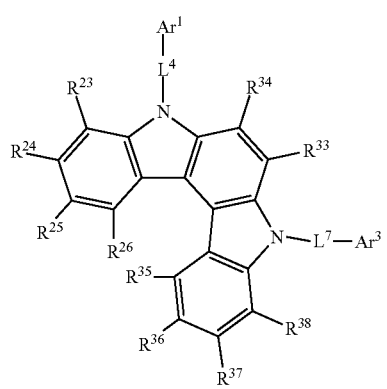

wherein, in Chemical Formula IIA and Chemical Formula IIF, $L^4$ to $L^7$, $Ar^1$ to $Ar^3$, and $R^{23}$ to $R^{38}$ are defined the same as those of Chemical Formula II.

4. The composition as claimed in claim 3, wherein:
the second compound is represented by Chemical Formula IIA, and
Chemical Formula IIA is represented by Chemical Formula IIA-1 or Chemical Formula IIA-2:

[Chemical Formula IIA-1]

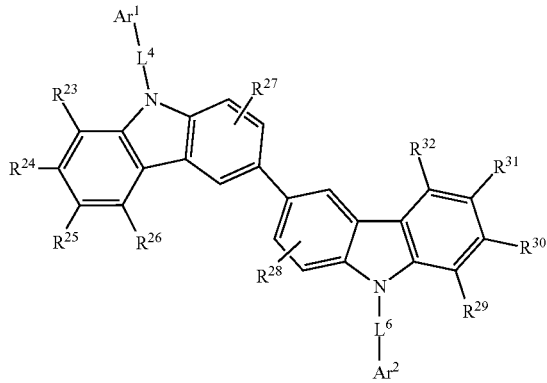

[Chemical Formula IIA-2]

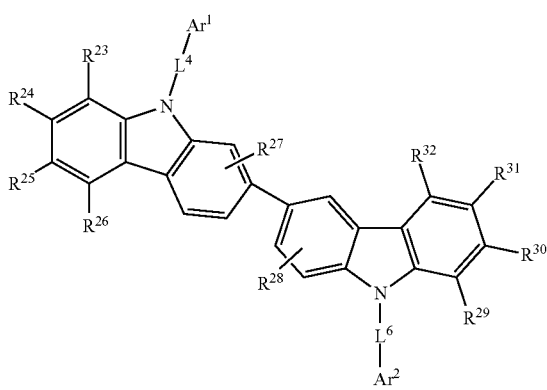

wherein, in Chemical Formula IIA-1 and Chemical Formula IIA-2, $L^4$, $L^6$, $Ar^1$, $Ar^2$, and $R^{23}$ to $R^{32}$ are defined the same as those of Chemical Formula II.

5. The composition as claimed in claim 1, wherein the third compound is represented by Chemical Formula III-1:

[Chemical Formula III-1]

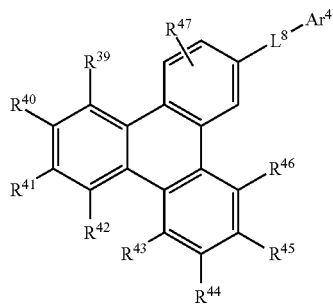

wherein, in Chemical Formula III-1, $R^{39}$ to $R^{47}$, $L^8$, and $Ar^4$ are defined the same as those of Chemical Formula III.

6. The composition as claimed in claim 5, wherein $L^8$ is a substituted or unsubstituted phenylene group.

7. The composition as claimed in claim 5, wherein $L^8$ is a linking group of Group I:

[Group I]

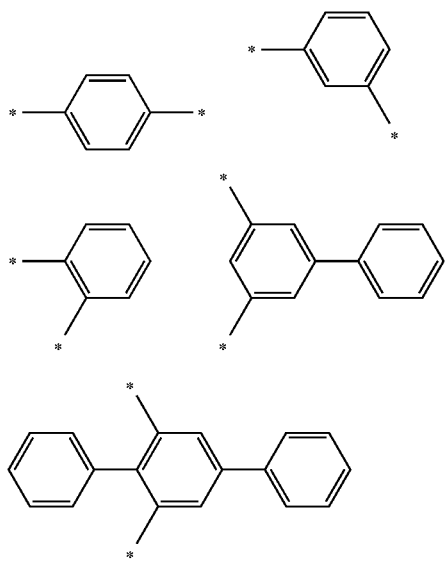

wherein, in Group I, * is a linking point.

8. The composition as claimed in claim 5, wherein $Ar^4$ is a substituted or unsubstituted naphthyl group, a substituted or unsubstituted anthracenyl group, a substituted or unsubstituted phenanthrenyl group, a substituted or unsubstituted triphenylene group, or a substituted or unsubstituted perylenyl group.

9. The composition as claimed in claim 5, wherein $Ar^4$ is a group of the following Group II:

[Group II]

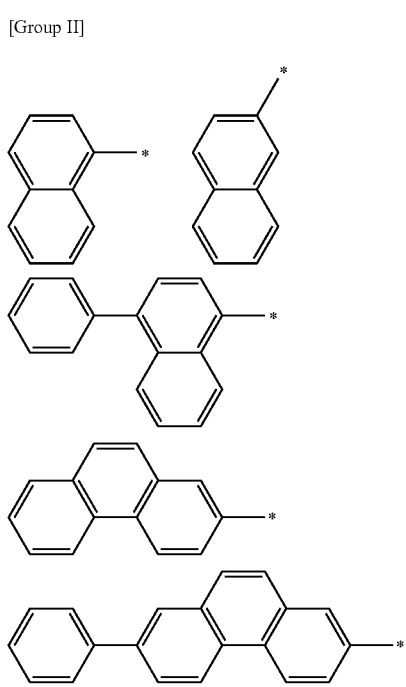

-continued

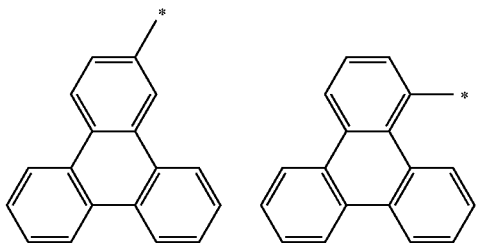

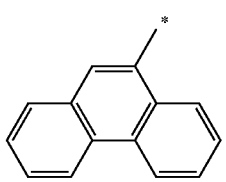

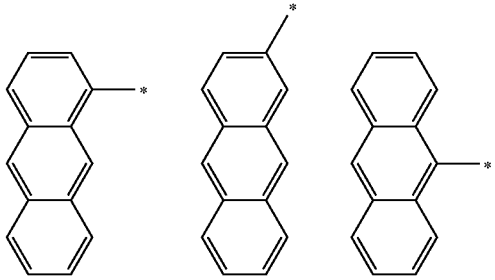

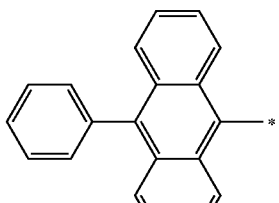

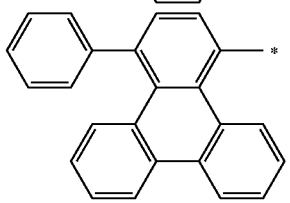

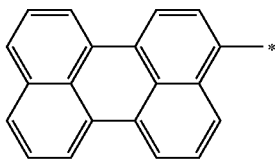

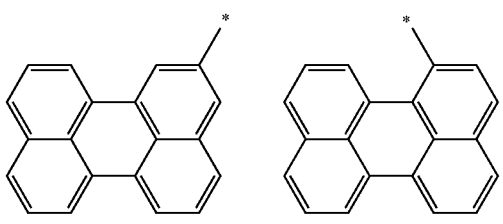

wherein, in Group II, * is a linking point.

10. The composition as claimed in claim 1, wherein the third compound is a compound of Group 3:
[Group 3]
[3-1]
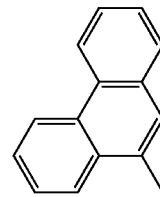
[3-2]
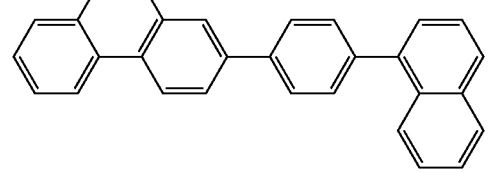
[3-3]
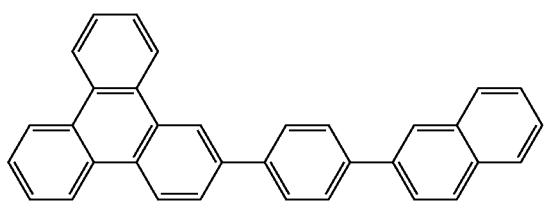
[3-4]
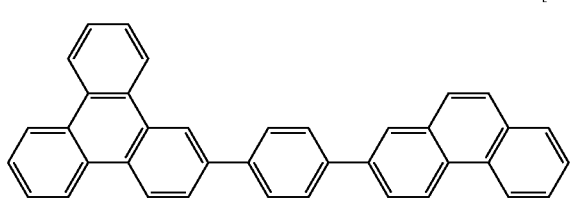
[3-5]
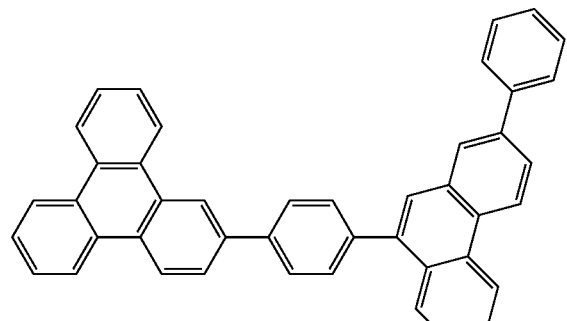
[3-6]
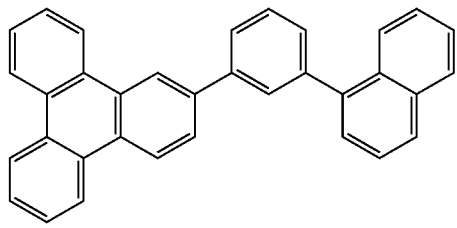
[3-7]
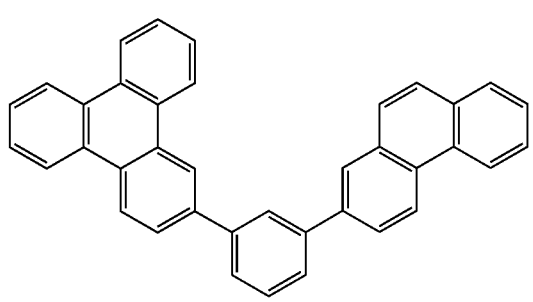
[3-8]
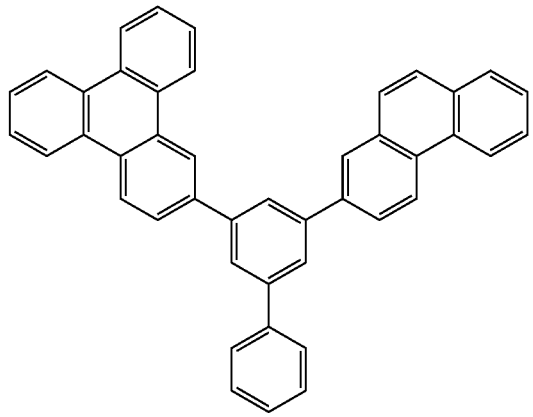
[3-9]
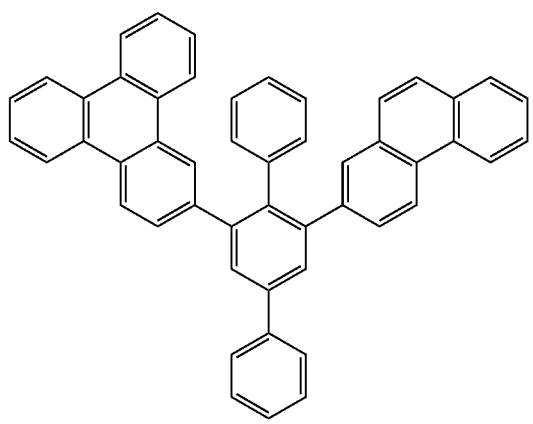

[3-10]
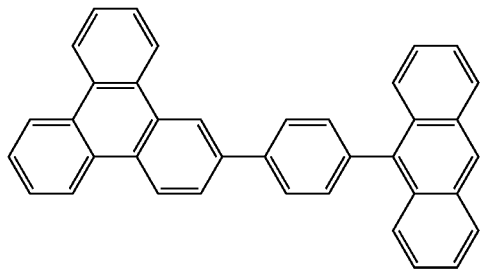

[3-11]
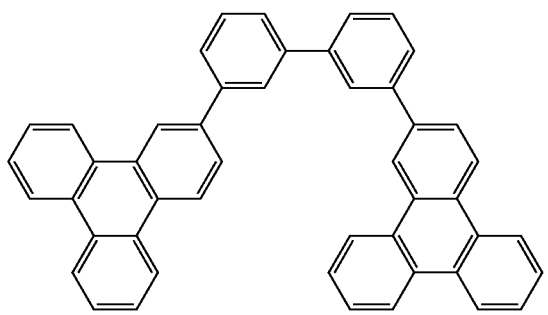

[3-12]
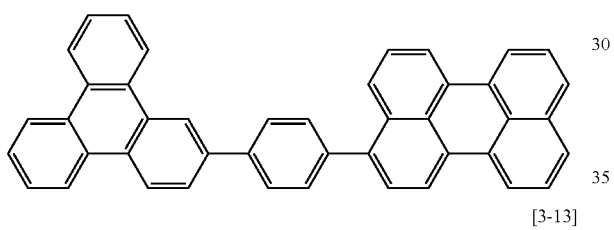

[3-13]
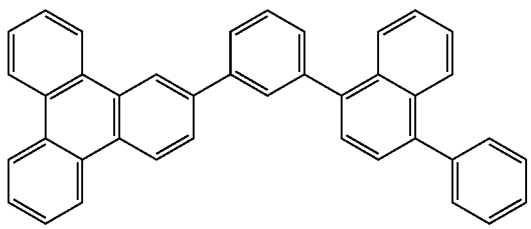

[3-14]
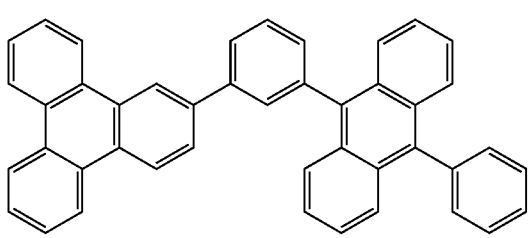

[3-15]
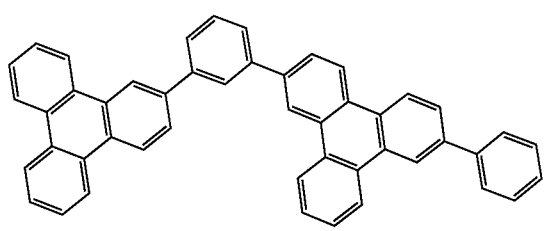

[3-16]
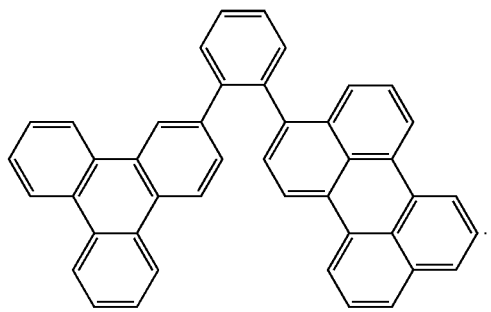

11. The composition as claimed in claim 1, wherein:

the first compound is represented by Chemical Formula IA-1 or Chemical Formula IA-4, the second compound is represented by Chemical Formula IIA-1 or Chemical Formula IIA-2, and the third compound is represented by Chemical Formula III-1:

[Chemical Formula IA-1]
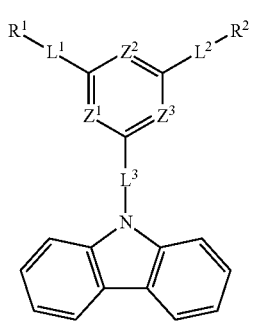

[Chemical Formula IA-4]
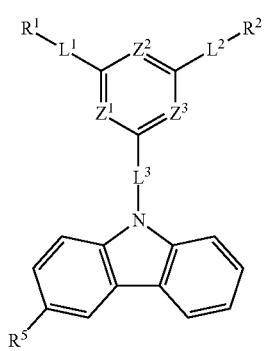

wherein, in Chemical Formula IA-1 and Chemical Formula IA-4, $Z^1$ to $Z^3$ are each N, $L^1$ to $L^3$ are each independently a single bond or a substituted or unsubstituted phenylene group, $R^1$ and $R^2$ are each independently a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group, and $R^5$ is a substituted or unsubstituted phenyl group;

[Chemical Formula IIA-1]

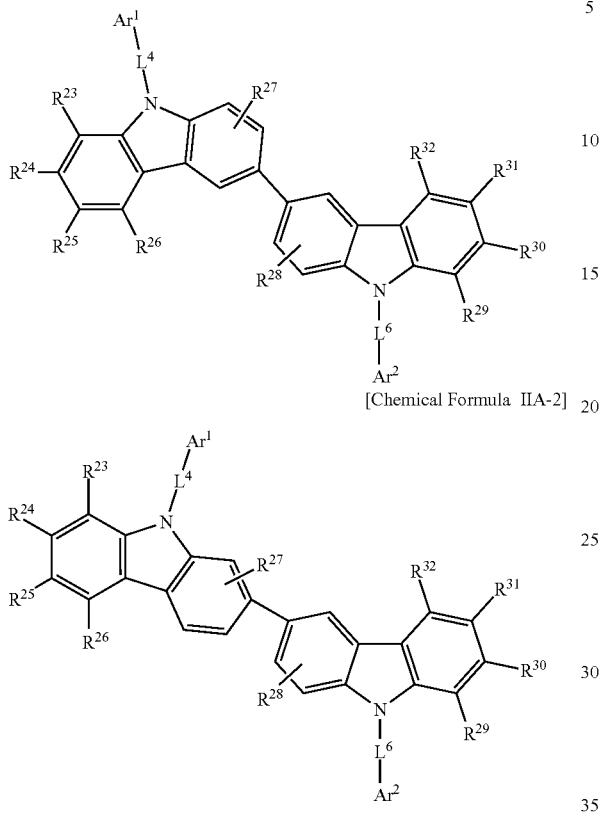

[Chemical Formula IIA-2]

wherein, in Chemical Formula IIA-1 and Chemical Formula IIA-2,
$R^{23}$ to $R^{32}$ are each hydrogen,
$L^4$ and $L^6$ are each independently a single bond or a substituted or unsubstituted phenylene group, and
$Ar^1$ and $Ar^2$ are independently a substituted or unsubstituted phenyl group or a substituted or unsubstituted biphenyl group; and

[Chemical Formula III-1]

wherein, in Chemical Formula III-1,
$R^{39}$ to $R^{47}$ are each hydrogen,
$L^8$ is a substituted or unsubstituted meta-phenylene group, and
$Ar^4$ is a substituted or unsubstituted naphthyl group, a substituted or unsubstituted phenanthrenyl group, or a substituted or unsubstituted triphenylene group.

12. The composition as claimed in claim 1, wherein:
the first compound is represented by Chemical Formula IA-1 or Chemical Formula IA-4,
the second compound is represented by Chemical Formula IIF, and
the third compound is represented by Chemical Formula III-1:

[Chemical Formula IA-1]

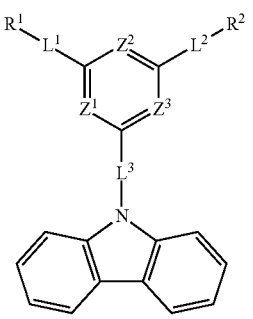

[Chemical Formula IA-4]

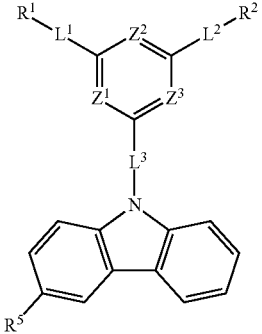

wherein, in Chemical Formula IA-1 and Chemical Formula IA-4,
$Z^1$ to $Z^3$ are each N,
$L^1$ to $L^3$ are each independently a single bond or a substituted or unsubstituted phenylene group,
$R^1$ and $R^2$ are each independently a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group, and
$R^5$ is a substituted or unsubstituted phenyl group;

[Chemical Formula IIF]

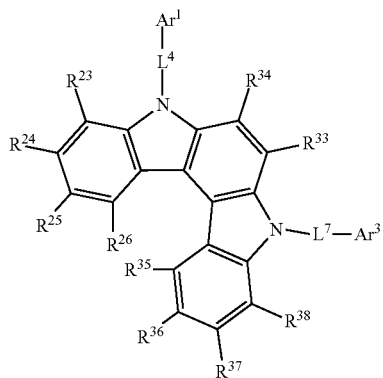

wherein, in Chemical Formula IIF, $R^{23}$ to $R^{26}$ and $R^{33}$ to $R^{38}$ are each hydrogen, $L^4$ and $L^7$ are each independently a single bond or a substituted or unsubstituted phenylene group, and $Ar^1$ and $Ar^3$ are each independently a substituted or unsubstituted phenyl group or a substituted or unsubstituted biphenyl group;

[Chemical Formula III-1]

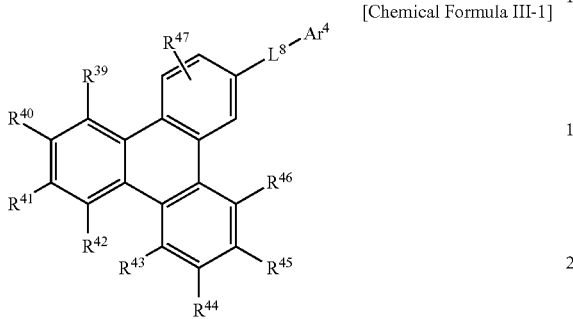

wherein, in Chemical Formula III-1, $R^{39}$ to $R^{47}$ are each hydrogen, $L^8$ is a substituted or unsubstituted meta-phenylene group, and $Ar^4$ is a substituted or unsubstituted naphthyl group, a substituted or unsubstituted phenanthrenyl group, or a substituted or unsubstituted triphenylene group.

13. The composition as claimed in claim 1, wherein the composition for an organic optoelectronic device includes the first compound in an amount of about 20 wt % to about 50 wt %, the second compound in an amount of about 40 wt % to about 60 wt %, and the third compound in an amount of about 5 wt % to about 25 wt %, all wt % being based on a total weight of the first compound, the second compound, and the third compound.

14. An organic optoelectronic device, comprising:
an anode and a cathode facing each other,
at least one organic layer between the anode and the cathode,
wherein the at least one organic layer includes the composition for an organic optoelectronic device as claimed in claim 1.

15. The organic optoelectronic device as claimed in claim 14, wherein:
the at least one organic layer includes a light emitting layer, and
the light emitting layer includes the composition.

16. The organic optoelectronic device as claimed in claim 15, wherein the first compound, the second compound, and the third compound are phosphorescent hosts of the light emitting layer.

17. The organic optoelectronic device as claimed in claim 15, wherein the composition is a green light emitting composition.

18. A display device comprising the organic optoelectronic device as claimed in claim 14.

* * * * *